US012750992B2

(12) United States Patent
Hayashi et al.

(10) Patent No.: US 12,750,992 B2
(45) Date of Patent: Sep. 29, 2026

(54) MODULE INCLUDING METAL MEMBER WITH PROTRUDING PORTION AND METHOD FOR MANUFACTURING MODULE

(71) Applicant: Murata Manufacturing Co., Ltd., Nagaokakyo (JP)

(72) Inventors: Shota Hayashi, Nagaokakyo (JP); Nobuaki Ogawa, Nagaokakyo (JP); Yuki Asano, Nagaokakyo (JP); Takanori Uejima, Nagaokakyo (JP); Hiromichi Kitajima, Nagaokakyo (JP); Takahiro Eguchi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 877 days.

(21) Appl. No.: 18/166,642

(22) Filed: Feb. 9, 2023

(65) Prior Publication Data

US 2023/0209788 A1 Jun. 29, 2023

Related U.S. Application Data

(63) Continuation of application No. PCT/JP2021/027641, filed on Jul. 27, 2021.

(30) Foreign Application Priority Data

Aug. 13, 2020 (JP) ................................ 2020-136646
Jan. 15, 2021 (JP) ................................ 2021-005121

(51) Int. Cl.
*H05K 9/00* (2006.01)
*H05K 1/181* (2026.01)
(Continued)

(52) U.S. Cl.
CPC ........... *H05K 9/0022* (2013.01); *H05K 1/181* (2013.01); *H05K 3/284* (2013.01); *H05K 9/0039* (2013.01);
(Continued)

(58) Field of Classification Search
CPC ...... H05K 9/0022; H05K 1/181; H05K 3/284; H05K 9/0039; H05K 2201/10015;
(Continued)

(56) References Cited

U.S. PATENT DOCUMENTS 9,070,793 B2 6/2015 Liao et al.
2006/0258050 A1 11/2006 Fujiwara et al.
(Continued)

FOREIGN PATENT DOCUMENTS

JP 2005317935 A * 11/2005 ......... H01L 23/3121
JP 2007-294965 A 11/2007
(Continued)

OTHER PUBLICATIONS

International Search Report for PCT/JP2021/027641 dated Oct. 12, 2021.

*Primary Examiner* — Ratisha Mehta
*Assistant Examiner* — Sophia W Kao
(74) *Attorney, Agent, or Firm* — McDonald Hopkins LLC

(57) ABSTRACT

A module includes: a substrate having an upper main surface and a lower main surface arranged in an up-down direction; a metal member provided on the upper main surface of the substrate, the metal member having a plate-shaped portion including a front main surface and a back main surface arranged in a front-back direction; a first electronic component mounted on the upper main surface of the substrate and disposed in front of the metal member; a second electronic component mounted on the upper main surface of the substrate and disposed behind the metal member; and a sealing resin layer provided on the upper main surface of the substrate and covering the first electronic component, the second electronic component, and the metal member. The
(Continued)

metal member includes an upper protruding portion extending on one side of the front-back direction from an upper end of the plate-shaped portion.

15 Claims, 37 Drawing Sheets

(51) Int. Cl.

| | |
|---|---|
| ***H05K 3/28*** | (2006.01) |
| ***H10W 42/20*** | (2026.01) |
| ***H10W 74/01*** | (2026.01) |
| ***H10W 90/00*** | (2026.01) |

(52) U.S. Cl.
CPC ........... *H10W 42/20* (2026.01); *H10W 74/01* (2026.01); *H10W 90/00* (2026.01); *H05K 2201/10015* (2013.01); *H05K 2201/10022* (2013.01); *H05K 2201/1003* (2013.01); *H05K 2201/10371* (2013.01); *H05K 2203/025* (2013.01)

(58) Field of Classification Search
CPC ............ H05K 2201/10022; H05K 2201/1003; H05K 2201/10371; H05K 2203/025; H05K 9/0032; H05K 9/0037; H10W 42/20; H10W 74/01; H10W 90/00; H01L 23/66; H01L 25/0655; H01L 23/552; H01L 25/16; H01L 23/3121
See application file for complete search history.

(56) References Cited

U.S. PATENT DOCUMENTS

| | | | | |
|---|---|---|---|---|
| 2007/0246825 | A1* | 10/2007 | Oh | H01L 23/3121 257/E23.125 |
| 2012/0025356 | A1* | 2/2012 | Liao | H01L 23/3121 257/659 |
| 2012/0320559 | A1* | 12/2012 | Kimura | H01L 23/552 361/818 |
| 2013/0271928 | A1* | 10/2013 | Shimamura | H01L 23/552 29/841 |
| 2017/0354039 | A1* | 12/2017 | Miwa | H01L 21/561 |
| 2020/0323077 | A1* | 10/2020 | Han | H05K 1/181 |
| 2022/0007499 | A1 | 1/2022 | Okamoto et al. | |

FOREIGN PATENT DOCUMENTS

| | | | |
|---|---|---|---|
| JP | 2011-187677 | A | 9/2011 |
| JP | 2013-222829 | A | 10/2013 |
| WO | 2016/092893 | A1 | 6/2016 |
| WO | 2020/202841 | A1 | 10/2020 |

* cited by examiner

MODULE INCLUDING METAL MEMBER WITH PROTRUDING PORTION AND METHOD FOR MANUFACTURING MODULE

CROSS REFERENCE TO RELATED APPLICATION

This is a continuation of International Application No. PCT/JP2021/027641 filed on Jul. 27, 2021 which claims priority from Japanese Patent Application No. 2020-136646 filed on Aug. 13, 2020 and Japanese Patent Application No. 2021-005121 filed on Jan. 15, 2021. The contents of these applications are incorporated herein by reference in their entireties.

BACKGROUND OF THE DISCLOSURE

Field of the Disclosure

The present disclosure relates to a module including a substrate on which an electronic component is mounted.

Description of the Related Art

As a disclosure related to the module according to the related art, for example, a high frequency module described in Patent Literature 1 is known. The high frequency module includes a substrate, a surface mount element, a metal wall, a resin molding portion, and a metal thin film. The surface mount element is mounted on the upper surface of the substrate. The metal wall extends upward from the upper surface of the substrate. The resin molding portion seals the metal wall and the surface mount element. The metal thin film covers the upper surface of the resin molding portion. In this high frequency module, the metal wall is provided so as to be located between a first surface mount element and a second surface mount element. Thus, the influence of noise such as magnetic flux generated from the second surface mounting element on the first surface mounting element is reduced. Similarly, the influence of noise such as magnetic flux generated from the first surface mount element on the second surface mount element is reduced. As a result, it is possible to suppress mutual influence of noise of the surface mounting elements.

[Patent Literature 1]

Japanese Patent Unexamined Publication No. 2007-294965 bulletin

BRIEF SUMMARY OF THE DISCLOSURE

By the way, in the high frequency module described in Patent Literature 1, it is desired to improve the shielding property of the high frequency module.

A possible benefit of the present disclosure is to provide a module capable of improving a shielding property.

The inventor of the present application has studied a method of improving the shielding property of the high frequency module in the high frequency module described in Patent Literature 1. First, the inventor of the present application has considered that the shielding property of the high frequency module can be improved if the surface mount element is disposed close to the metal wall.

However, in the high frequency module, the distance between the surface mounting element and the metal wall cannot be set to a predetermined distance or less from the viewpoint of preventing short circuit between the surface mounting element and the metal wall. Therefore, the inventor of the present application has considered that it is difficult to improve the shielding property of the high frequency module by arranging the surface mount element close to the metal wall. Therefore, the inventor of the present application has further studied a method of improving the shielding property of the high frequency module without setting the distance between the surface mounting element and the metal wall to be equal to or less than a predetermined distance. As a result, the inventor of the present application has conceived a disclosure having the following structure.

A module according to an embodiment of the present disclosure includes: a substrate having an upper main surface and a lower main surface arranged in an up-down direction; a metal member provided on the upper main surface of the substrate, the metal member having a plate-shaped portion including a front main surface and a back main surface arranged in a front-back direction; a first electronic component mounted on the upper main surface of the substrate and disposed in front of the metal member; a second electronic component mounted on the upper main surface of the substrate and disposed behind the metal member; and a sealing resin layer provided on the upper main surface of the substrate and covering the first electronic component, the second electronic component, and the metal member. The metal member includes an upper protruding portion extending on one side of the front-back direction from an upper end of the plate-shaped portion. A thickness of the upper protruding portion in the up-down direction is thinner than a thickness of the plate-shaped portion.

The module according to the present disclosure can improve the shielding property for the electronic component.

DETAILED DESCRIPTION OF THE DISCLOSURE

Embodiments

[Structure of Module]

Figure 1:
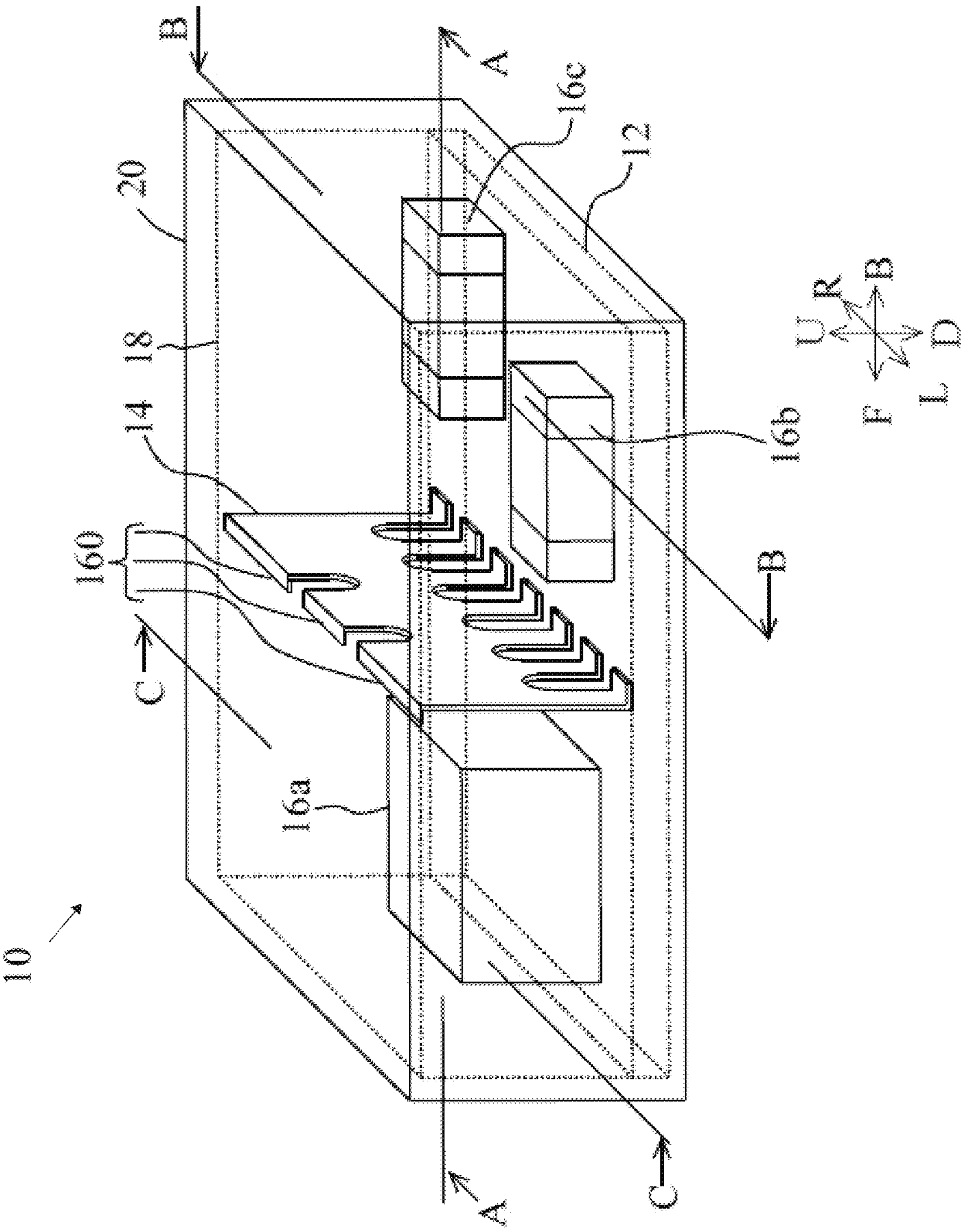
FIG. 1 is a perspective view of a module 10.
Figure 2:
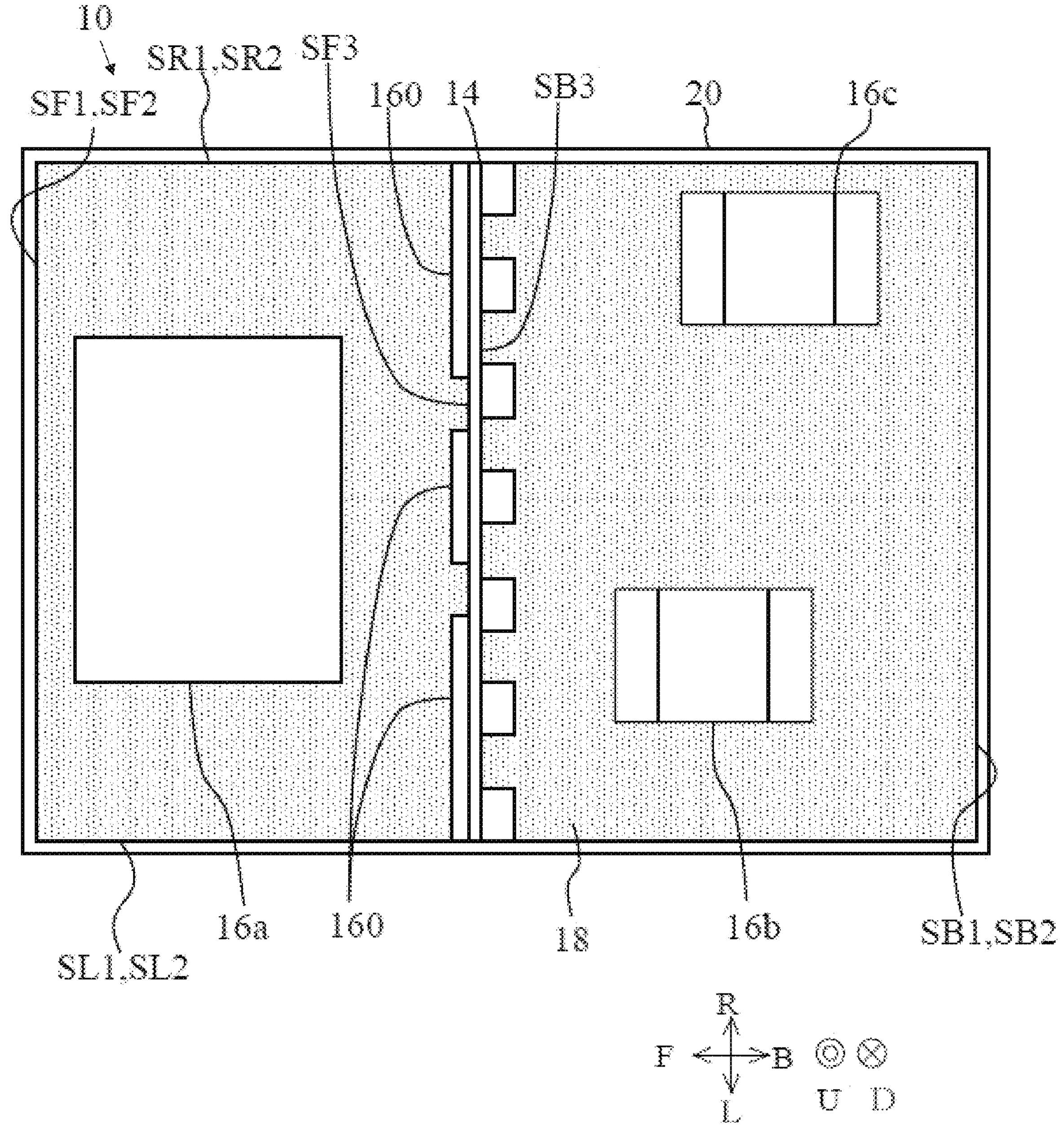
FIG. 2 is a top view of the module 10.
Figure 3:
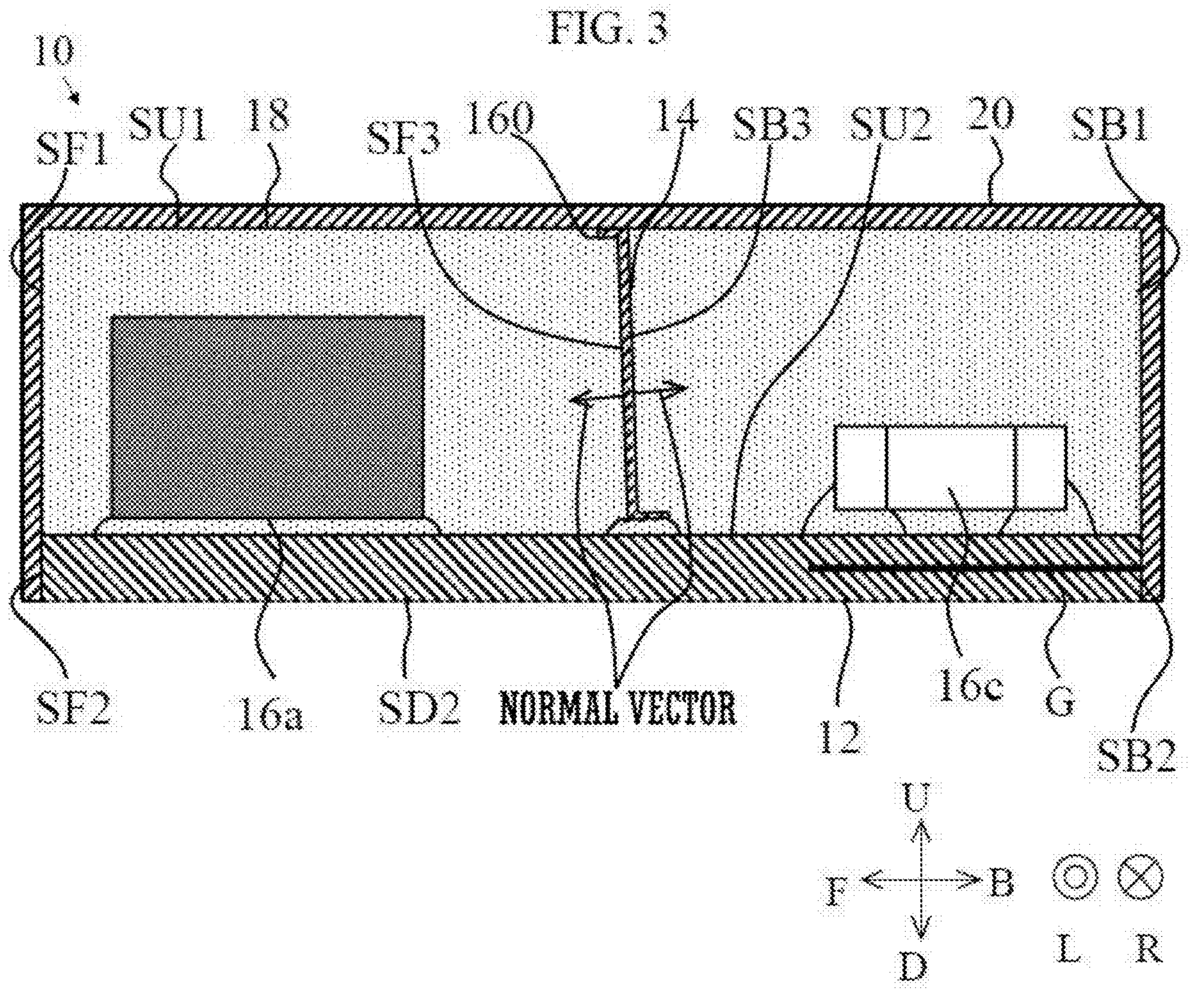
FIG. 3 is a cross-sectional view of the module 10 taken along line A-A.
Figure 4:
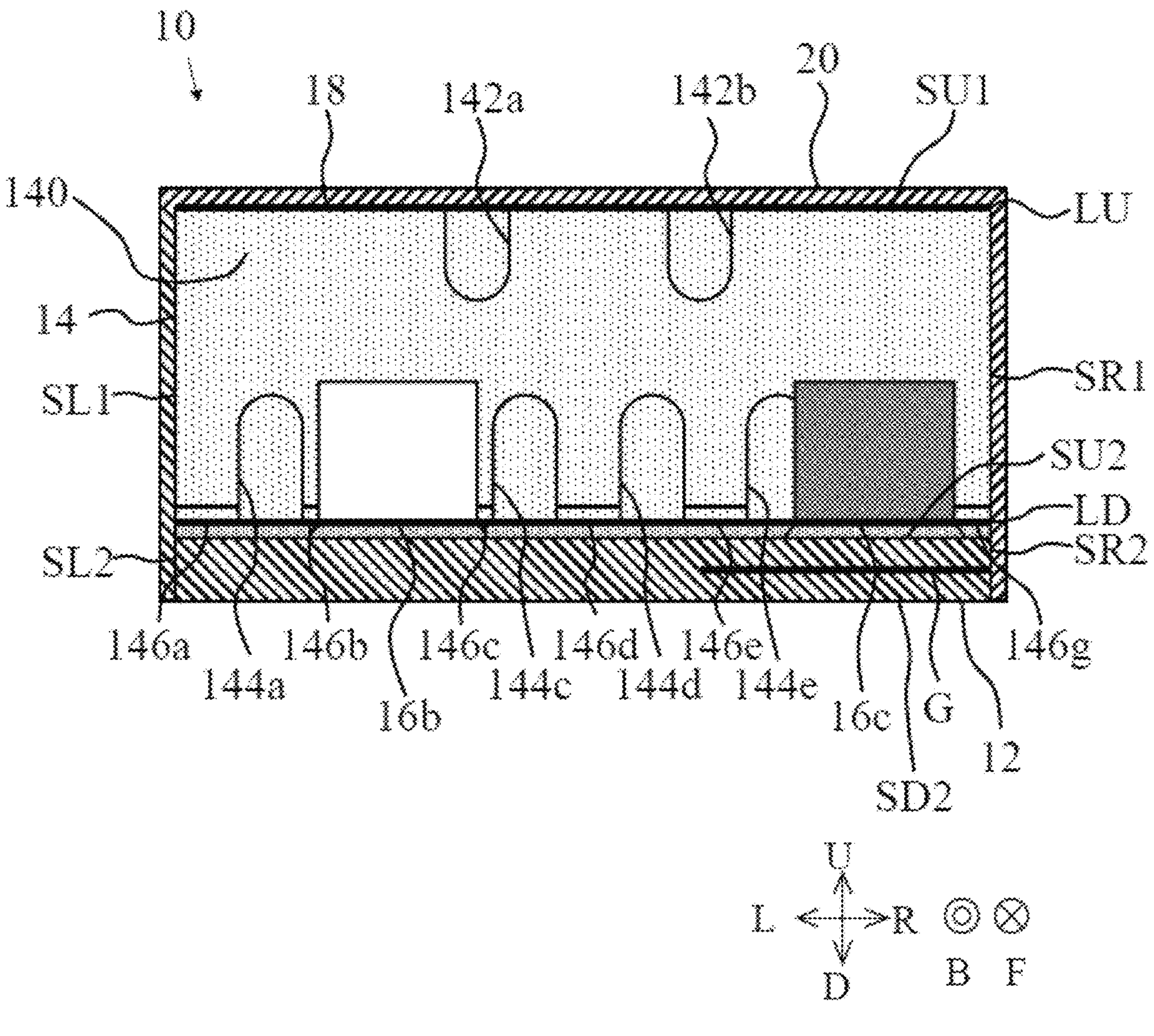
FIG. 4 is a cross-sectional view of the module 10 taken along line B-B.
Figure 5:
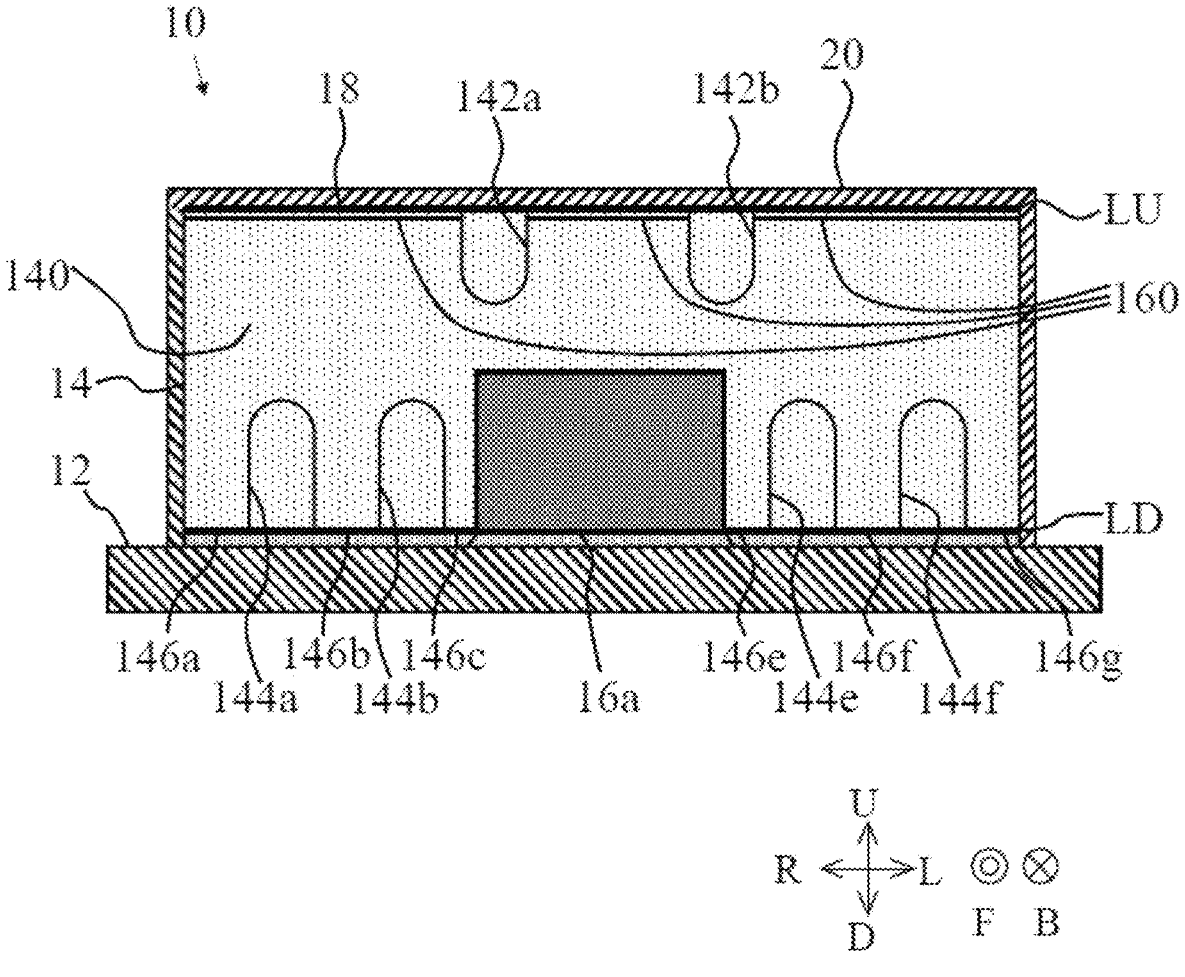
FIG. 5 is a cross-sectional view of the module 10 taken along line C-C.
Figure 6:
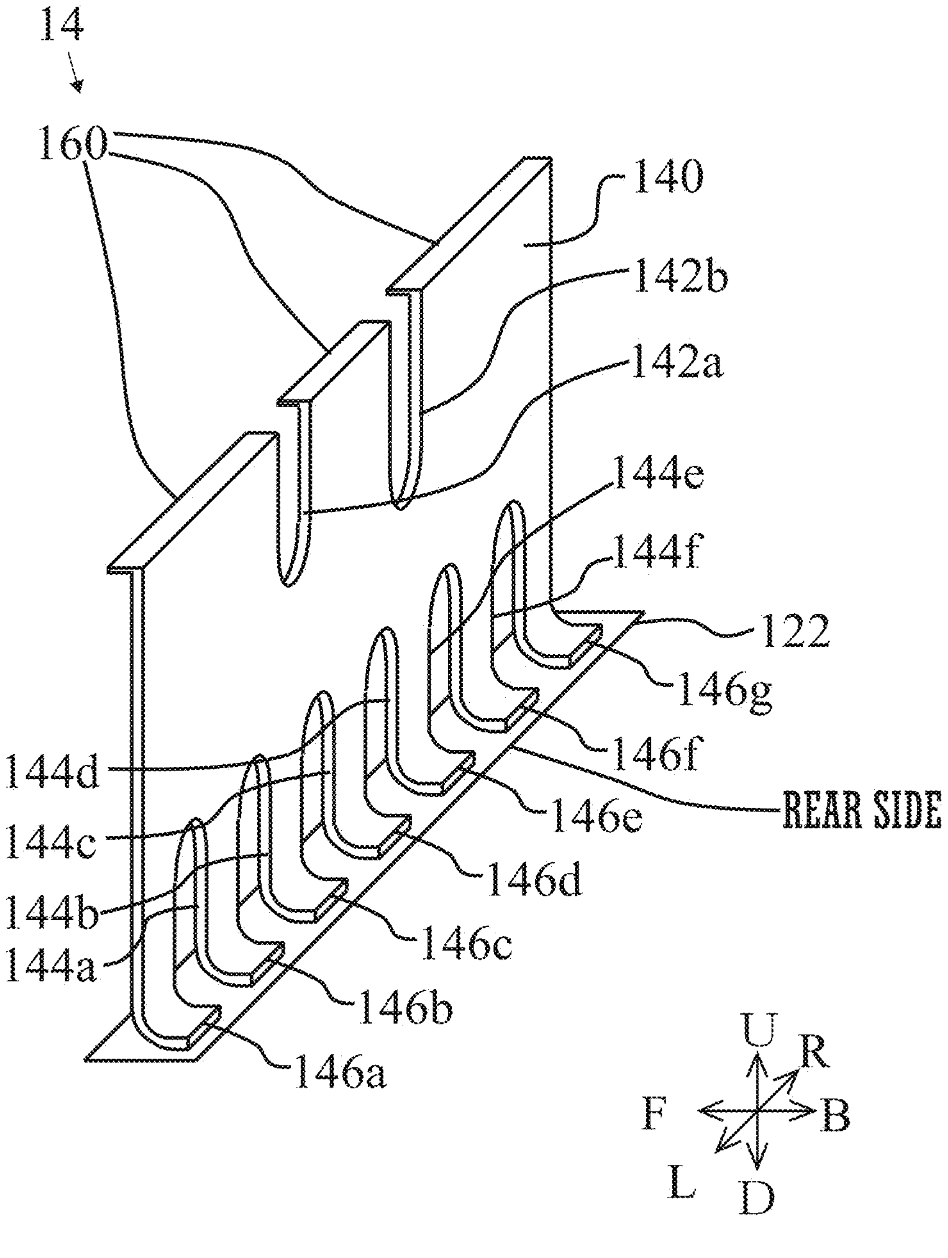
FIG. 6 is a perspective view of a metal member 14.
Figure 7:
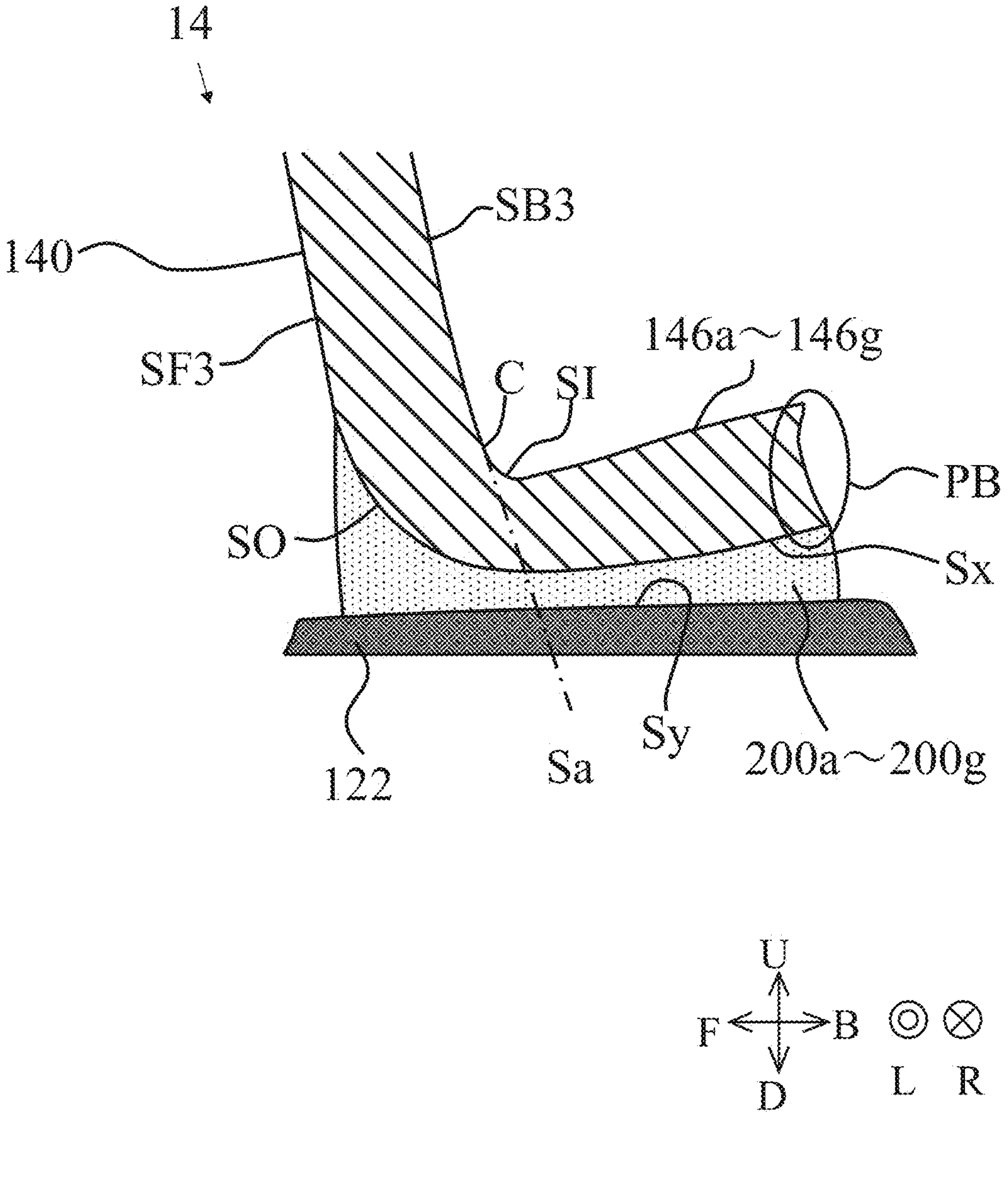
FIG. 7 is a cross-sectional view of foot portions 146*a* to 146*g*.

Hereinafter, a structure of a module 10 according to an embodiment of the present disclosure will be described with reference to the drawings. FIG. 1 is a perspective view of a module 10. In FIG. 1, the inside of the module 10 is seen through. FIG. 2 is a top view of the module 10. In FIG. 2, the inside of the module 10 is seen through. FIG. 3 is a cross-sectional view of the module 10 taken along line A-A. FIG. 4 is a cross-sectional view of the module 10 taken along line B-B. FIG. 5 is a cross-sectional view of the module 10 taken along line C-C. FIG. 6 is a perspective view of a metal member 14. FIG. 7 is a cross-sectional view of foot portions 146*a* to 146*g*.

Hereinafter, the direction in the module 10 will be described. As illustrated in FIG. 1, a substrate 12 of the module 10 has a plate shape. Therefore, the direction in which an upper main surface SU2 and a lower main surface SD2 of the substrate 12 are arranged is defined as an up-down direction. When viewed in the up-down direction, a direction in which a front main surface SF3 and a back main surface SB3 of a plate-shaped portion 140 of the metal member 14 are arranged is defined as a front-back direction. In addition, a direction orthogonal to the front-back direction and the up-down direction is defined as a left-right direction. The up-down direction, the left-right direction, and the front-back direction are orthogonal to each other. However, the up-down direction, the left-right direction, and the front-back direction may not coincide with the up-down direction, the left-right direction, and the front-back direction in actual use of the module 10. In each drawing, the upward direction and the downward direction may be exchanged, the left direction and the right direction may be exchanged, or the front direction and the rear direction may be exchanged.

Hereinafter, definitions of terms in the present specification will be described. First, a positional relationship of members in the present specification will be defined. X to Z are members or parts constituting the module 10. In the present specification, X and Y arranged in the front-back direction indicate the following states. When X and Y are viewed in a direction perpendicular to the front-back direction, both X and Y are arranged on an arbitrary straight line indicating the front-back direction. In the present specification, X and Y arranged in the front-back direction when viewed in the up-down direction indicate the following states. When X and Y are viewed in the up-down direction, both X and Y are arranged on an arbitrary straight line indicating the front-back direction. In this case, when X and Y are viewed from the left-right direction different from the up-down direction, one of X and Y may not be arranged on arbitrary straight line indicating the front-back direction. X and Y may be in contact with each other. X and Y may be separated from each other. Z may be present between X and Y. This definition also applies to directions other than the front-back direction.

In the present specification, arranging X before Y refers to the following state. At least a part of X is disposed in a region through which Y passes when Y translates forward. Therefore, X may be within the region through which Y passes when Y translates forward, or may protrude from the region through which Y passes when Y translates forward. In this case, X and Y are aligned in the front-back direction. This definition also applies to directions other than the front-back direction.

In the present specification, arranging X before Y when viewed in the left-right direction refers to the following state. When viewed in the left-right direction, X and Y are arranged in the front-back direction, and when viewed in the left-right direction, a portion of X facing Y is disposed in front of Y. In this definition, X and Y may not be arranged in the front-back direction in three dimensions. This definition also applies to directions other than the front-back direction.

In the present specification, arranging X in front of Y refers to the following state. X is disposed in front of a plane passing through the front end of Y and orthogonal to the front-back direction. In this case, X and Y may be arranged in the front-back direction or may not be arranged in the front-back direction. This definition also applies to directions other than the front-back direction.

In the present specification, each part of X is defined as follows unless otherwise specified. The front part of X means the front half of X. The rear part of X means the rear half of X. The left part of X means the left half of X. The right part of X means the right half of X. The upper part of X means the upper half of X. The lower part of X means the lower half of X. The front end of X means an end of X in the front direction. The back end of X means an end of X in the rear direction. The left end of X means an end of X in the left direction. The right end of means an end of X in the right direction. The upper end of X means an end of X in the upward direction. The lower end of X means an end of X in the downward direction. The front end portion of X means the front end of X and the vicinity thereof. The back end portion of X means the back end of X and the vicinity thereof. The left end portion of X means the left end of X and the vicinity thereof. The right end portion of X means the right end of X and the vicinity thereof. The upper end portion of X means the upper end of X and the vicinity thereof. The lower end portion of X means the lower end of X and the vicinity thereof.

When any two members in the present specification are defined as X and Y, the relationship between any two members has the following meaning. In the present specification, "X is supported by Y" includes a case where X is attached to Y so as not to be movable with respect to Y (that is, it is fixed) and a case where X is attached to Y so as to be movable with respect to Y. Further, "X is supported by Y" includes both a case where X is directly attached to Y and a case where X is attached to Y via Z.

In the present specification, "X and Y are electrically connected" means that electricity is conducted between X and Y. Therefore, X and Y may be in contact with each other, or X and Y may not be in contact with each other. When X and Y are not in contact with each other, Z having conductivity is disposed between X and Y.

The module 10 is, for example, a high frequency module. The high frequency module is, for example, an analog front end module of a portable wireless communication device. However, the module 10 is not limited to the high frequency module. As illustrated in FIGS. 1 to 5, the module 10 includes a substrate 12, a metal member 14, electronic components 16*a* to 16*c*, a sealing resin layer 18, and a shield 20.

The substrate 12 is, for example, a multilayer wiring substrate having a structure in which a plurality of insulator layers made of a low-temperature co-fired ceramic, a high-temperature co-fired ceramic, glass epoxy, like is stacked. The substrate 12 has a plate shape. Therefore, the substrate 12 has an upper main surface SU2, a lower main surface SD2, a left surface SL2, a right surface SR2, a front surface SF2, and a back surface SB2. The substrate 12 has a rectangular shape when viewed in the up-down direction. An electric circuit is provided by a conductor layer in the inside, the upper main surface SU2, and the lower main surface SD2 of the substrate 12. In the present embodiment, the substrate 12 includes a ground conductor layer G as illustrated in FIGS. 3 and 4. The ground conductor layer G is provided inside the substrate 12. A ground potential is connected to the ground conductor layer G.

The metal member 14 is provided on the upper main surface SU2 of the substrate 12. The metal member 14 has a structure in which one metal plate is subjected to bending. The metal member 14 is made of, for example, tough pitch copper. Note that brass, phosphor bronze, SUS, aluminum, or the like may be used instead of the tough pitch copper. The thickness of the metal member 14 is, for example, 50 μm. As illustrated in FIGS. 4 to 6, the metal member 14 includes a plate-shaped portion 140, foot portions 146*a* to 146*g*, and an upper protruding portion 160. The plate-shaped portion 140 has a plate shape. The plate-shaped portion 140 has the front main surface SF3 and the back main surface SB3. The front main surface SF3 and the back main surface SB3 are arranged in the front-back direction when viewed in the up-down direction. The plate-shaped portion 140 is provided on the upper main surface SU2 of the substrate 12. The plate-shaped portion 140 extends in the upward direction from the upper main surface SU2 of the substrate 12. However, as illustrated in FIG. 3, the plate-shaped portion 140 is slightly inclined forward with respect to the up-down direction. That is, the normal vector of the front main surface SF3 of the plate-shaped portion 140 has a slight component of the downward direction. The normal vector of back main surface SB3 of plate-shaped portion 140 has a slight component of the upward direction.

The plate-shaped portion 140 has a rectangular shape when viewed in the front-back direction. However, the plate-shaped portion 140 is provided with upper notches 142*a* and 142*b* and lower notches 144*a* to 144*f*. Therefore, strictly speaking, the plate-shaped portion 140 has a shape different from the rectangular shape when viewed in the front-back direction. Therefore, as illustrated in FIGS. 4 and 5, when viewed in the front-back direction, a line connecting the upper end of the plate-shaped portion 140 in the left-right direction is defined as an upper side LU. When viewed in the front-back direction, a line connecting the lower end of the plate-shaped portion 140 in the left-right direction is defined as a lower side LD. The upper side LU is present at a position farther upward from the substrate 12 than the lower side LD. In addition, in the present specification, the notch is a recess formed in the outer edge of the plate-shaped portion 140 by partially missing the plate-shaped portion 140. The notch in the present specification includes, for example, a U-shaped defect extending from a side of a rectangular plate in a direction orthogonal to the side, and an L-shaped defect formed by removing a rectangular corner. In addition, the notch may be an angular U-shaped defect.

The metal member 14 includes the upper protruding portion 160. The upper protruding portion 160 extends on one side of the front-back direction from the upper end of the plate-shaped portion 140. For example, in FIGS. 1 to 6, the upper protruding portion 160 extends forward from the upper end of the plate-shaped portion 140 and does not extend backward from the upper end of the plate-shaped portion 140. The thickness of the upper protruding portion 160 in the up-down direction is thinner than the thickness of the plate-shaped portion 140 in the front-back direction.

The upper notches 142*a* and 142*b* extend in the downward direction from the upper side LU. The upper notches 142*a* and 142*b* have a U shape when viewed in the front-back direction. That is, the upper notches 142*a* and 142*b* have a shape in which a rectangle having an upper side, a lower side, a left side, and a right side and a semicircle protruding in the downward direction from the lower side of the rectangle are combined. The lower ends of the upper notches 142*a* and 142*b* are located above the center of the plate-shaped portion 140 in the up-down direction when viewed in the front-back direction. The upper notch 142*a* is located on the left of the upper notch 142*b*. The lengths in the up-down direction of the upper notches 142*a* and 142*b* are, for example, half or less of the length in the up-down direction of the plate-shaped portion 140. The widths of the upper notches 142*a* and 142*b* in the left-right direction are, for example, 150 μm.

The lower notches 144*a* to 144*f* extend in the upward direction from the lower side LD. The lower notches 144*a* to 144*f* have a U-shape in which the upper and lower sides are inverted when viewed in the front-back direction. That is, the lower notches 144*a* to 144*f* have a shape in which a rectangle and a semicircle protruding upward from the upper side of the rectangle are combined. The upper ends of the lower notches 144*a* to 144*f* are located below the center of the plate-shaped portion 140 in the up-down direction when viewed in the front-back direction. The lower notches 144*a* to 144*f* are arranged in a line in this order from left to right. The lower notches 144*a* to 144*f* are arranged at equal intervals in the left-right direction when viewed in the front-back direction. The lengths in the up-down direction of the lower notches 144*a* to 144*f* are, for example, half or less of the length in the up-down direction of the plate-shaped portion 140. The widths of the lower notches 144*a* to 144*f* in the left-right direction are, for example, 150 μm.

Here, a positional relationship between the upper notches 142*a* and 142*b* and the lower notches 144*a* to 144*f* will be described. The upper notches 142*a* and 142*b* are displaced in the left-right direction from the lower notches 144*a* to 144*f* when viewed in the up-down direction. The upper notch 142*a* is located between the lower notch 144*b* and the lower notch 144*c* in the left-right direction when viewed in the up-down direction. The upper notch 142*b* is located between the lower notch 144*d* and the lower notch 144*e* in the left-right direction when viewed in the up-down direction. This prevents the upper notches 142*a* and 142*b* and the lower notches 144*a* to 144*f* from being too close to each other. The shortest distance between the upper notches 142*a* and 142*b* and the lower notches 144*a* to 144*f* is 1.5 times or more the plate thickness of the plate-shaped portion 140 in the drawing. The shortest distance between the upper notches 142*a* and 142*b* and the lower notches 144*a* to 144*f* is more preferably twice or more the plate thickness of the plate-shaped portion 140.

The foot portions 146*a* to 146*g* extend backward from the lower side LD. Therefore, the foot portions 146*a* to 146*g* extend in the same direction with respect to the plate-shaped portion 140. As illustrated in FIG. 7, the foot portions 146*a* to 146*g* are formed by bending a part of the metal member 14 backward. Therefore, as illustrated in FIGS. 3 and 7, a part of the metal member 14 bent backward to the upper protruding portion 160 has a Z shape when viewed in the left-right direction. Here, boundaries between the foot portions 146*a* to 146*g* and the plate-shaped portion 140 will be described. As illustrated in FIG. 7, the plate-shaped portion 140 is a portion located in front of the virtual plane Sa including the back main surface SB3 of the plate-shaped portion 140. On the other hand, the foot portions 146*a* to 146*g* are portions located behind the virtual plane Sa including the back main surface SB3 of the plate-shaped portion 140. Therefore, the foot portions 146*a* to 146*g* extend backward from the lower end portion of the plate-shaped portion 140.

The foot portions 146*a* to 146*g* are fixed to the upper main surface SU2 of the substrate 12. More specifically, as illustrated in FIG. 6, the substrate 12 includes a mounting electrode 122. A mounting electrode 122 is a part of the upper main surface SU2 of the substrate 12. The mounting electrode 122 has a rectangular shape having long sides extending in the left-right direction when viewed in the up-down direction. The mounting electrode 122 is one electrode. The mounting electrode 122 is electrically connected to the ground conductor layer G. Therefore, the mounting electrode 122 is connected to the ground potential. The foot portions 146*a* to 146*g* are fixed to the mounting electrode 122 with solders 200*a* to 200*g*. Thus, the metal member 14 is connected to the ground potential. The foot portions 146*a* to 146*g* and the mounting electrode 122 may be connected in direct contact with each other without the solders 200*a* to 200*g* interposed therebetween, or the foot portions 146*a* to 146*g* may be mounted in direct contact with the upper surface SU1.

Next, the mounting of the foot portions 146*a* to 146*g* on the mounting electrode 122 will be described with reference to FIG. 7. As illustrated in FIG. 3, the plate-shaped portion 140 is slightly inclined forward with respect to the up-down direction. Thus, the upper end of the plate-shaped portion 140 is located in front of the lower end of the plate-shaped portion 140. The inclination angle of the plate-shaped portion 140 with respect to the up-down direction is, for example, larger than 0° and equal to or smaller than 15°. Thus, as illustrated in FIG. 7, the foot portions 146*a* to 146*g* extend from the lower end portion of the plate-shaped portion 140 toward the rear upper direction. Therefore, the interval in the up-down direction between a lower surface Sx of each of the foot portions 146*a* to 146*g* and an upper surface Sy of the mounting electrode 122 increases toward the front. Each of the solders 200*a* to 200*g* is provided between the lower surface Sx of the foot portions 146*a* to 146*g* and the upper surface Sy of the mounting electrode 122. As described above, since the interval in the up-down direction between the lower surfaces Sx of the foot portions 146*a* to 146*g* and the upper surface Sy of the mounting electrode 122 becomes larger toward the rear, voids generated in the solders 200*a* to 200*g* are easily discharged backward from the solders 200*a* to 200*g*.

The foot portions 146*a* to 146*g* are formed by bending a part of the metal member 14. An inner surface of a portion where the metal member 14 is bent in an arc shape is defined as an inner surface SI. An outer surface of a portion where the metal member 14 is bent in an arc shape is defined as an outer surface SO. The inner surface SI and the outer surface SO have an arc shape when viewed in the left-right direction. However, the radius of curvature of the outer surface SO is larger than the radius of curvature of the inner surface SI. Therefore, tensile stress is generated on the outer surface SO. Compressive stress is generated on the inner surface SI.

The distance between the outer surface SO of the plate-shaped portion 140 and the upper surface Sy of the mounting electrode 122 increases toward the front. Thus, voids generated in the solders 200*a* to 200*g* are easily released forward from the solders 200*a* to 200*g*.

The metal member 14 is a member obtained by punching and bending a rolled metal plate. The rolling direction of the metal member 14 is the left-right direction. Therefore, a plurality of lines (streaks) extending in the left-right direction (not illustrated) is formed on the surface of the metal member 14. Therefore, slight irregularities are formed on the surface of the metal member 14. When the foot portions 146*a* to 146*g* are formed by bending a part of the metal member 14, the plurality of lines formed on the outer surface SO of the metal member 14 are extended in the width direction of the lines. Therefore, the depth of the plurality of lines formed on the outer surface SO of the metal member 14 becomes shallow. As a result, the surface roughness of the outer surface SO of the metal member 14 is smaller than the surface roughness of the portion of the plate-shaped portion 140 excluding the outer surface SO. Thus, the solders 200*a* to 200*g* easily wet upward on the outer surface SO. In the present embodiment, in the solders 200*a* to 200*g*, the solders 200*a* to 200*g* wet upward to the vicinity of the upper end of the outer surface SO. In addition, an oxide film may be formed on the surface of the metal member 14. In such a case, the oxide film formed on the outer surface so is damaged by the bending of the metal member 14. Thus, tough pitch copper, brass, phosphor bronze, SUS, aluminum, and the like are exposed on the outer surface SO. The wettability of the solders 200*a* to 200*g* to tough pitch copper, brass, phosphor bronze, SUS, aluminum, or the like is higher than the wettability of the solders 200*a* to 200*g* to an oxide film. Therefore, the solders 200*a* to 200*g* wet more upward on the outer surface SO. Thus, the metal member 14 is prevented from falling forward or backward.

As illustrated in FIG. 7, the back end portion PB of each of the foot portions 146*a* to 146*g* has a shape in which the upper end and the lower end protrude backward from the center. Thus, the solders 200*a* to 200*g* are less likely to wet upward at a back end portion PB of the foot portions 146*a* to 146*g*.

Here, a positional relationship between the foot portions 146*a* to 146*g* and the lower notches 144*a* to 144*f* will be described. As illustrated in FIG. 6, the foot portion 146*a*, the lower notch 144*a*, the foot portion 146*b*, the lower notch 144*b*, the foot portion 146*c*, the lower notch 144*c*, the foot portion 146*d*, the lower notch 144*d*, the foot portion 146*e*, the lower notch 144*e*, the foot portion 146*f*, the lower notch 144*f*, and the foot portion 146*g* are arranged in this order from left to right when viewed in the front-back direction. The lower notches 144*a* to 144*f* have the same shape. Therefore, the foot portions 146*a* to 146*g* are arranged at equal intervals in the left-right direction when viewed in the front-back direction. The foot portions 146*a* to 146*g* have the same shape. Therefore, the lower notches 144*a* to 144*f* are arranged at equal intervals in the left-right direction when viewed in the front-back direction.

Outer edges of the foot portions 146*a* to 146*g* are connected to outer edges of the lower notches 144*a* to 144*f*. Therefore, the lower notches 144*a* to 144*f* are located on at least one of the left and right of the foot portions 146*a* to 146*g*. Therefore, the foot portions 146*a* to 146*g* include the foot portions 146*b* to 146*f* (first foot portions) located between the lower notches 144*a* to 144*f* in the left-right direction when viewed in the front-back direction. The lower notches 144*a* to 144*f* are located on both the left and right of the foot portions 146*b* to 146*f*. Further, the foot portions 146*a* to 146*g* include the foot portion 146*a* (second foot portion) disposed at the left end portion of the lower side LD when viewed in the front-back direction. The lower notch 144*a* is located on the right of the foot portion 146*a*. The foot portions 146*a* to 146*g* include the foot portion 146*g* (second foot portion) disposed at the right end portion of the lower side LD when viewed in the front-back direction. The lower notch 144*f* is located on the left of the foot portion 146*g*.

As illustrated in FIGS. 1 and 3, an electronic component 16*a* (first electronic component) is mounted on the upper main surface SU2 of the substrate 12. A method of mounting the electronic component 16*a* is, for example, mounting by soldering. The electronic component 16*a* is a semiconductor element such as an IC or a power amplifier (PA), or a chip component such as a chip inductor, a chip capacitor, or a chip resistor. As illustrated in FIG. 2, the electronic component 16*a* is disposed in front of the metal member 14. In the present embodiment, the electronic component 16*a* is disposed in front of the metal member 14. Therefore, the electronic component 16*a* overlaps the metal member 14 when viewed in the front-back direction. The left end of the electronic component 16*a* is located to the right of the left end of the metal member 14. The right end of the electronic component 16*a* is located to the left of the right end of the metal member 14. The upper end of the electronic component 16*a* is located below the upper end of the metal member 14.

Electronic components 16*b* and 16*c* (second electronic components) are mounted on the upper main surface SU2 of the substrate 12. The method of mounting the electronic components 16*b* and 16*c* is, for example, mounting by soldering. The electronic components 16*b* and 16*c* are semiconductor elements such as ICs and power amplifiers (PAS), chip components such as chip inductors, chip capacitors, and chip resistors. As illustrated in FIG. 2, the electronic components 16*b* and 16*c* are disposed behind the metal member 14. In the present embodiment, the electronic components 16*b* and 16*c* are disposed behind the metal member 14. Therefore, the electronic components 16*b* and 16*c* overlap the metal member 14 when viewed in the front-back direction. The left end of the electronic component 16*b* and the left end of the electronic component 16*c* are located to the right of the left end of the metal member 14. The right end of the electronic component 16*b* and the right end of the electronic component 16*c* are located to the left of the right end of the metal member 14. The upper end of the electronic component 16*a* is located below the upper end of the metal member 14.

As illustrated in FIGS. 1 and 3, the sealing resin layer 18 is provided on the upper main surface SU2 of the substrate 12. The sealing resin layer 18 covers the metal member 14 and the electronic components 16*a* to 16*c*. Thus, the sealing resin layer 18 protects the metal member 14 and the electronic components 16*a* to 16*c*. The material of the sealing resin layer 18 is, for example, an epoxy resin. The sealing resin layer 18 has a rectangular parallelepiped shape. Therefore, the sealing resin layer 18 has an upper surface SU1, a lower surface SD1, a left surface SL1, a right surface SR1, a front surface SF1, and a back surface SB1. The left end of the plate-shaped portion 140 is located on the left surface SL1 of the sealing resin layer 18. In the present embodiment, the left end of the plate-shaped portion 140 is exposed from the sealing resin layer 18 on the left surface SL1 of the sealing resin layer 18. The right end of the plate-shaped portion 140 is located on the right surface SR1 of the sealing resin layer 18. In the present embodiment, the right end of the plate-shaped portion 140 is exposed from the sealing resin layer 18 on the right surface SR1 of the sealing resin layer 18. The upper end of the plate-shaped portion 140 is located on the upper surface SU1 of the sealing resin layer 18. In the present embodiment, the upper end of the plate-shaped portion 140 is exposed from the sealing resin layer 18 on the upper surface SU1 of the sealing resin layer 18.

The shield 20 covers the upper surface SU1 of the sealing resin layer 18. In the present embodiment, the shield 20 covers the upper surface SU1, the left surface SL1, the right surface SR1, the front surface SF1, and the back surface SB1 of the sealing resin layer 18, and the left surface SL2, the right surface SR2, the front surface SF2, and the back surface SB2 of the substrate 12. The shield 20 is electrically connected to the metal member 14. Specifically, the shield 20 is in contact with a portion where the plate-shaped portion 140 and the upper protruding portion 160 are exposed from the sealing resin layer 18. Further, the shield 20 is connected to the ground conductor layer G exposed from the back surface SB2 of the substrate 12. Thus, the shield 20 is connected to the ground potential. The shield 20 has a multilayer structure. Specifically, the shield 20 includes an adhesion layer, a conductive layer, and a protective layer. The adhesion layer, the conductive layer, and the protective layer are stacked in this order from the lower layer to the upper layer. The adhesion layer serves to increase adhesion strength between the conductive layer and the sealing resin layer 18. The material of the adhesion layer is, for example, stainless steel (SUS). The conductive layer serves a shielding function. The material of the conductive layer is, for example, a metal such as Cu, Ag, or Al. The protective layer serves to prevent corrosion of the conductive layer. The material of the protective layer is, for example, SUS.

The surface roughness of the surface of the upper protruding portion 160 in contact with the shield 20 is rougher than the surface roughness of the front main surface SF3 and the back main surface SB3 of the plate-shaped portion 140. As a result, the possibility that the upper protruding portion 160 is peeled off from the shield 20 can be reduced. More specifically, the surface roughness of the surface of the upper protruding portion 160 in contact with the shield 20 is rough. In this case, the contact area between the surface of the upper protruding portion 160 in contact with the shield 20 and the shield 20 increases. Therefore, as compared with the case where the surface of the upper protruding portion 160 in contact with the shield 20 is flat, the adhesion between the upper protruding portion 160 and the shield 20 is improved (for example, an anchor effect). As a result, it is possible to reduce the possibility that the upper protruding portion 160 is peeled off from the shield 20 in the module 10.

[Method for Manufacturing Module]

Figure 8:
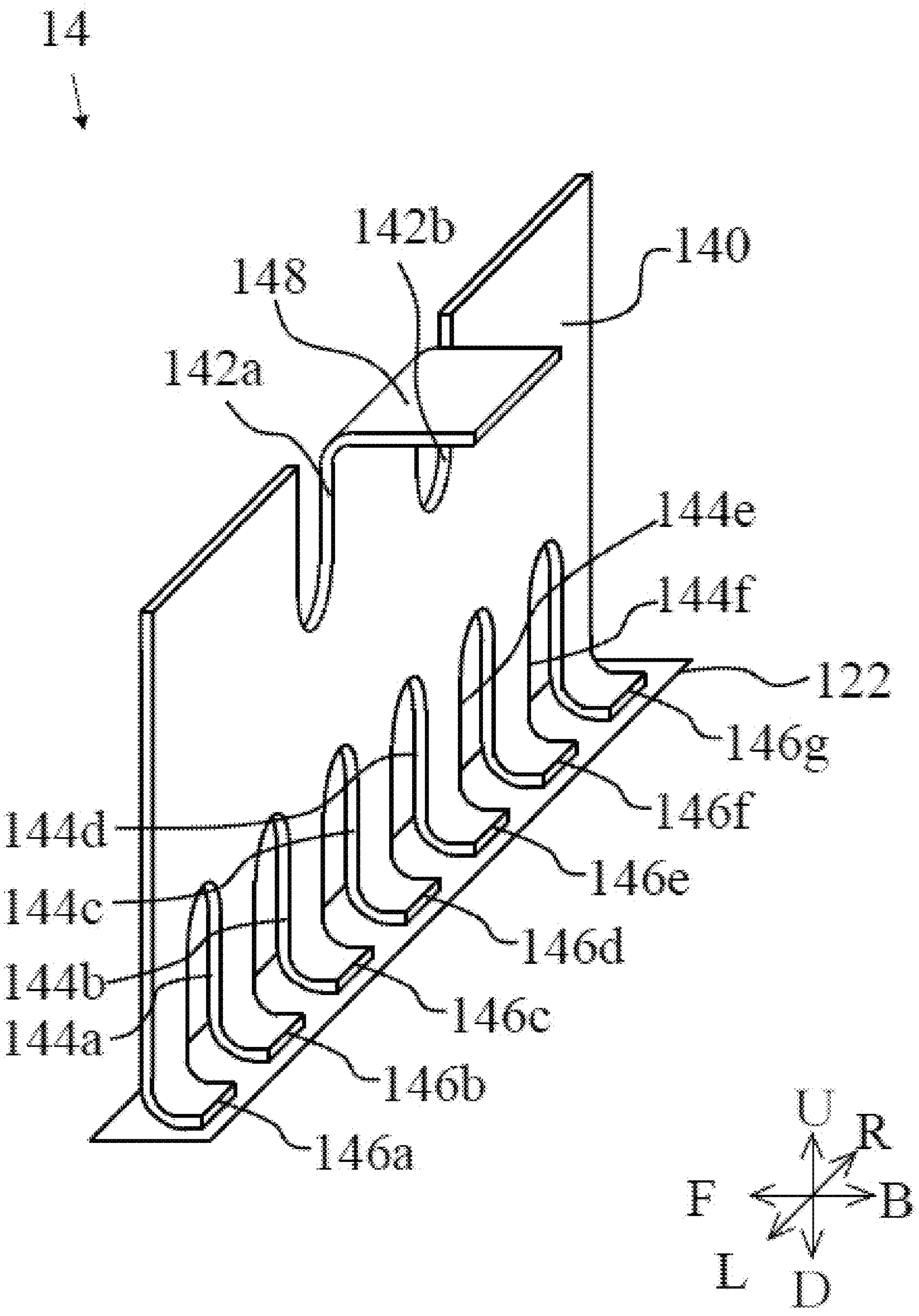
FIG. 8 is a perspective view at the time of mounting the metal member 14.
Figure 9:
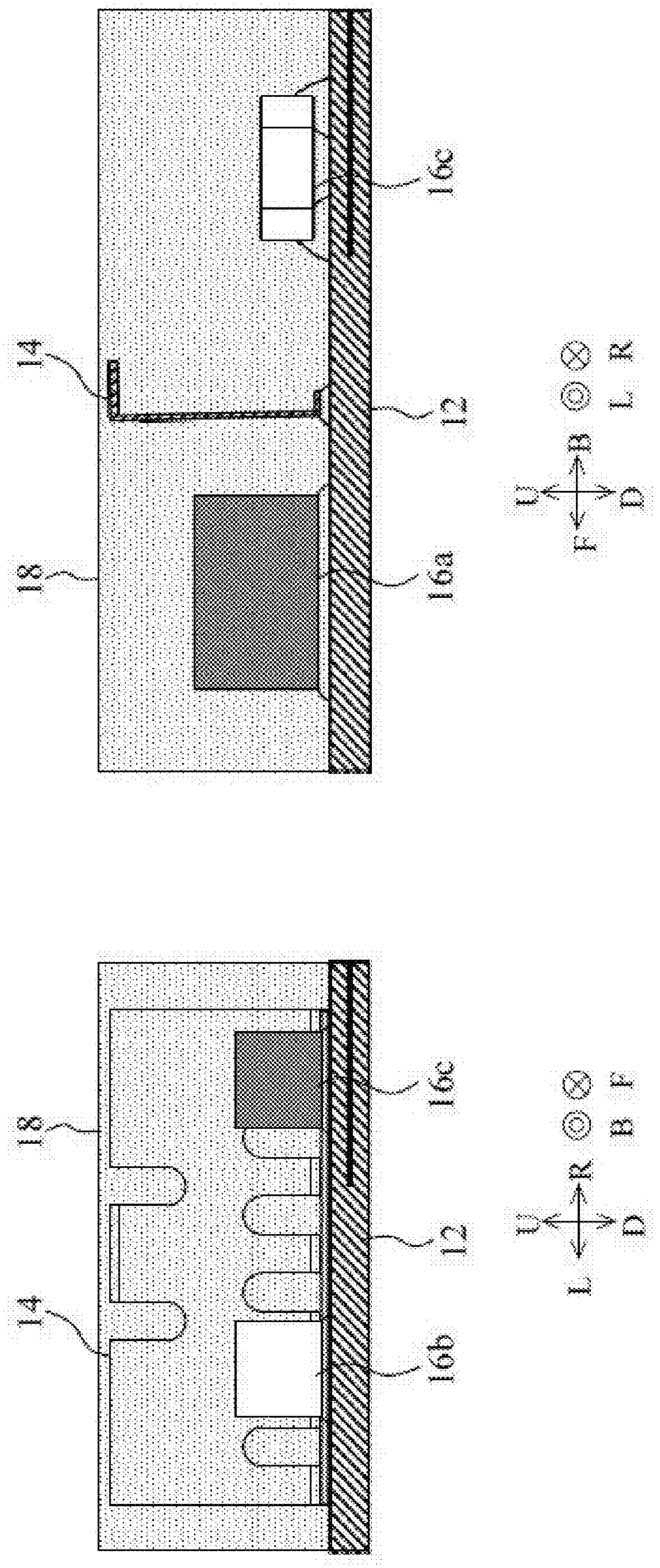
FIG. 9 is a cross-sectional view at the time of manufacturing the module 10.
Figure 10:
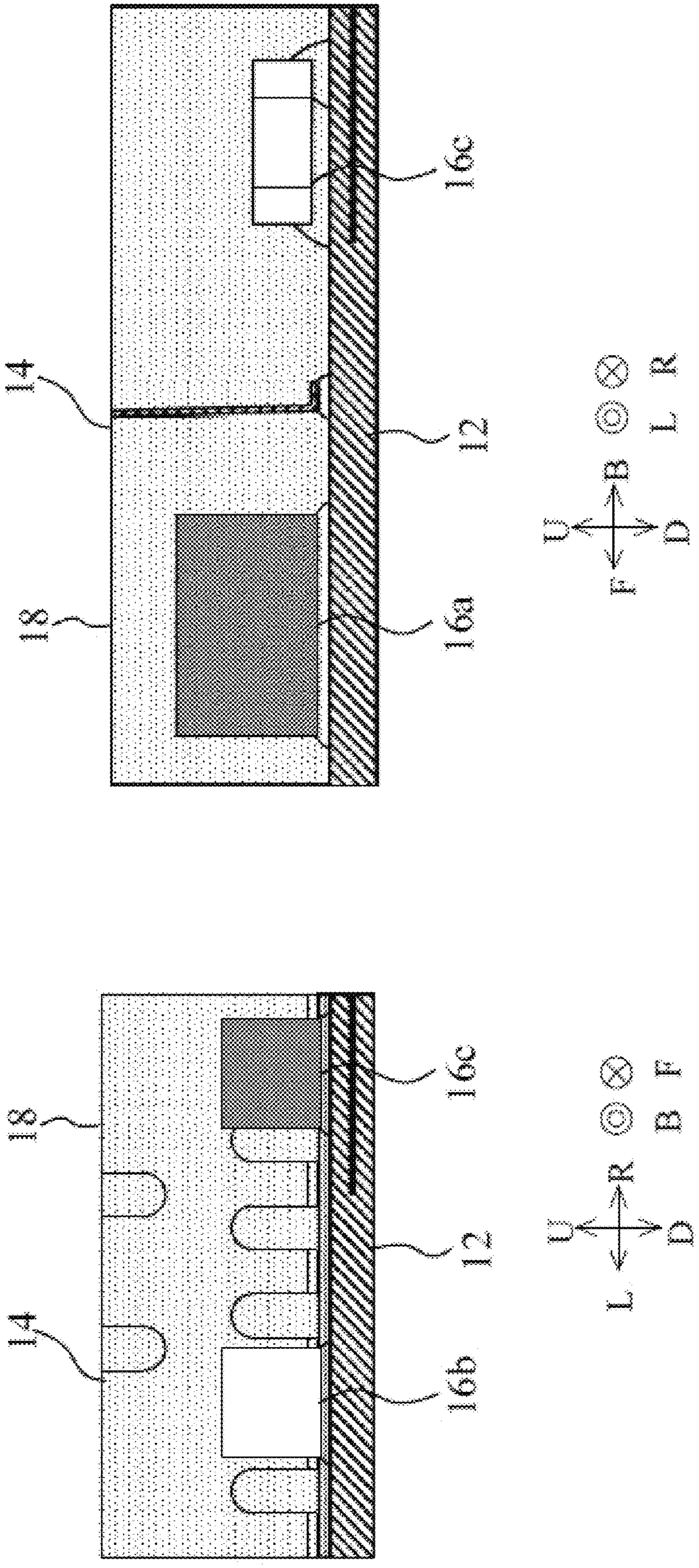
FIG. 10 is a cross-sectional view at the time of manufacturing the module 10.
Figure 11:
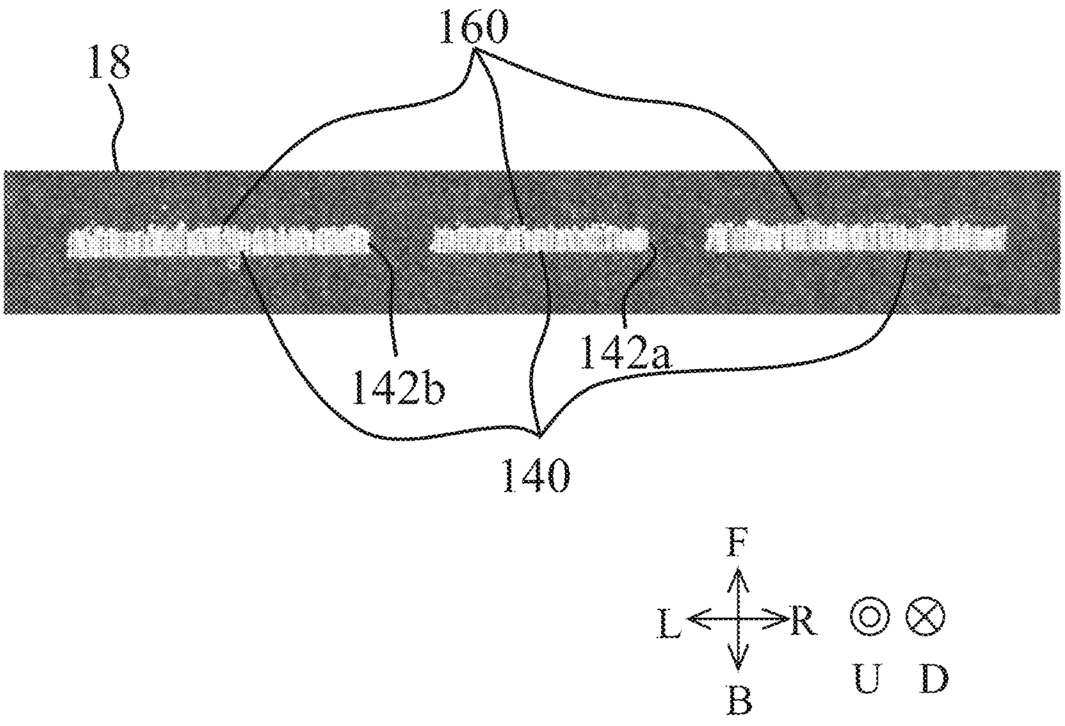
FIG. 11 is a photograph of an upper surface SU1 of a sealing resin layer 18 immediately after the sealing resin layer 18 is ground.

Next, a method of manufacturing the module 10 will be described with reference to the drawings. FIG. 8 is a perspective view at the time of mounting the metal member 14. FIGS. 9 and 10 are cross-sectional views at the time of manufacturing the module 10. FIG. 11 is a photograph of an upper surface SU1 of a sealing resin layer 18 immediately after the sealing resin layer 18 is ground.

First, in a first step, the substrate 12 on which the electronic components 16*a* to 16*c* are mounted on the upper main surface SU2 is prepared. In the next step, as illustrated in FIG. 8, the metal member 14 provided to extend in the up-down direction on the upper main surface SU2 of the substrate 12 and provided between the electronic component 16*a* and the electronic components 16*b* and 16*c* is mounted on the substrate 12. Here, the metal member 14 at the time of manufacturing the module 10 will be described. The metal member 14 further includes a top surface portion 148. The top surface portion 148 is located between the upper notch 142*a* and the upper notch 142*b* when viewed in the front-back direction. The top surface portion 148 extends backward from the upper side LU (see FIG. 4). The top surface portion 148 is formed by bending a part of the metal member 14 backward. The top surface portion 148 is used for mounting the metal member 14. Specifically, the top surface portion 148 is sucked using a mounting machine. Then, the metal member 14 is moved by the mounting machine, and the foot portions 146*a* to 146*g* are set on the mounting electrode 122. Thereafter, each of the foot portions 146*a* to 146*g* is fixed to the mounting electrode 122 by the solders 200*a* to 200*g*. At this time, solder is applied to each of the foot portions 146*a* to 146*g*, and solder is also applied to the mounting electrode 122. In order to further stabilize the ground potential, the solders 200*a* to 200*g* applied to the adjacent foot portions 146*a* to 146*g* may be integrated. In FIG. 4, the solders 200*a* to 200*g* applied to the foot portions 146*a* to 146*g* are integrated. Thus, the foot portions 146*a* to 146*g* are fixed to the mounting electrode 122 which is one electrode by integrated solder.

Next, in a second step, as illustrated in FIG. 9, the sealing resin layer 18 is formed on the upper main surface SU2 of the substrate 12. At this time, the sealing resin layer 18 is formed so that the sealing resin layer 18 covers the entire upper main surface SU2 of the substrate 12. Specifically, the substrate 12 is set in a mold. Then, a resin (molten resin) which is melted is injected into the mold. At this time, the molten resin passes through the upper notches 142*a* and 142*b* and the lower notches 144*a* to 144*f* and spreads over the entire upper main surface SU2 of the substrate 12. Then, the electronic components 16*a* to 16*c* and the metal member 14 are located in the sealing resin layer 18. That is, the electronic components 16*a* to 16*c* and the metal member 14 are not exposed from the sealing resin layer 18.

Next, in a third step, the upper main surface SU of the sealing resin layer 18 is ground with a grindstone. For example, the grindstone grinds the upper surface SU1 of the sealing resin layer 18 while moving forward with respect to the upper surface SU1 of the sealing resin layer 18. Thus, the upper end of the plate-shaped portion 140 is exposed from the upper surface SU1 of the sealing resin layer 18. When the upper surface SU1 of the sealing resin layer 18 is ground, the top surface portion 148 of the metal member 14 is ground. At this time, as illustrated in FIG. 11, the upper protruding portion 160 having a thickness in the up-down direction thinner than the thickness of the plate-shaped portion 140 is formed at the upper end of the plate-shaped portion 140. Specifically, the sealing resin layer 18 is ground while moving the grindstone forward with respect to the sealing resin layer 18. As a result, the upper protruding portion 160 extends forward from the upper end of the plate-shaped portion 140. The thickness of the upper protruding portion 160 is much thinner than the thickness of the plate-shaped portion 140. The upper end of the metal member 14 is scraped by a grindstone. Therefore, the surface roughness of the upper end of the plate-shaped portion 140 is larger than the surface roughness of the front main surface SF3 and the back main surface SB3 of the plate-shaped portion 140. Further, in a fourth step, by cutting the substrate 12 and the sealing resin layer 18 in the up-down direction using a dicer, the substrate 12 and the sealing resin layer 18 are divided. At this time, the left surface SL1, the right surface SR1, the front surface SF1, and the back surface SB1 of the sealing resin layer 18 are formed. The left end and the right end of the plate-shaped portion 140 are exposed from the left surface SL1 and the right surface SR1 of the sealing resin layer 18. The surface roughness of the left end and the right end of the plate-shaped portion 140 is larger than the surface roughness of the front main surface SF3 and the back main surface SB3 of the plate-shaped portion 140. Protruding portions are also formed at the left end and the right end of the plate-shaped portion 140 in the same manner as the upper end of the plate-shaped portion 140.

Next, in a fifth step, the shield 20 is formed on the upper surface SU1, the left surface SL1, the right surface SR1, the front surface SF1, and the back surface SB1 of the sealing resin layer 18. Specifically, the adhesion layer, the conductive layer, and the protective layer are formed by performing sputtering three times. As described above, the surface roughness of the upper end, the left end, and the right end of the metal member 14 is larger than the surface roughness of the front main surface SF3 and the back main surface SB3 of the plate-shaped portion 140. Therefore, the adhesion layer adheres to the upper end, the left end, and the right end of the metal member 14 with high adhesion strength. Through the above steps, the module 10 is completed.

As described above, according to the present step, the upper protruding portion 160 extending in any one direction from the upper end of the plate-shaped portion 140 in the front-back direction and having a thickness in the up-down direction thinner than the thickness of the plate-shaped portion 140 can be easily formed.

[Effects]

According to the module 10, it is possible to improve the shielding property of the metal member 14 with respect to the electronic component 16*a*. Generally, the electronic component 16*a* is brought close to the metal member 14 in order to improve the shielding property with respect to the electronic component 16*a* mounted on the module 10. However, if the metal member 14 and the electronic components 16*a* to 16*c* are too close to each other, a short circuit or the like may occur between the metal member 14 and the electronic components 16*a* to 16*c*. For example, a short circuit may occur when the metal member 14 and the electronic components 16*a* to 16*c* are soldered to the substrate 12. Therefore, when the electronic component 16*a* is brought close to the metal member 14, there is a limit to the distance that can be brought close. As described above, in the method of bringing the electronic component 16*a* and the metal member 14 close to each other, it is difficult to improve the shielding property for the electronic component 16*a*. On the other hand, the module 10 according to the present disclosure can improve the shielding property with respect to the electronic component 16*a* without bringing the electronic component 16*a* close to the metal member 14. More specifically, the upper protruding portion 160 extends forward from the upper end of the plate-shaped portion 140. In this case, the upper protruding portion 160 extends from the upper end of the plate-shaped portion 140 so as to approach the electronic component 16*a*. As a result, the shielding property by the metal member 14 upward with respect to the electronic component 16*a* is enhanced. As described above, even if the electronic component 16*a* is not brought close to the plate-shaped portion 140, the metal member 14 has a high shielding property with respect to the electronic component 16*a*.

The thickness of the upper protruding portion 160 in the up-down direction is thinner than the thickness of the metal member 14 in the front-back direction. As a result, when the shield 20 is formed on the upper surface SU1, the left surface SL1, the right surface SR1, the front surface SF1, and the back surface SB1 of the sealing resin layer 18, the possibility that the shielding property is deteriorated can be reduced. For example, when the thickness of the upper protruding portion 160 is large, the upper protruding portion 160 may swell upward from the upper surface of the sealing resin layer 18. When the upper protruding portion 160 protrudes upward from the sealing resin layer 18, a space may be generated between the upper protruding portion 160 and the upper surface of the sealing resin layer 18 in the up-down direction. In this case, when the shield 20 is formed on the sealing resin layer 18 by sputtering, there is a possibility that the shield 20 does not enter the space. In other words, there is a possibility that the shield 20 is not formed on the sealing resin layer 18 in contact with the space. As a result, the shielding property of the shield 20 may be deteriorated. On the other hand, when the thickness of the upper protruding portion 160 is thin, the possibility that the upper protruding portion 160 protrudes upward from the sealing resin layer 18 is reduced. Therefore, the shielding property of the shield 20 is less likely to decrease. As a result, the shielding property of the module 10 is less likely to decrease.

According to the module 10, the metal member 14 and the shield 20 can be more reliably connected. Hereinafter, a module in which the plate-shaped portion is not inclined with respect to the up-down direction is defined as a module according to a comparative example. In the module according to the comparative example, the upper surface of the sealing resin layer is polished. After the sealing resin layer is polished, the upper end of the plate-shaped portion is a plane orthogonal to the front main surface and the back main surface of the plate-shaped portion.

On the other hand, the plate-shaped portion 140 is inclined with respect to the up-down direction such that an upper end PU of the plate-shaped portion 140 is located in front of a lower end PD of the plate-shaped portion 140. In the module 10, the upper surface SU1 of the sealing resin layer 18 is polished. After polishing the sealing resin layer 18, the upper end PU of the plate-shaped portion 140 is a plane that forms an acute angle with respect to the front main surface SF3 of the plate-shaped portion 140 and an obtuse angle with respect to the back main surface SB3. Therefore, the area of the upper end PU of the plate-shaped portion 140 of the module 10 is larger than the area of the upper end of the plate-shaped portion of the module according to the comparative example. As a result, in the module 10, the upper end PU of the plate-shaped portion 140 comes into close contact with the shield 20. As described above, in the module 10, the metal member 14 and the shield 20 can be more reliably connected.

Further, according to the module 10, the shielding property of the module 10 is further improved. Hereinafter, a case where the distance between the metal member 14 not including the upper protruding portion 160 and each of the electronic components 16*a*, 16*b*, and 16*c* is shortened to the limit will be described as an example. In other words, a case where the distance between the electronic component 16*a* and the plate-shaped portion 140 and the distance between the electronic components 16*b* and 16*c* and the foot portions 146*a* to 146*g* are shortened to the limit will be described as an example. In this case, the distance between the plate-shaped portion 140 and the electronic component 16*a* when brought close to the limit is equal to the distance between the foot portions 146*a* to 146*g* and the electronic components 16*b* and 16*c* when brought close to the limit. For example, when the distance between the plate-shaped portion 140 and the electronic component 16*a* when brought close to the limit is 5 mm, the distance between the foot portions 146*a* to 146*g* and the electronic components 16*b* and 16*c* when brought close to the limit is 5 mm. In this case, from the viewpoint of preventing a short circuit between the metal member 14 and the electronic components 16*a*, 16*b*, and 16*c*, and the like, the distance between the metal member 14 and the electronic components 16*a*, 16*b*, and 16*c* cannot be further shortened. Therefore, in the module 10, it is difficult to further improve the shielding property with respect to the electronic components 16*a*, 16*b*, and 16*c*.

On the other hand, in a case where the metal member 14 includes the upper protruding portion 160 extending forward and the distances to the electronic components 16*a*, 16*b*, and 16*c* are each shortened to the limit, it is possible to further improve the shielding property of the metal member 14 with respect to the electronic component 16*a*. Specifically, the metal member 14 includes the upper protruding portion 160 extending forward from the upper end of the plate-shaped portion 140. At this time, when the substrate 12 is viewed from above, the distance between the electronic component 16*a* and the metal member 14 is shorter than the distance between the electronic components 16*b* and 16*c* and the metal member 14. In other words, the metal member 14 approaches the electronic component 16*a* by the length of the upper protruding portion 160. Therefore, the upward shielding property with respect to the electronic component 16*a* is improved by the upper protruding portion 160. As described above, even when the distance between the metal member 14 and each of the electronic components 16*a*, 16*b*, and 16*c* is shortened to the limit, it is possible to further enhance the shielding property with respect to the electronic component 16*a* in the module 10.

According to the module 10, it is possible to suppress the metal member 14 from falling down at the time of forming the sealing resin layer 18. More specifically, the plate-shaped portion 140 is provided with the upper notches 142*a* and 142*b* extending downward from the upper side LU. The plate-shaped portion 140 is provided with one or more lower notches 144*a* to 144*f* extending upward from the lower side LD. Thus, at the time of forming the sealing resin layer 18, the molten resin passes through the upper notches 142*a* and 142*b* and the lower notches 144*a* to 144*f* and spreads over the entire upper main surface SU2 of the substrate 12. Therefore, the vicinity of the upper side LU and the vicinity of the lower side LD of the plate-shaped portion 140 are less likely to receive the pressure due to the molten resin. This prevents the plate-shaped portion 140 from falling so as to rotate about the upper side LU or the plate-shaped portion 140 from falling so as to rotate about the lower side LD. As a result, according to the module 10, it is possible to suppress the metal member 14 from falling down at the time of forming the sealing resin layer 18.

According to the module 10, the foot portions 146*a* to 146*g* can be accurately formed such that the angles of the foot portions 146*a* to 146*g* with respect to the plate-shaped portion 140 become values close to design values. Hereinafter, as illustrated in FIGS. 6 and 7, a boundary portion between the plate-shaped portion 140 and the foot portions 146*a* to 146*g* is defined as a boundary C. The foot portions 146*a* to 146*g* are formed by bending a part of the metal member 14. At this time, tensile stress is generated on the outer surface SO. Therefore, the outer surface SO is pulled. On the other hand, compressive stress is generated on the inner surface SI. The inner surface SI is compressed. In the inner surface SI, the metal material having lost a place to go due to the compressive stress is displaced leftward and rightward. Therefore, at the left end of the boundary C, the metal material protrudes leftward from the foot portions 146*a* to 146*g*. At the right end of the boundary C, the metal material protrudes rightward from the foot portions 146*a* to 146*g*. Therefore, the outer edges of the foot portions 146*a* to 146*g* are connected to the outer edges of the lower notches 144*a* to 144*g*. Therefore, the metal material can protrude into the lower notches 144*a* to 144*f*. In this case, the protrusion of the metal material is hardly hindered. Therefore, bending of a part of the metal member 14 for forming the foot portions 146*a* to 146*g* is hardly hindered. As a result, the foot portions 146*a* to 146*g* can be accurately formed such that the angles of the foot portions 146*a* to 146*g* with respect to the plate-shaped portion 140 become values close to design values. Therefore, the solder uniformly adheres to the entire lower surface Sx of the foot portions 146*a* to 146*g*. Thus, according to the module 10, self-standing of the metal member 14 is improved. The self-standing of the metal member 14 means that when the metal member 14 is fixed by solder, the metal member 14 is less likely to fall down even if the solder melts.

According to the module 10, the foot portions 146*b* to 146*f* can be accurately formed such that the angles of the foot portions 146*b* to 146*f* with respect to the plate-shaped portion 140 become values close to design values. More specifically, the foot portions 146*a* to 146*g* include the foot portions 146*b* to 146*f* (first foot portions) located between the lower notches 144*a* to 144*f* in the left-right direction when viewed in the front-back direction. The lower notches 144*a* to 144*f* are located on both the left and right of the foot portions 146*b* to 146*f*. Thus, the protrusion of the metal material is less likely to be hindered. Therefore, bending of a part of the metal member 14 for forming the foot portions 146*b* to 146*f* is less likely to be hindered. As a result, the foot portions 146*b* to 146*f* can be accurately formed such that the angles of the foot portions 146*b* to 146*f* with respect to the plate-shaped portion 140 become values close to design values. Therefore, the solder uniformly adheres to the entire lower surface Sx of the foot portions 146*b* to 146*f*. Thus, according to the module 10, self-standing of the metal member 14 is improved.

According to the module 10, the foot portions 146*a* and 146*g* can be accurately formed such that the angles of the foot portions 146*a* and 146*g* with respect to the plate-shaped portion 140 become values close to design values. More specifically, the foot portions 146*a* to 146*g* include the foot portions 146*a* and 146*g* disposed at the left end portion and the right end portion of the lower side LD when viewed in the front-back direction. There is no metal material on the left of the foot portion 146*a*. The metal material is not present on the right of the foot portion 146*g*. Thus, bending of a part of the metal member 14 for forming the foot portions 146*a* and 146*g* is less likely to be hindered. As a result, the foot portions 146*a* and 146*g* can be accurately formed such that the angles of the foot portions 146*a* and 146*g* with respect to the plate-shaped portion 140 become values close to design values. Therefore, the solder uniformly adheres to the entire lower surfaces Sx of the foot portions 146*a* and 146*g*. Thus, according to the module 10, self-standing of the metal member 14 is improved.

According to the module 10, the region where the electronic components 16*a* to 16*c* can be mounted on the upper main surface SU2 of the substrate 12 increases. Hereinafter, a module according to a reference example will be described as an example. The metal member of the module according to the reference example includes a plurality of foot portions. The plurality of foot portions include a front foot portion extending forward from the lower side of the plate-shaped portion and a back foot portion extending backward from the lower side of the plate-shaped portion. When the electronic component is mounted in front of the metal member, the electronic component needs to be mounted at a position away forward from the front foot portion by a predetermined distance. Therefore, the electronic component cannot be mounted in the region from the metal member to the total distance of the length of the front foot portion and a predetermined distance. Similarly, when the electronic component is mounted behind the metal member, the electronic component needs to be mounted at a position away backward from the back foot portion by a predetermined distance. Therefore, the electronic component cannot be mounted in the region from the metal member to the total distance of the length of the back foot portion and the predetermined distance.

On the other hand, in the module 10, the foot portions 146*a* to 146*g* extend backward from the lower side LD of the plate-shaped portion 140. In this case, when the electronic components 16*b* and 16*c* are mounted behind the metal member 14, the electronic components 16*b* and 16*c* need to be mounted at positions away backward from the foot portions 146*a* to 146*g* by a predetermined distance. Therefore, the electronic components 16*b* and 16*c* cannot be mounted in the region from the metal member 14 to the total distance of the lengths of the foot portions 146*a* to 146*g* and the predetermined distance. On the other hand, when the electronic component 16*a* is mounted in front of the metal member 14, the electronic component needs to be mounted at a position away forward from the plate-shaped portion 140 by a predetermined distance. Therefore, the electronic component 16*a* cannot be mounted in a region up to a predetermined distance from the metal member 14. Therefore, in the module according to the reference example, the region where the electronic component cannot be mounted is wider than the region where the electronic components 16*a* to 16*c* cannot be mounted in the module 10 by the amount of the region from the metal member to the length of the front foot portion. In other words, according to the module 10, the region where the electronic components 16*a* to 16*c* can be mounted on the upper main surface SU2 of the substrate 12 increases.

In addition, according to the module 10, the wetting-up states of solders 200*a* to 200*g* with respect to the foot portions 146*a* to 146*g* become nearly uniform. More specifically, the metal member 14 is generally formed by punching a metal plate. At this time, the outer edge of the metal member 14 is formed such that the shear surface and the fracture surface are adjacent to each other in the thickness direction of the metal member 14. In the module 10, the foot portions 146*a* to 146*g* extend backward from the lower side LD of the plate-shaped portion 140. Therefore, at the back ends of the foot portions 146*a* to 146*g*, the positional relationship between the shear surface and the fracture surface in the up-down direction is aligned. Thus, the wetting-up states of the solders 200*a* to 200*g* with respect to the foot portions 146*a* to 146*g* approach uniformity.

According to the module 10, when the plate-shaped portion 140 is inclined at the time of forming the sealing resin layer 18, the area of the portion where the foot portions 146*a* to 146*g* are peeled off from the mounting electrode 122 is reduced. More specifically, in the module according to the reference example, the plurality of foot portions include a front foot portion extending forward from the lower side of the plate-shaped portion and a back foot portion extending backward from the lower side of the plate-shaped portion. In the module according to the reference example, the length in the front-back direction of the portion where the metal member is fixed to the mounting electrode is the sum of the length in the front-back direction of the front foot portion and the length in the front-back direction of the back foot portion. For example, when the plate-shaped portion falls backward so as to rotate about the back end of the back foot portion, the front foot portion and the back foot portion may be peeled off from the mounting electrode over the total length of the length of the front foot portion in the front-back direction and the length of the back foot portion in the front-back direction.

On the other hand, in the module 10, the foot portions 146*a* to 146*g* extend backward from the lower side LD of the plate-shaped portion 140. Therefore, in the module 10, the length in the front-back direction of the portion where the metal member 14 is fixed to the mounting electrode 122 is the length in the front-back direction of the foot portions 146*a* to 146*g*. Therefore, for example, when the plate-shaped portion 140 falls backward so as to rotate about the back ends of the foot portions 146*a* to 146*g*, there is a possibility that the foot portions 146*a* to 146*g* are peeled off from the mounting electrode 122 over the length of the foot portions 146*a* to 146*g* in the front-back direction. The lengths of the foot portions 146*a* to 146*g* in the front-back direction are shorter than the sum of the length of the front foot portion in the front-back direction and the length of the back foot portion in the front-back direction of the module according to the reference example. Therefore, according to the module 10, when the plate-shaped portion 140 is inclined at the time of forming the sealing resin layer 18, the area of the portion where the foot portions 146*a* to 146*g* are peeled off from the mounting electrode 122 is reduced.

According to the module 10, the potential of the metal member 14 tends to be uniform. More specifically, the foot portions 146*a* to 146*g* are arranged at equal intervals in the left-right direction when viewed in the front-back direction. The foot portions 146*a* to 146*g* are connected to the ground potential via the mounting electrode 122. Thus, the metal member 14 is connected to the ground potential at portions arranged at equal intervals in the left-right direction when viewed in the front-back direction. As a result, according to the module 10, the potential of the metal member 14 tends to be uniform.

According to the module 10, the self-alignment property of the foot portions 146*a* to 146*g* is improved according to the metal member 14. More specifically, the foot portions 146*a* to 146*g* are arranged at equal intervals in the left-right direction when viewed in the front-back direction. Thus, when the solder melts in the mounting of the metal member 14, the solder attached to the foot portions 146*a* to 146*g* has a symmetrical structure. When solder is melted in mounting of the metal member 14, self-standing of the metal member 14 is secured. As a result, according to the metal member 14, the self-alignment property of the foot portions 146*a* to 146*g* is improved. The self-alignment property means that when solder is melted in mounting of the metal member 14, the foot portions 146*a* to 146*g* are maintained in an appropriate posture by surface tension of the solders 200*a* to 200*g*.

According to the module 10, it is possible to suppress the metal member 14 from falling down at the time of forming the sealing resin layer 18. More specifically, in the module 10, the lower notches 144*a* to 144*f* are arranged at equal intervals in the left-right direction when viewed in the front-back direction. Thus, the vicinity of the lower side LD of the plate-shaped portion 140 receives equal pressure from the molten resin. As a result, the plate-shaped portion 140 is suppressed from falling due to application of a large pressure to a specific portion in the vicinity of the lower side LD of the plate-shaped portion 140.

According to the module 10, the metal member 14 can be easily processed. More specifically, the shortest distance between the upper notches 142*a* and 142*b* and the lower notches 144*a* to 144*f* is 1.5 times or more the plate thickness of the plate-shaped portion 140. Thus, the upper notches 142*a* and 142*b* and the lower notches 144*a* to 144*f* are not too close to each other. As a result, punching of the metal member 14 is facilitated.

According to the module 10, it becomes easy to appropriately arrange the electronic components 16*a* to 16*c* according to the characteristics of the electronic components 16*a* to 16*c*. More specifically, the electronic components 16*a* to 16*c* may generate a magnetic flux like a coil, for example. When the electronic components 16*a* to 16*c* generate a magnetic flux, there are the following two cases. The first case is a case in which the magnetic flux generated by an electronic component is shielded in order to suppress an influence of the magnetic flux on surrounding electronic components. The electronic component corresponding to the first case is, for example, a surface acoustic wave (SAW) filter, a low noise amplifier (LNA), a switch, or the like. The second case is a case in which the magnetic flux generated by the electronic component is not shielded so that the characteristics of the electronic component are not deteriorated. The electronic component corresponding to the second case is, for example, a chip inductor. Hereinafter, in the module 10, a case where the electronic component 16*a* is an electronic component corresponding to the first case, and the electronic components 16*b* and 16*c* are electronic components corresponding to the second case will be described as an example. In this case, in the module 10, the plate-shaped portion 140 is slightly inclined forward with respect to the up-down direction, and the upper protruding portion 160 extends forward in the front-back direction from the upper end of the plate-shaped portion 140. Therefore, the plate-shaped portion 140 falls in a direction approaching the electronic component 16*a*. Further, the upper protruding portion 160 extends from the upper end of the plate-shaped portion 140 so as to approach the electronic component 16*a*. Thus, when the electronic component 16*a* is an electronic component corresponding to the first case, the magnetic flux is easily shielded by the plate-shaped portion 140 and the upper protruding portion 160. That is, the shielding property of the metal member 14 with respect to the electronic component 16*a* is improved. On the other hand, the plate-shaped portion 140 falls in a direction away from the electronic components 16*b* and 16*c*. Further, the upper protruding portion 160 does not extend backward in the front-back direction from the upper end of the plate-shaped portion 140. As a result, when the electronic components 16*b* and 16*c* are electronic components corresponding to the second case, the magnetic flux is less likely to be shielded by the plate-shaped portion 140. That is, since the metal member 14 shields the magnetic flux of the electronic components 16*b* and 16*c*, it is possible to suppress deterioration of the characteristics of the electronic components 16*b* and 16*c*. As described above, according to the module 10, the electronic component corresponding to the first case is disposed in front of the metal member 14. The electronic component corresponding to the second case is disposed behind the metal member 14. As a result, it becomes easy to appropriately arrange the electronic components 16*a* to 16*c* according to the characteristics of the electronic components 16*a* to 16*c*.

In addition, electronic components corresponding to the second case include a vertical inductor and a horizontal inductor. The vertical inductor is an inductor whose winding axis extends in the up-down direction. In a case where the electronic component corresponding to the second case is a vertical inductor, it is possible to prevent the metal member 14 from hindering the magnetic flux generated by the vertical inductor, and it is possible to arrange the vertical inductor close to the metal member 14. That is, the degree of freedom in arrangement of the vertical-type electronic component is increased. The horizontal inductor is an inductor in which a winding axis extends in a direction orthogonal to the up-down direction. In a case where the electronic component corresponding to the second case is a horizontal inductor, the distance between the plate-shaped portion 140 and the horizontal inductor when the plate-shaped portion 140 is inclined forward with respect to the up-down direction is longer than the distance between the plate-shaped portion 140 and the horizontal inductor when the plate-shaped portion 140 extends in the up-down direction. As a result, it is possible to suppress deterioration of the characteristics of the horizontal inductor.

In the module 10, the plate-shaped portion 140 is slightly inclined forward with respect to the up-down direction. Thus, the pressure due to the molten resin applied to the plate-shaped portion 140 is reduced. As a result, generation of cracks between the foot portions 146*a* to 146*g* and the solders 200*a* to 200*g* and breakage of the foot portions 146*a* to 146*g* and the solders 200*a* to 200*g* are suppressed.

In the module 10, the upper end of the plate-shaped portion 140 comes into close contact with the shield 20. More specifically, the plate-shaped portion 140 is slightly inclined forward with respect to the up-down direction. Therefore, the upper end of the plate-shaped portion 140 of the sealing resin layer 18 after grinding is a plane formed by obliquely cutting the plate-shaped portion 140. Therefore, the area of the upper end of the plate-shaped portion 140 is large. As a result, in the module 10, the upper end of the plate-shaped portion 140 easily comes into close contact with the shield 20.

In the module 10, the upper protruding portion 160 comes into contact with the shield 20. More specifically, a portion of the upper protruding portion 160 exposed from the sealing resin layer 18 is in contact with the shield 20. That is, in the module 10, the shield 20 is in contact with the upper end of the plate-shaped portion 140 and the upper protruding portion 160. Therefore, as compared with a case where only the upper end of the plate-shaped portion 140 is in contact with the shield 20, in a case where the shield 20 is in contact with the upper end of the plate-shaped portion 140 and the upper protruding portion 160, the area where the metal member 14 and the shield 20 are in contact with each other becomes large. As a result, in the module 10, the connection to the GND is strengthened as compared with the case where only the upper end of the plate-shaped portion 140 is in contact with the shield 20.

In the module 10, the plate-shaped portion 140 is slightly inclined forward with respect to the up-down direction. As a result, as illustrated in FIG. 7, the foot portions 146*a* to 146*g* are slightly inclined upward with respect to the front-back direction. Therefore, in the metal member, a portion located within a distance in which the solders 200*a* to 200*g* can be wetted upward with each other from the mounting electrode 122 is widened. In particular, the solders 200*a* to 200*g* easily wets upward on the outer surface SO. That is, a portion of the metal member 14 close to the mounting electrode 122 is widened. As a result, a portion where the metal member 14 is fixed to the mounting electrode 122 by the solders 200*a* to 200*g* is widened.

According to the module 10, the foot portions 146*a* to 146*g* and the top surface portion 148 can be accurately formed. More specifically, the foot portions 146*a* to 146*g* are formed by bending a part of the metal member 14 backward. The top surface portion 148 is formed by bending a part of the metal member 14 backward. In this manner, the foot portions 146*a* to 146*g* and the top surface portion 148 are formed by bending a part of the metal member 14 in the same direction. Therefore, it is possible to simultaneously form the foot portions 146*a* to 146*g* and the top surface portion 148. As a result, the foot portions 146*a* to 146*g* and the top surface portion 148 can be formed with high accuracy.

According to the module 10, it is possible to suppress the metal member 14 from falling down at the time of forming the sealing resin layer 18. More specifically, the plate-shaped portion 140 is provided with upper notches 142*a* and 142*b*. The metal member 14 includes foot portions 146*a* to 146*g*. As a result, in the vicinity of the upper side LU of the metal member 14, the pressure due to the molten resin is reduced by the upper notches 142*a* and 142*b*. On the other hand, the vicinity of the lower side LD of the metal member 14 is opposed to the pressure due to the molten resin by the foot portions 146*a* to 146*g*. As described above, in the module 10, measures against the pressure due to the molten resin are taken in the vicinity of the upper side LU and the vicinity of the lower side LD of the metal member 14. As a result, according to the module 10, it is possible to suppress the metal member 14 from falling down at the time of forming the sealing resin layer 18.

According to the module 10, it is possible to suppress the metal member 14 from falling down at the time of forming the sealing resin layer 18. More specifically, the metal member 14 includes the foot portions 146*a* to 146*g*. The foot portions 146*a* to 146*g* are fixed to the mounting electrode 122. Therefore, the lower part of the metal member 14 is less likely to be elastically deformed than the upper part of the metal member 14. When the molten resin applies pressure on the plate-shaped portion 140, the lower part of the metal member 14 is hardly elastically deformed, so that the lower part of the metal member 14 cannot release the pressure due to the molten resin. Therefore, a large pressure is likely to be applied to the lower part of the metal member 14. In this case, there is a possibility that the foot portions 146*a* to 146*g* are peeled off from the mounting electrode 122 and the metal member 14 falls down. Therefore, the plate-shaped portion 140 is provided with the lower notches 144*a* to 144*f*. Thus, a large pressure applied to the metal member 14 can be released by the lower notches 144*a* to 144*f*. That is, application of a large pressure to the lower part of the metal member 14 is suppressed. Therefore, it is possible to suppress the metal member 14 from falling down at the time of forming the sealing resin layer 18.

In addition, since the upper notches 142*a* and 142*b* are provided in the plate-shaped portion 140, the total length of the upper ends of the metal member 14*b* in the left-right direction is short. Therefore, when the upper surface SU1 of the sealing resin layer 18 is ground, the amount of grinding the metal member 14 is reduced. As a result, deterioration of the grindstone is suppressed.

In the module 10, since the area of the mounting electrode 122 is large, the solders 200*a* to 200*g* on the mounting electrode 122 are located on the front, back, left, and right of the foot portions 146*a* to 146*g*. Thus, the solders 200*a* to 200*g* are easily wetted upward on the side surfaces of the foot portions 146*a* to 146*g*.

In the module 10, formation of a void under the outer surface SO is suppressed. More specifically, the space below the outer surface SO is a space into which the molten resin is less likely to enter. Therefore, the solders 200*a* to 200*g* wet upward to the vicinity of the upper end of the outer surface SO. Thus, there is no void under the outer surface SO at the time of forming the sealing resin layer 18. As a result, in the module 10, formation of a void under the outer surface so is suppressed. By suppressing the formation of the void, the connection reliability between the metal member 14 and the mounting electrode 122 is improved.

In the module 10, generation of voids in the solders 200*a* to 200*g* is suppressed. Shear surfaces and fracture surfaces are formed at the back end portions of the foot portions 146*a* to 146*g*. The surface roughness of the fracture surface is larger than the surface roughness of the shear surface. Therefore, adhesion of the solders 200*a* to 200*g* to the fracture surface causes generation of voids. Therefore, as illustrated in FIG. 7, the back end portions of the foot portions 146*a* to 146*g* have a shape in which the upper end and the lower end protrude backward from the center. Thus, the solders 200*a* to 200*g* are less likely to wet upward at the back end portions of the foot portions 146*a* to 146*g*. As a result, in the module 10, generation of voids in the solders 200*a* to 200*g* is suppressed.

In the module 10, the upper protruding portion 160 extends forward from the upper end of the plate-shaped portion 140. As a result, the upper protruding portion 160 is also used for connecting the metal member 14 and the shield 20. Therefore, the metal member 14 and the shield 20 are more reliably connected.

In the module 10, the upper protruding portion 160 extends forward from the upper end of the plate-shaped portion 140. This makes it easy to visually recognize the upper end of the plate-shaped portion 140. Therefore, it is possible to determine whether the module 10 is a good product or a defective product before forming the shield 20.

In the module 10, the washing property of the flux is improved. More specifically, after the metal member 14 is mounted on the mounting electrode 122, the substrate 12 and the metal member 14 are immersed in a tank containing a flux cleaning solution. Thus, the flux is washed. At this time, in order to improve the washing property of the flux, it is preferable that the fluidity of the flux cleaning solution is high. Therefore, the upper notches 142*a* and 142*b* and the lower notches 144*a* to 144*g* are provided in the plate-shaped portion 140. Thus, the flux cleaning solution can pass through the upper notches 142*a* and 142*b* and the lower notches 144*a* to 144*g*. Therefore, the fluidity of the flux cleaning solution is improved. As a result, in the module 10, the flux washing property is improved. Further, the flux cleaning solution remaining at the bent portion of the top surface portion 148 flows out from the bent portion of the top surface portion 148 through the upper notches 142*a* and 142*b*.

(First Modification)

Figure 12:
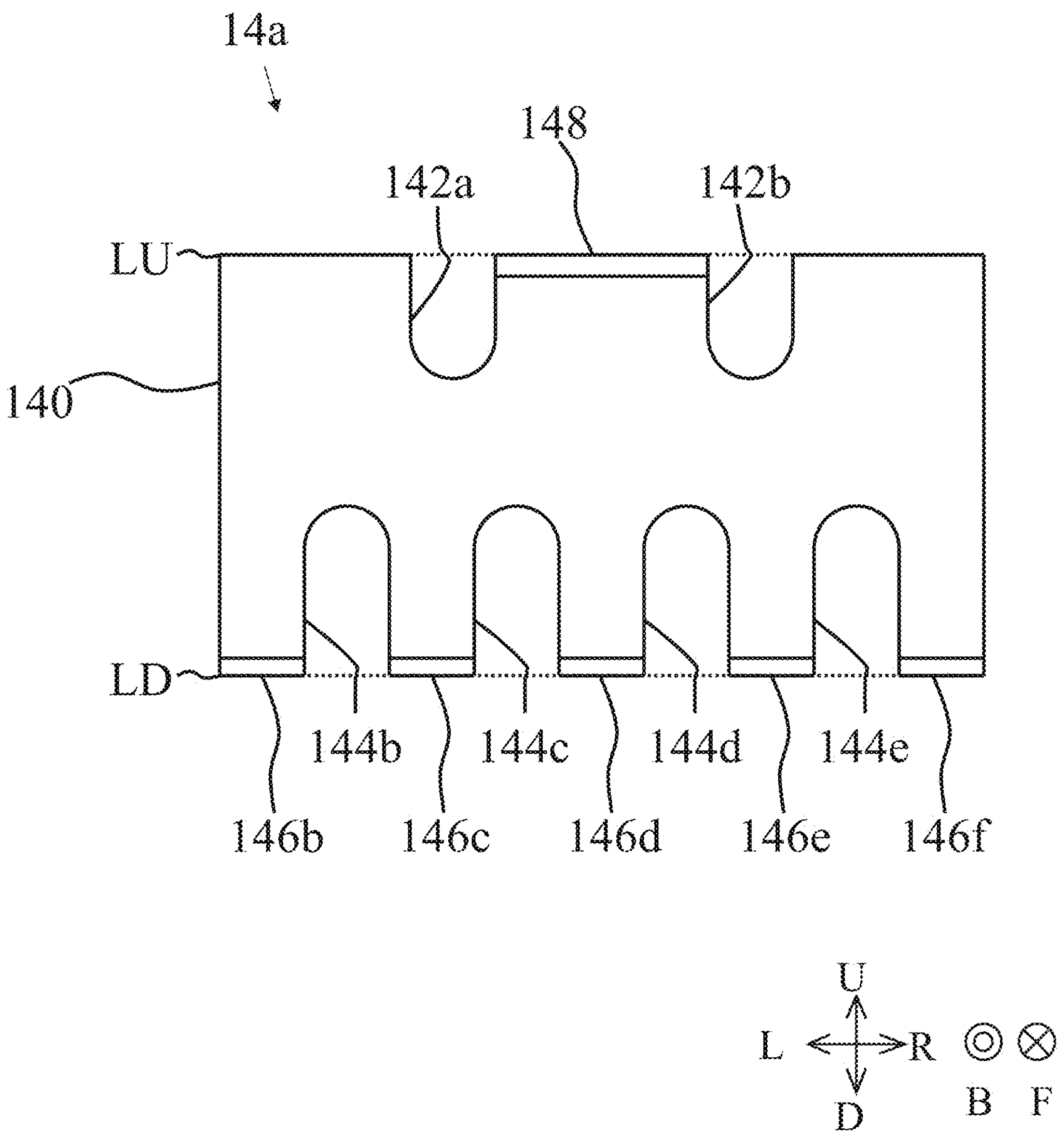
FIG. 12 is a rear view of a metal member 14*a* according to a first modification.

Hereinafter, a metal member 14*a* according to a first modification will be described with reference to the drawings. FIG. 12 is a rear view of a metal member 14*a* according to a first modification.

The metal member 14*a* differs from the metal member 14 in the number of lower notches. Specifically, in the metal member 14, the plate-shaped portion 140 is provided with six lower notches 144*a* to 144*f*. On the other hand, in the metal member 14*a*, the plate-shaped portion 140 is provided with four lower notches 144*b* to 144*e*. Since other structures of the metal member 14*a* are the same as those of the metal member 14, the description thereof will be omitted.

(Second Modification)

Figure 13:
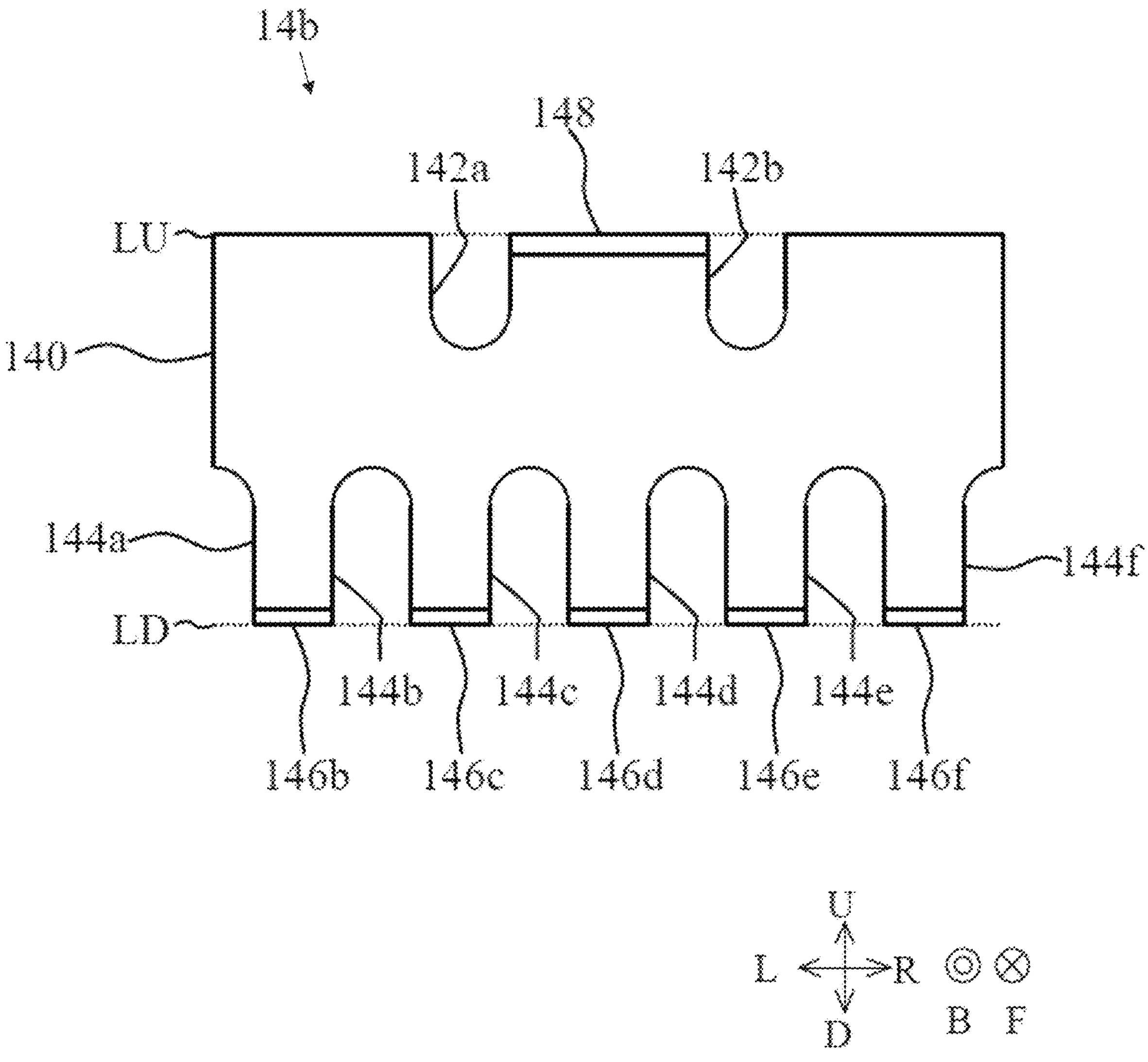
FIG. 13 is a rear view of a metal member 14*b* according to a second modification.

Hereinafter, a metal member 14*b* according to a second modification will be described with reference to the drawings. FIG. 13 is a rear view of a metal member 14*b* according to a second modification.

The metal member 14*b* is different from the metal member 14*a* in the number of lower notches. Specifically, in the metal member 14*a*, the plate-shaped portion 140 is provided with four lower notches 144*b* to 144*e*. On the other hand, in the metal member 14*b*, the plate-shaped portion 140 is provided with six lower notches 144*a* to 144*f*.

The lower notches 144*a* to 144*f* include the lower notch 144*a* (first lower notch) disposed at the left end portion of the lower side LD when viewed in the front-back direction. The lower notch 144*a* is an L-shaped defect formed by removing the lower left corner of the rectangular plate-shaped portion 140. Therefore, the lower notch 144*a* has the same shape as the right half of the lower notches 144*b* to 144*e*. However, the lower notch 144*a* may have a shape different from the right half of the lower notches 144*b* to 144*e*.

The lower notches 144*a* to 144*f* include the lower notch 144*f* (first lower notch) disposed at the right end portion of the lower side LD when viewed in the front-back direction. The lower notch 144*f* is an L-shaped defect formed by removing the lower right corner of the rectangular plate-shaped portion 140. Therefore, the lower notch 144*f* has the same shape as the left half of the lower notches 144*b* to 144*e*. However, the lower notch 144*f* may have a shape different from the left half of the lower notches 144*b* to 144*e*. Since other structures of the metal member 14*b* are the same as those of the metal member 14*a*, the description thereof will be omitted.

In the metal member 14*b*, since the lower notch 144*a* is provided, the length of the left end of the metal member 14*b* in the up-down direction is short. Therefore, when the left surface SL1 of the sealing resin layer 18 is cut, the amount of cutting the metal member 14*b* is reduced. As a result, deterioration of the blade of the dicer is suppressed. In the metal member 14*b*, since the lower notch 144*f* is provided, the length of the right end of the metal member 14*b* in the up-down direction is short. Therefore, when the right surface SR1 of the sealing resin layer 18 is cut, the amount of cutting the metal member 14*b* is reduced. As a result, deterioration of the t blade of the dicer is suppressed.

(Third Modification)

Figure 14:
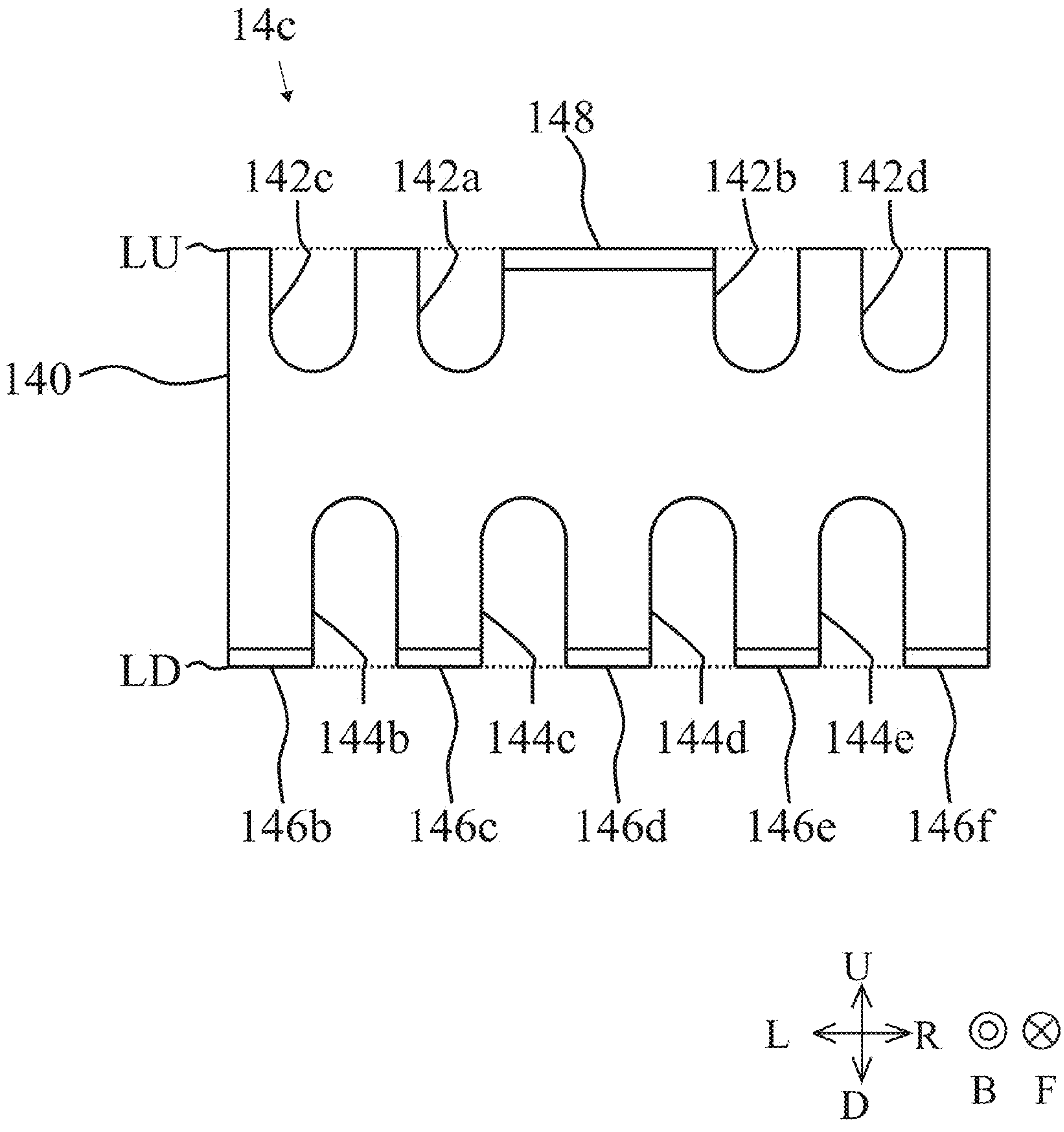
FIG. 14 is a rear view of a metal member 14*c* according to a third modification.

Hereinafter, a metal member 14*c* according to a third modification will be described with reference to the drawings. FIG. 14 is a rear view of a metal member 14*c* according to a third modification.

The metal member 14*c* is different from the metal member 14*a* in the number of upper notches. Specifically, in the metal member 14*a*, the plate-shaped portion 140 is provided with two upper notches 142*a* and 142*b*. On the other hand, in the metal member 14*c*, the plate-shaped portion 140 is provided with four upper notches 142*a* to 142*d*. The upper notch 142*c* is located on the left of the upper notch 142*a* when viewed in the front-back direction. The upper notch 142*d* is located to the right of the upper notch 142*b* when viewed in the front-back direction. Since other structures of the metal member 14*c* are the same as that of the metal member 14*a*, the description thereof will be omitted.

According to the metal member 14*c*, the upper notches 142*c* and 142*d* are provided in the plate-shaped portion 140. Thus, the vicinity of the upper side LU of the plate-shaped portion 140 is less likely to receive the pressure due to the molten resin. As a result, it is possible to suppress the metal member 14*c* from falling down at the time of forming the sealing resin layer 18. In addition, for the same reason as the metal member 14*b*, deterioration of the blade of the dicer is suppressed.

(Fourth Modification)

Figure 15:
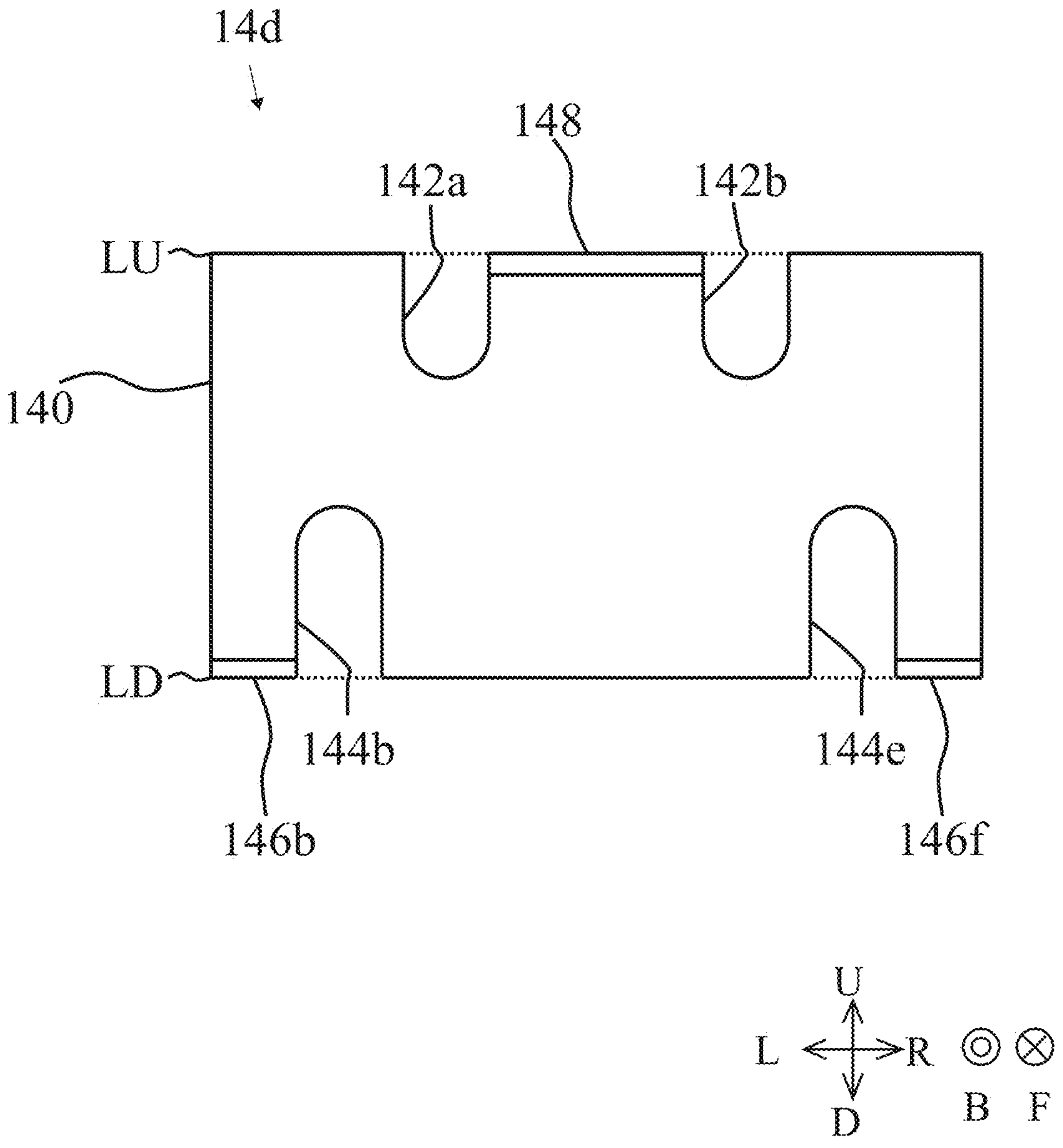
FIG. 15 is a rear view of a metal member 14*d* according to a fourth modification.

Hereinafter, a metal member 14*d* according to a fourth modification will be described with reference to the drawings. FIG. 15 is a rear view of a metal member 14*d* according to a fourth modification.

The metal member 14*d* is different from the metal member 14*a* in the number of lower notches and the number of foot portions. Specifically, in the metal member 14*a*, the plate-shaped portion 140 is provided with four lower notches 144*b* to 144*e*. On the other hand, in the metal member 14*d*, the plate-shaped portion 140 is provided with two lower notches 144*b* and 144*e*. The upper notches 142*a* and 142*b* are disposed between the lower notches 144*b* and 144*e* in the left-right direction when viewed in the front-back direction.

The metal member 14*a* includes five foot portions 146*b* to 146*f*. On the other hand, the metal member 14*d* includes two foot portions 146*b* and 146*f*. The foot portion 146*b* is located on the left of the lower notch 144*b*. The foot portion 146*f* is located on the right of the lower notch 144*e*. Thus, the foot portion is not disposed between the lower notch 144*b* and the lower notch 144*e* in the left-right direction when viewed in the front-back direction. The structure of the other metal member 14*d* is the same as that of the metal member 14*a*, and thus the description thereof will be omitted.

According to the metal member 14*d*, the foot portion is not disposed between the lower notch 144*b* and the lower notch 144*e* in the left-right direction when viewed in the front-back direction. Therefore, when viewed in the front-back direction, the electronic component can be disposed near the plate-shaped portion 140 between the lower notch 144*b* and the lower notch 144*e* in the left-right direction. In addition, since the area of the metal member 14*d* is increased, the shielding property between the electronic component 16*a* and the electronic components 16*b* and 16*c* is improved. Thus, the electronic component 16*a* and the electronic components 16*b* and 16*c* can be brought close to each other.

(Fifth Modification)

Figure 16:
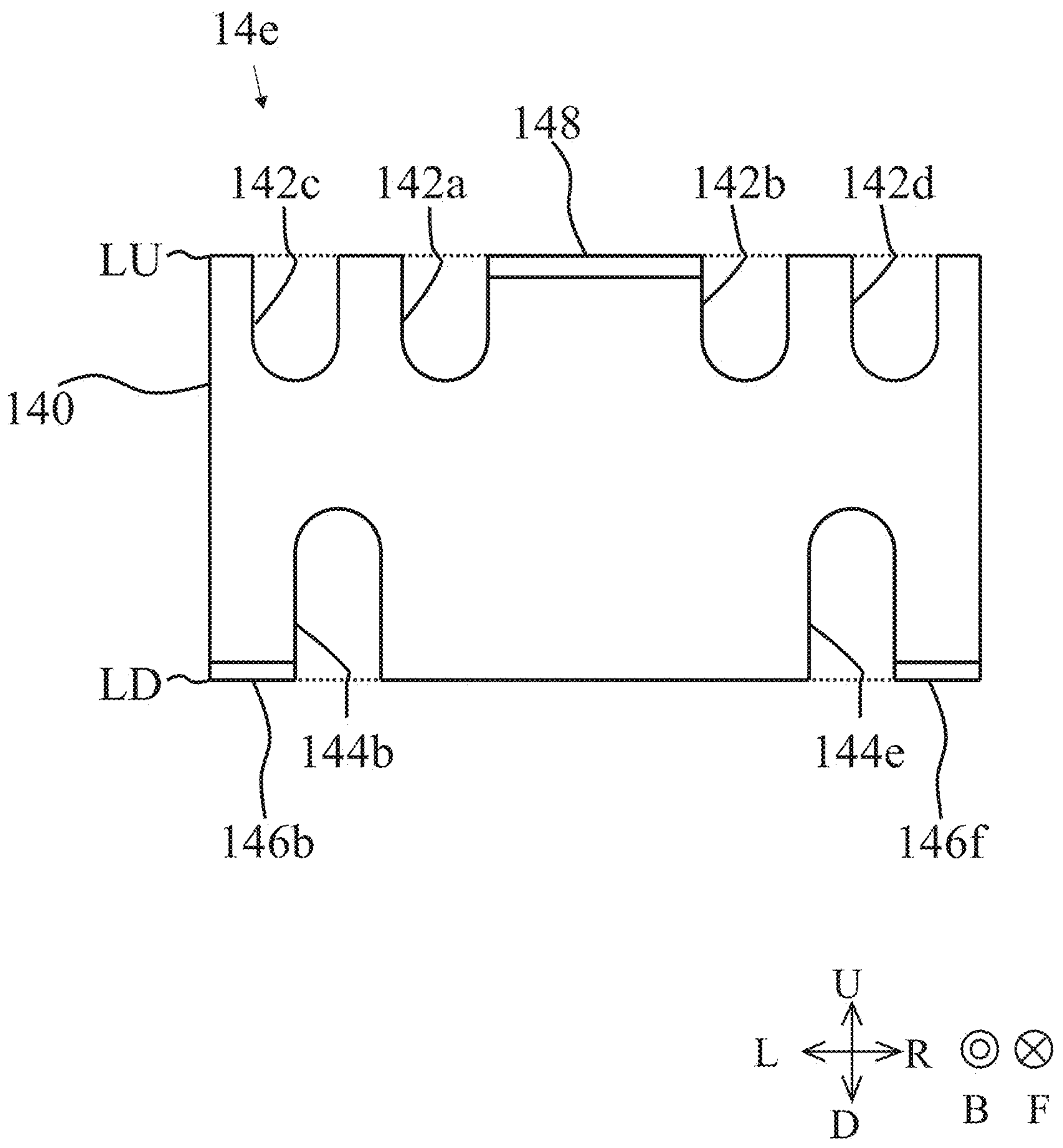
FIG. 16 is a rear view of a metal member 14*e* according to a fifth modification.

Hereinafter, a metal member 14*e* according to a fifth modification will be described with reference to the drawings. FIG. 16 is a rear view of a metal member 14*e* according to a fifth modification.

The metal member 14*e* is different from the metal member 14*d* in the number of upper notches. Specifically, in the metal member 14*d*, the plate-shaped portion 140 is provided with two upper notches 142*a* and 142*b*. On the other hand, in the metal member 14*e*, the plate-shaped portion 140 is provided with four upper notches 142*a* to 142*d*. Since other structures of the metal member 14*e* are the same as those of the metal member 14*d*, the description thereof will be omitted.

(Sixth Modification)

Figure 17:
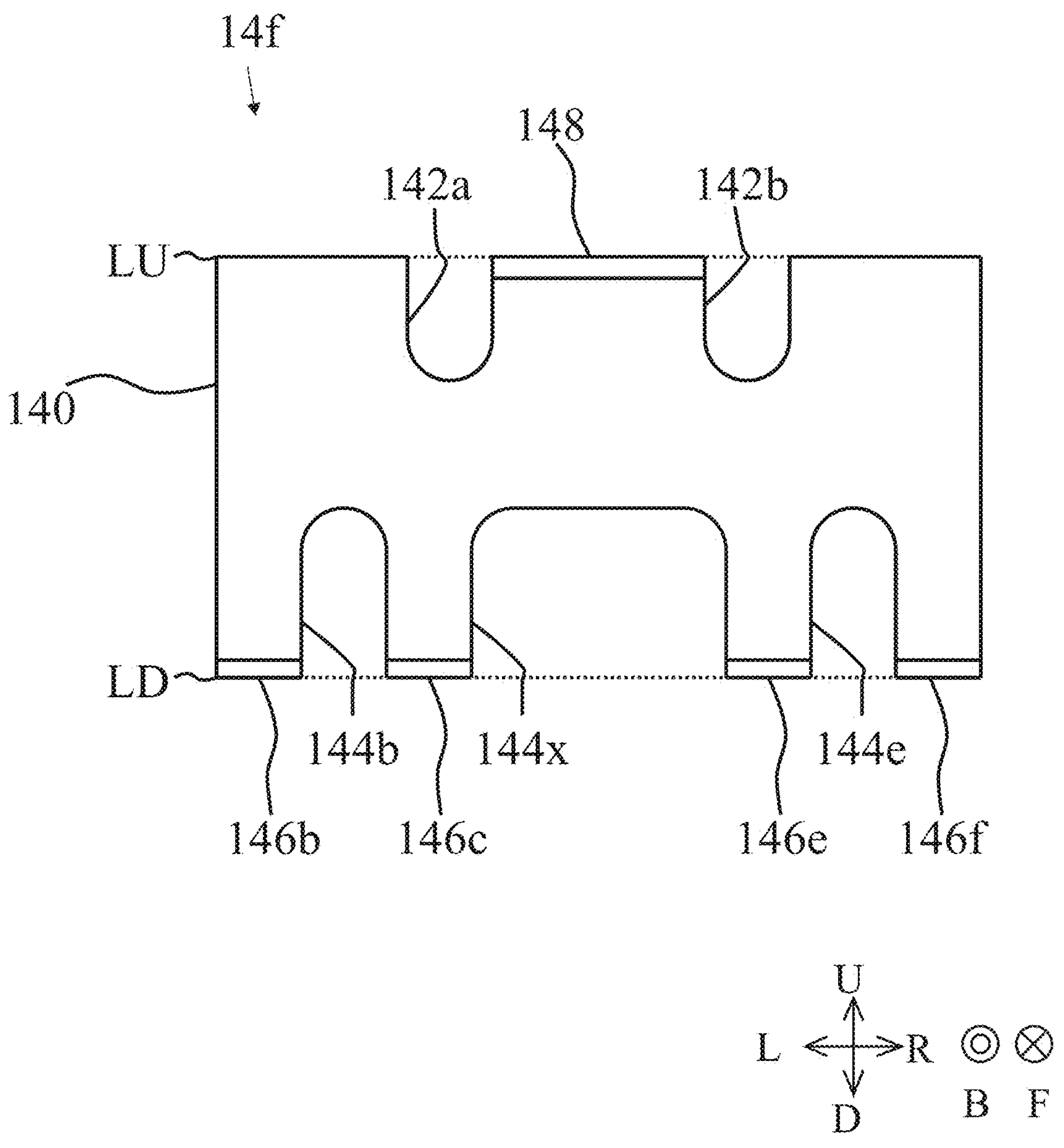
FIG. 17 is a rear view of a metal member 14*f* according to a sixth modification.

Hereinafter, a metal member 14*f* according to a sixth modification will be described with reference to the drawings. FIG. 17 is a rear view of a metal member 14*f* according to a sixth modification.

The metal member 14*f* is different from the metal member 14*a* in that a lower notch 144*x* in which the lower notch 144*c* and the lower notch 144*d* are connected to each other is provided in the plate-shaped portion 140. Therefore, the metal member 14*f* does not include the foot portion 146*d*. In such a structure, the upper notches 142*a* and 142*b* and the lower notches 144*b*, 144*e*, and 144*x* are alternately arranged in the left-right direction. Thus, the upper notches 142*a* and 142*b* and the lower notches 144*b*, 144*e*, and 144*x* are less likely to be aligned in the up-down direction. As a result, the strength of the metal member 14*f* increases. In addition, when the upper notches 142*a* and 142*b* and the lower notches 144*b*, 144*e*, and 144*x* are alternately arranged in the left-right direction, the upper notches 142*a* and 142*b* and the lower notches 144*b*, 144*e*, and 144*x* are uniformly distributed over the entire plate-shaped portion 140. As a result, the molten resin easily passes through the upper notches 142*a* and 142*b* and the lower notches 144*b*, 144*e*, and 144*x*. As a result, the sealing resin layer 18 is easily formed.

(Seventh Modification)

Figure 18:
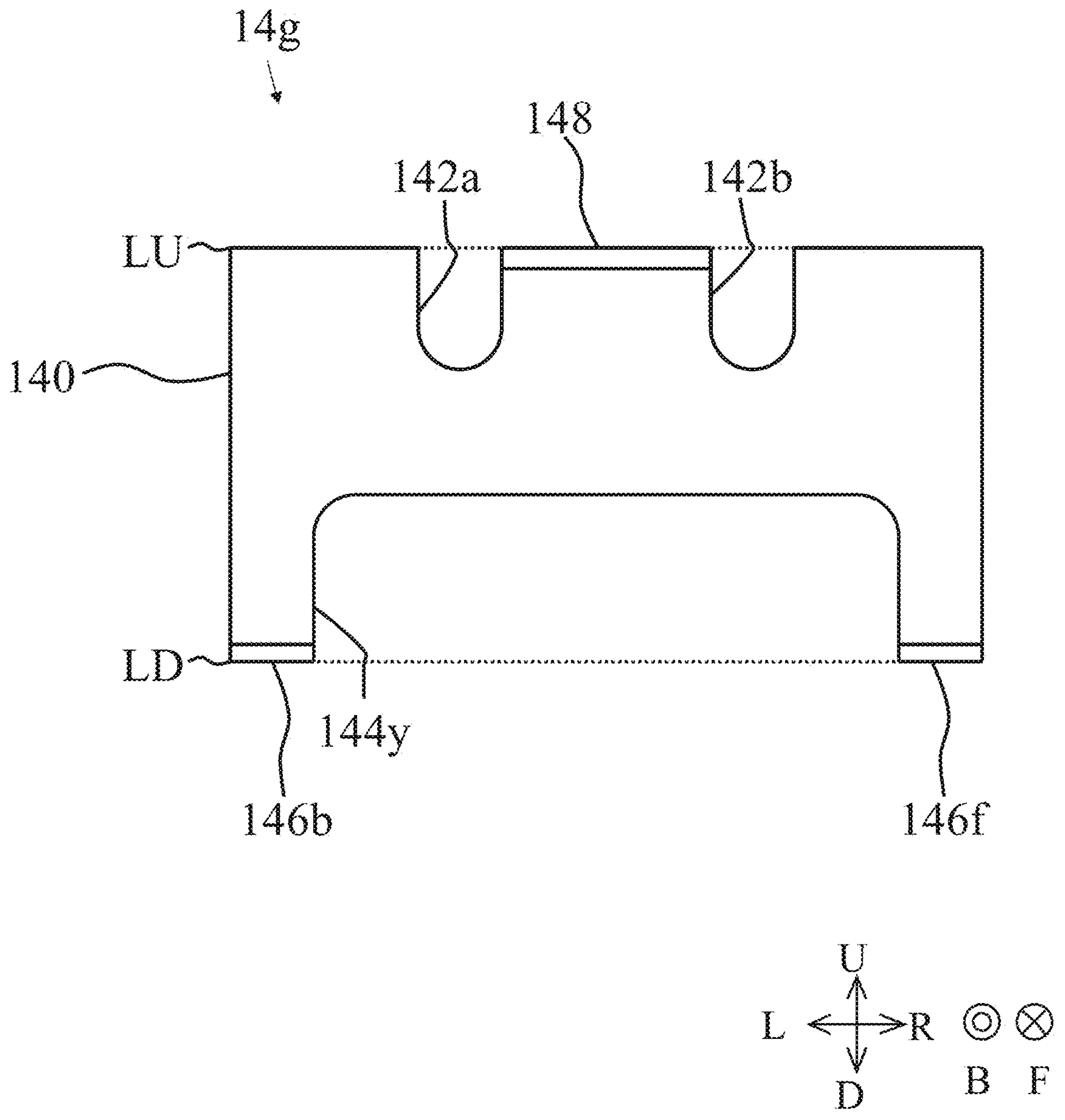
FIG. 18 is a rear view of a metal member 14*g* according to a seventh modification.

Hereinafter, a metal member 14*g* according to a seventh modification will be described with reference to the drawings. FIG. 18 is a rear view of a metal member 14*g* according to a seventh modification.

The metal member 14*g* is different from the metal member 14*a* in that a lower notch 144*y* in which the lower notches 144*b* to 144*e* are connected to one is provided in the plate-shaped portion 140. Therefore, the metal member 14*g* does not include the foot portions 146*c* to 146*e*. The lower notch 144*y* is disposed between the foot portion 146*b* and the foot portion 146*f* in the left-right direction when viewed in the front-back direction.

According to the metal member 14*g*, the lower notch 144*y* is disposed between the foot portion 146*b* and the foot portion 146*f* in the left-right direction when viewed in the front-back direction. Therefore, the width of the lower notch 144*y* in the left-right direction is large. Therefore, the molten resin easily passes through the lower notch 144*y*. As a result, the sealing resin layer 18 is easily formed.

According to the metal member 14*g*, electronic components can be disposed as follows. More specifically, electronic components requiring shielding are disposed near the foot portions 146*b* and 146*f*. The electronic component is disposed so as to pass through the lower notch 144*y* in the front-back direction. That is, the metal member 14 and the electronic component overlap each other when viewed in the up-down direction. Thus, the distance between the metal member 14 and the electronic component can be eliminated.

(Eighth Modification)

Figure 19:
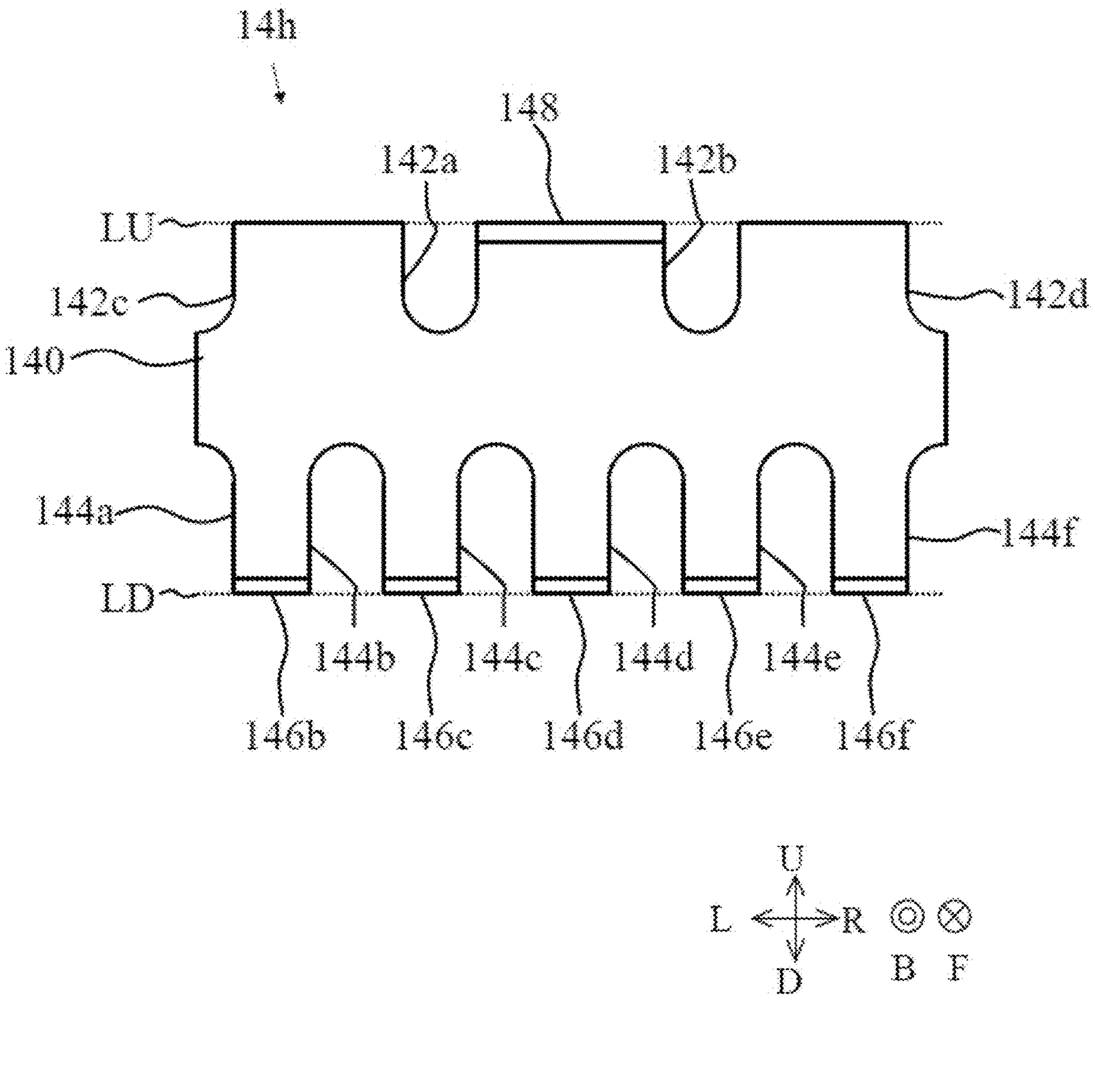
FIG. 19 is a rear view of a metal member 14*h* according to an eighth modification.

Hereinafter, a metal member 14*h* according to an eighth modification will be described with reference to the drawings. FIG. 19 is a rear view of a metal member 14*h* according to an eighth modification.

The metal member 14*h* is different from the metal member 14*b* in the number of upper notches. In the metal member 14*b*, the plate-shaped portion 140 is provided with two upper notches 142*a* and 142*b*. On the other hand, in the metal member 14*h*, the plate-shaped portion 140 is provided with four upper notches 142*a* to 142*d*.

The upper notches 142*a* to 142*d* include the upper notches 142*c* and 142*d* (first upper notches) arranged at the left end portion or the right end portion of the upper side LU when viewed in the front-back direction. The upper notch 142*c* is an L-shaped defect formed by removing the upper left corner of the rectangular plate-shaped portion 140. Therefore, the upper notch 142*c* has the same shape as the right half of the upper notches 142*a* and 142*b*.

The upper notch 142*d* is an L-shaped defect formed by removing the upper right corner of the rectangular plate-shaped portion 140. Therefore, the upper notch 142*d* has the same shape as the left half of the upper notches 142*a* and 142*b*. Since other structures of the metal member 14*h* are the same as those of the metal member 14*b*, the description thereof will be omitted.

In the metal member 14*h*, since the upper notch 142*c* is provided, the length of the left end of the metal member 14*h* in the up-down direction is short. Therefore, when the left surface SL1 of the sealing resin layer 18 is cut, the amount of cutting the metal member 14*h* is reduced. As a result, deterioration of the blade of the dicer is suppressed. In the metal member 14*h*, since the upper notch 142*d* is provided, the length of the right end of the metal member 14*h* in the up-down direction is short. Therefore, when the right surface SR1 of the sealing resin layer 18 is cut, the amount of cutting the metal member 14*h* is reduced. As a result, deterioration of the blade of the dicer is suppressed.

In addition, in the metal member 14*h*, the metal member 14*h* can be suppressed from falling down. More specifically, the metal member 14*h* is provided with the upper notch 142*c* and the lower notch 144*a*. Similarly, the metal member 14*h* is provided with the upper notch 142*d* and the lower notch 144*f*. Thus, the difference between the pressure due to the molten resin received by the upper part of the plate-shaped portion 140 and the pressure due to the molten resin received by the lower part of the plate-shaped portion 140 is reduced. As a result, the metal member 14*h* can be suppressed from falling down.

(Ninth Modification)

Figure 20:
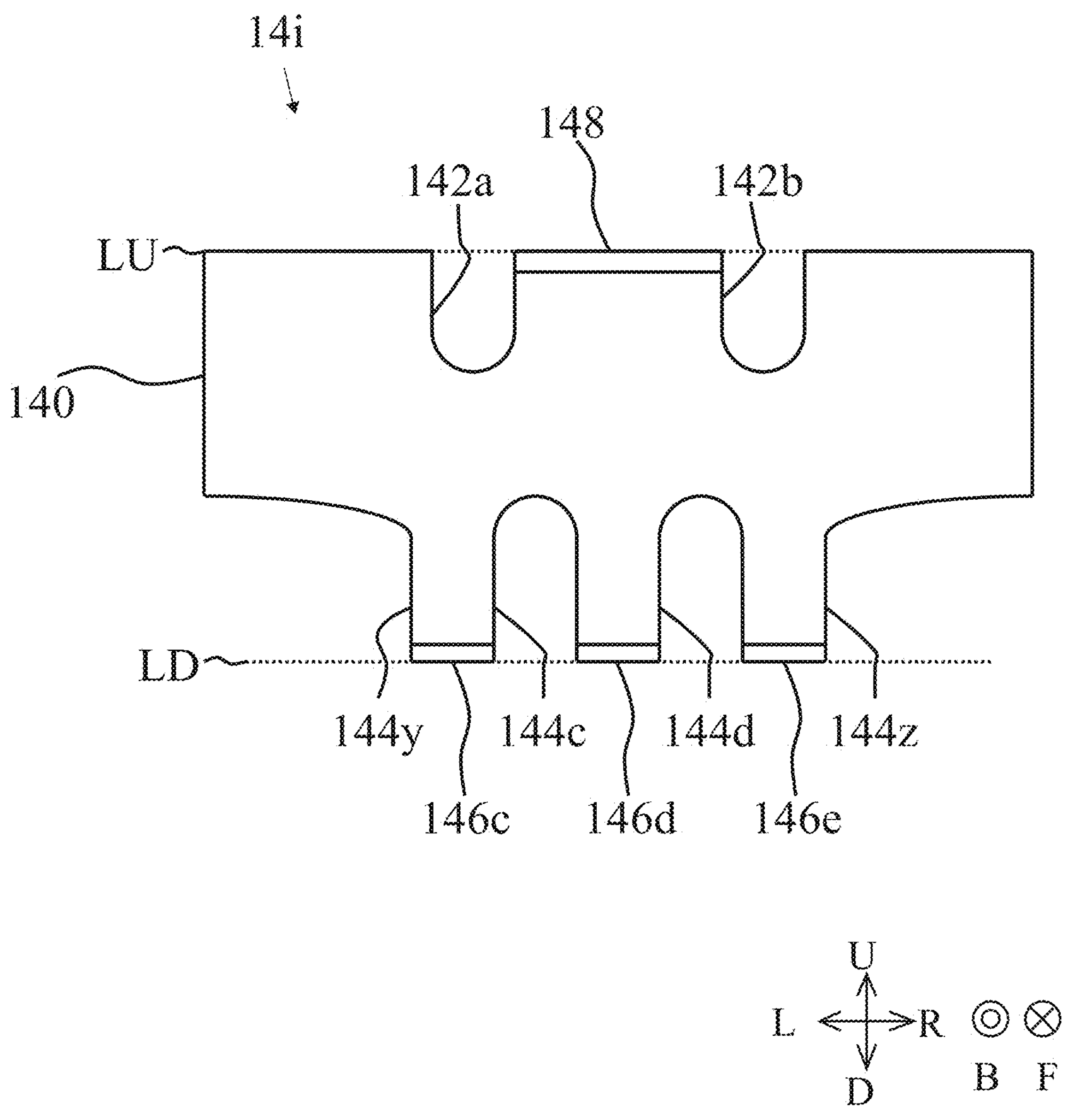
FIG. 20 is a rear view of a metal member 14*i* according to a ninth modification.

Hereinafter, a metal member 14*i* according to a ninth modification will be described with reference to the drawings. FIG. 20 is a rear view of a metal member 14*i* according to a ninth modification.

The metal member 14*i* is different from the metal member 14*b* in that the lower notch 144*y* in which the lower notch 144*a* and the lower notch 144*b* are connected to each other is provided in the plate-shaped portion 140, and a lower notch 144*z* in which the lower notch 144*e* and the lower notch 144*f* are connected to each other is provided in the plate-shaped portion 140. Therefore, the metal member 14*i* does not include the foot portions 146*b* and 146*f*. Therefore, the metal member 14*i* includes three foot portions 146*c*, 146*d*, and 146*e* disposed near the center of the plate-shaped portion 140 in the left-right direction.

(Tenth Modification)

Figure 21:
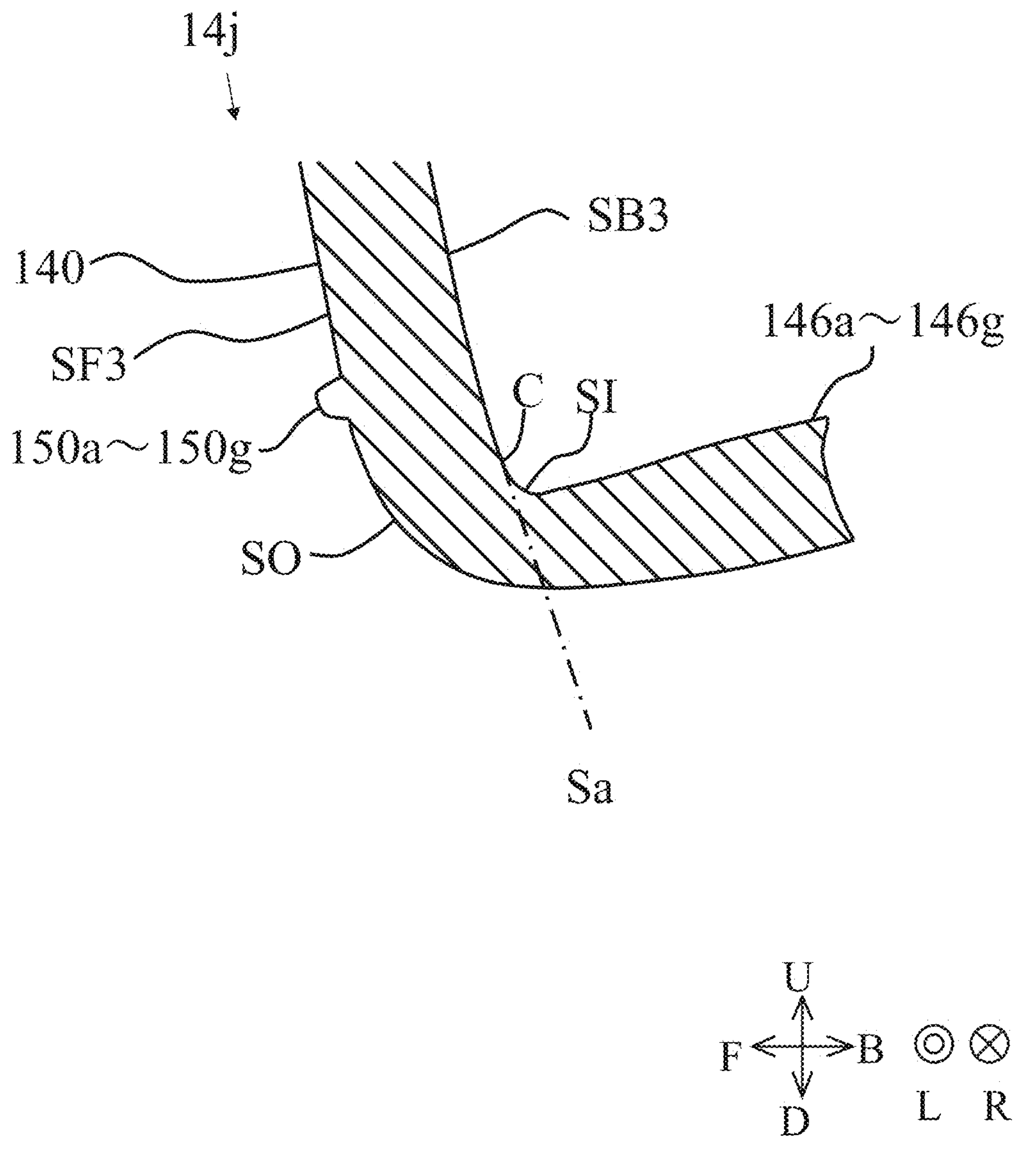
FIG. 21 is a cross-sectional view of foot portions 146*a* to 146*g* of a metal member 14*j* according to a tenth modification.

Hereinafter, a metal member 14*j* according to a tenth modification will be described with reference to the drawings. FIG. 21 is a cross-sectional view of foot portions 146*a* to 146*g* of a metal member 14*j* according to a tenth modification.

The metal member 14*j* is different from the metal member 14 in including protrusions 150*a* to 150*g*. The protrusions 150*a* to 150*g* are provided so as to correspond to the foot portions 146*a* to 146*g*, respectively. The protrusions 150*a* to 150*g* are provided at the upper end of the outer surface SO. The protrusions 150*a* to 150*g* protrude forward from the front main surface SF3 of the plate-shaped portion 140. This prevents the solder from wetting upward too much. The overall structure of the metal member 14*k* is the same as the overall structure of any one of the metal members 14, and 14*a* to 14*i*.

According to the metal member 14*j*, the self-alignment property of the foot portions 146*a* to 146*g* is improved. More specifically, in the metal member 14*j*, the solders 200*a* to 200*g* are less likely to wet upward at the outer surface SO and the back end portions of the foot portions 146*a* to 146*g*. In this case, the foot portions 146*a* to 146*g* are fixed to the mounting electrode 122 only on the lower surfaces Sx of the foot portions 146*a* to 146*g* by the solders 200*a* to 200*g*. In this case, the self-alignment property of the foot portions 146*a* to 146*g* is improved.

(Eleventh Modification)

Figure 22:
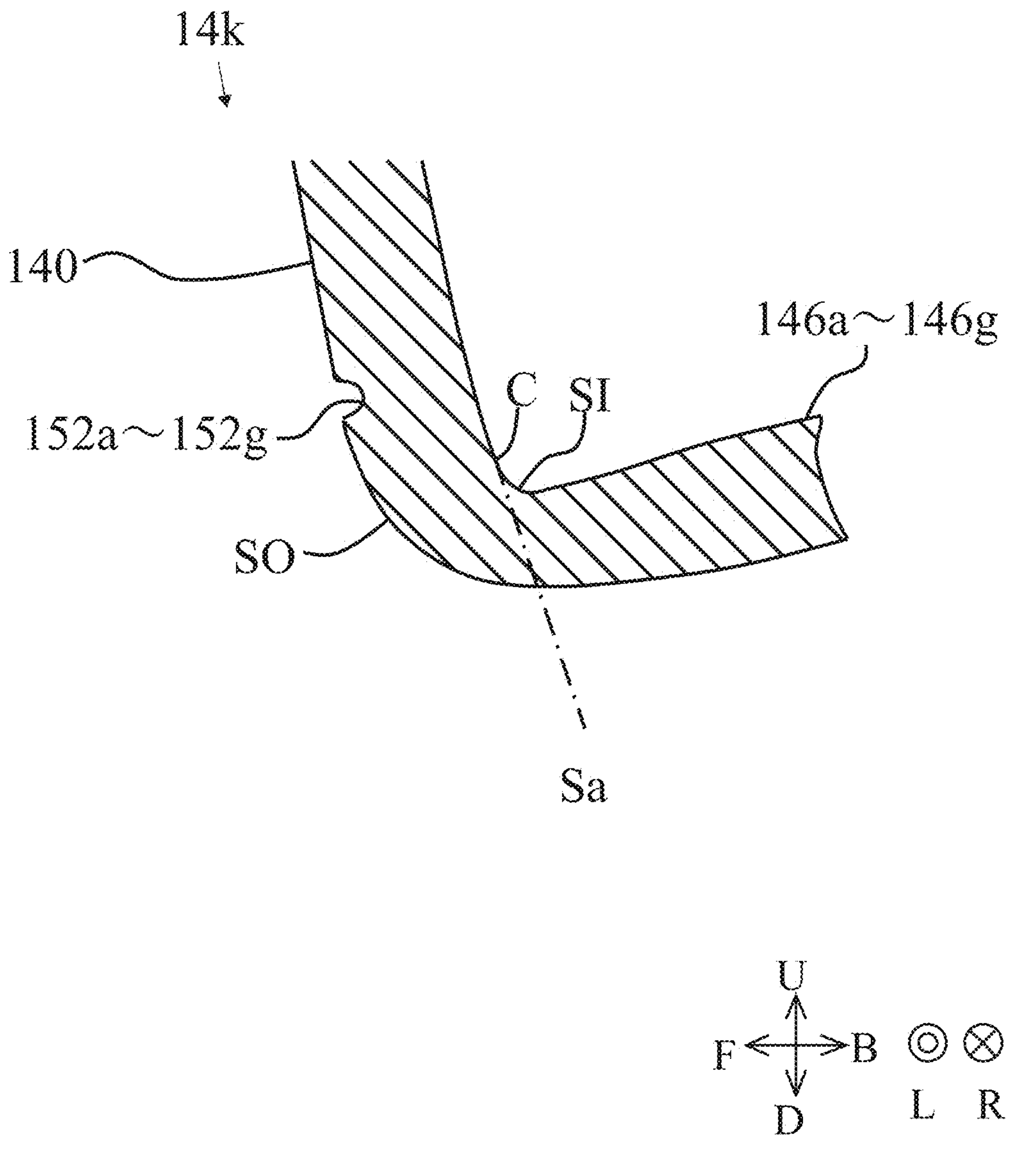
FIG. 22 is a cross-sectional view of the foot portions 146*a* to 146*g* of a metal member 14*k* according to an eleventh modification.

Hereinafter, a metal member 14*k* according to an eleventh modification will be described with reference to the drawings. FIG. 22 is a cross-sectional view of the foot portions 146*a* to 146*g* of a metal member 14*k* according to an eleventh modification.

The metal member 14*k* is different from the metal member 14 in including recesses 152*a* to 152*g*. The recesses 152*a* to 152*g* is provided so as to respectively correspond to the foot portions 146*a* to 146*g*. The recesses 152*a* to 152*g* are provided at the upper end of the outer surface SO. The recesses 152*a* to 152*g* are recessed backward from the front main surface SF3 of the plate-shaped portion 140. This prevents the solder from wetting upward too much. The overall structure of the metal member 14*k* is the same as the overall structure of any one of the metal members 14, and 14*a* to 14*i*.

According to the metal member 14*k*, the self-alignment property of the foot portions 146*a* to 146*g* is improved. More specifically, in the metal member 14*k*, the solders 200*a* to 200*g* are hardly wetted upward on the outer surface SO and the back end portions of the foot portions 146*a* to 146*g*. In this case, the foot portions 146*a* to 146*g* are fixed to the mounting electrode 122 only on the lower surfaces Sx of the foot portions 146*a* to 146*g* by the solders 200*a* to 200*g*. In this case, the self-alignment property of the foot portions 146*a* to 146*g* is improved.

(Twelfth Modification)

Figure 23:
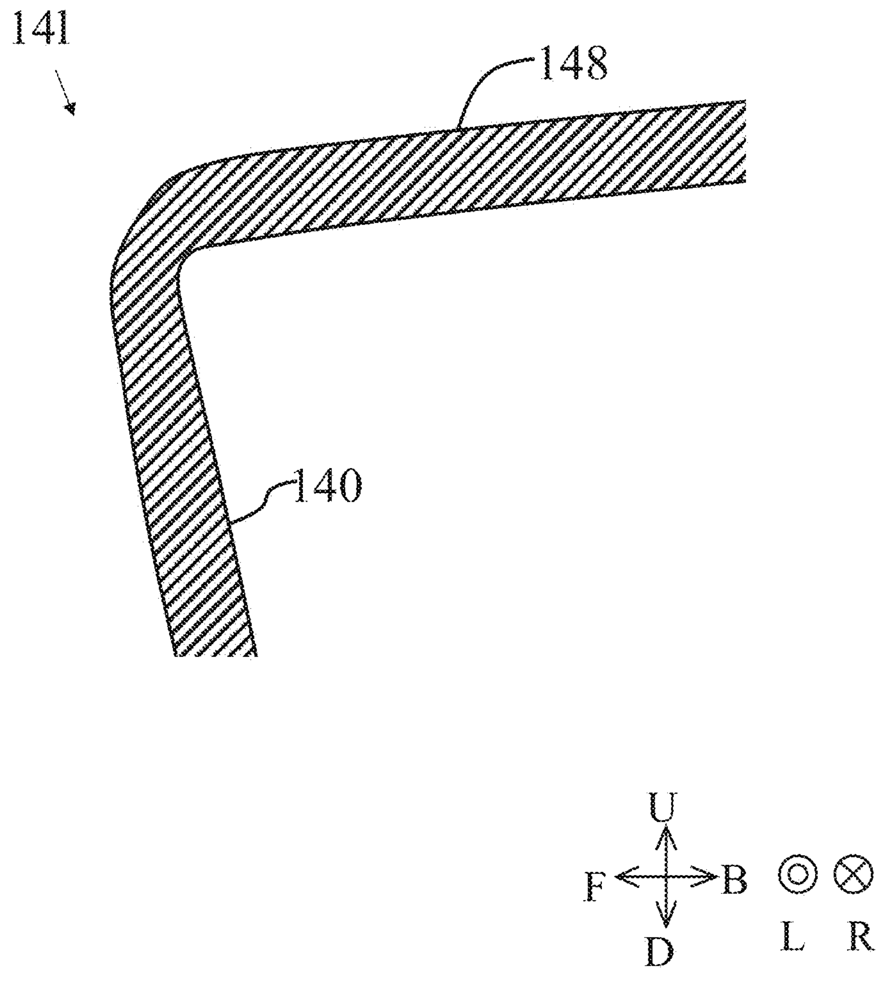
FIG. 23 is a cross-sectional view at the center in the left-right direction of a top surface portion 148 of a metal member 14*l* according to a twelfth modification.
Figure 24:
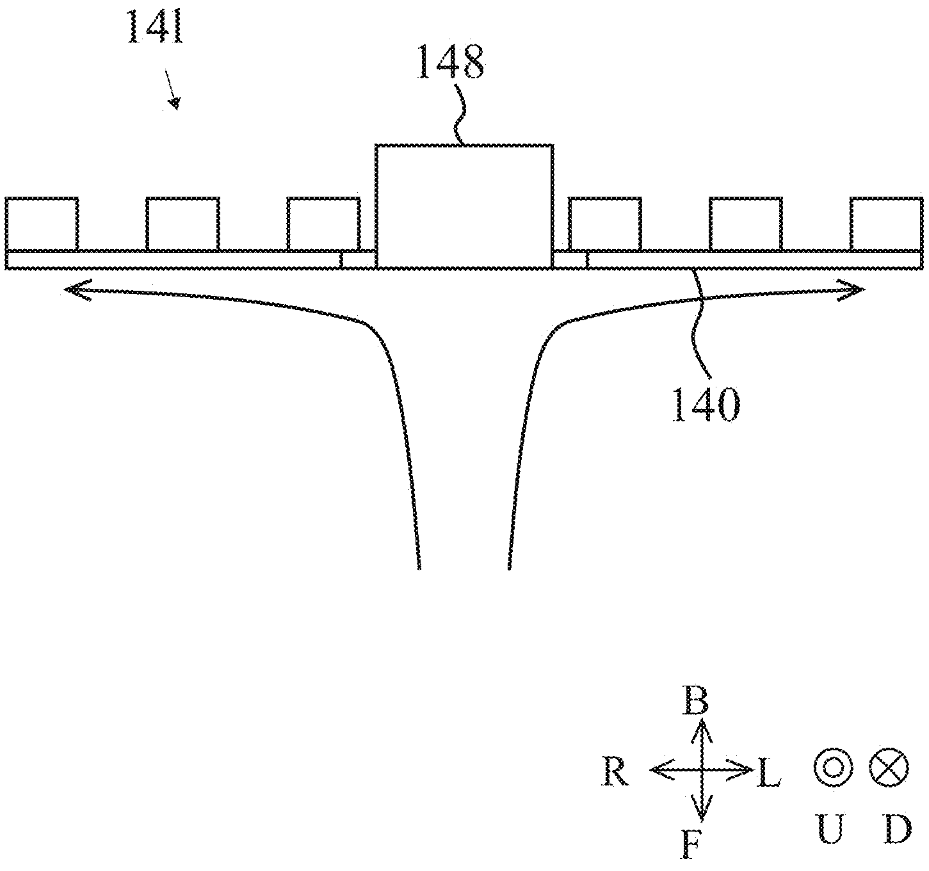
FIG. 24 is a top view of the metal member 14*l* according to the twelfth modification.

Hereinafter, a metal member 14*l* according to a twelfth modification will be described with reference to the drawings. FIG. 23 is a cross-sectional view at the center in the left-right direction of a top surface portion 148 of a metal member 14*l* according to a twelfth modification. FIG. 24 is a top view of the metal member 14*l* according to the twelfth modification.

The top surface portion 148 is formed by bending a part of the metal member 14*l* in the rear direction. At this time, the thickness of the portion where the metal member 14*l* is bent is thinner than the thickness of the plate-shaped portion 140. This facilitates grinding of the top surface portion 148. When the thickness of the portion where the metal member 14*l* is bent is reduced, the top surface portion 148 is easily displaced with respect to the plate-shaped portion 140. Therefore, when the metal member 14*l* is mounted on the substrate 12, the impact transmitted from the substrate 12 to the metal member 14*l* is absorbed by the top surface portion 148.

The thickness of the portion where the metal member 14*l* is bent is thinner than the thickness of the plate-shaped portion 140. In other words, the thickness of the plate-shaped portion 140 is increased by the thickness of the portion where the metal member 14*l* is bent being reduced. Therefore, as illustrated in FIG. 24, the molten resin flowing to the front main surface SF3 of the plate-shaped portion 140 flows in the left direction or the right direction. That is, the molten resin flows toward the left end and the right end of the plate-shaped portion 140.

(Thirteenth Modification)

Figure 25:
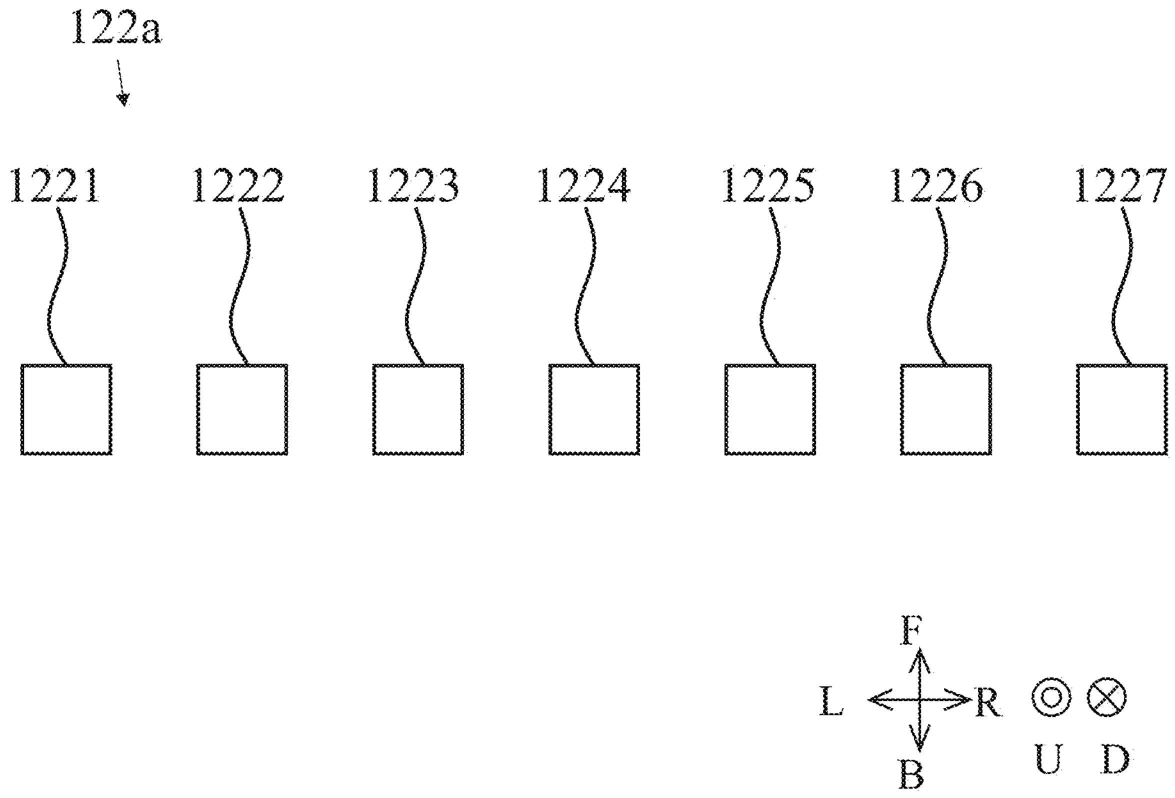
FIG. 25 is a top view of a mounting electrode 122*a*.

Hereinafter, a mounting electrode 122*a* according to a thirteenth modification will be described with reference to the drawings. FIG. 25 is a top view of a mounting electrode 122*a*.

The mounting electrode 122*a* is different from the mounting electrode 122 in including seven small electrodes 1221 to 1227. Each of the foot portions 146*a* to 146*g* of the metal member 14 is fixed to the small electrodes 1221 to 1227 with the solders 200*a* to 200*g*. However, some of the foot portions 146*a* to 146*g* may be fixed to some of the small electrodes 1221 to 1227 by the solders 200*a* to 200*g*. As described above, since the mounting electrode 122*a* is divided into the seven small electrodes 1221 to 1227, the self-alignment property of the foot portions 146*a* to 146*g* is improved.

Further, since the mounting electrode 122*a* is divided into seven small electrodes 1221 to 1227, the solders 200*a* to 200*g* do not exist between the small electrodes 1221 to 1227. Therefore, according to the mounting electrode 122*a*, the solders 200*a* to 200*g* for fixing the metal member 14 may be reduced. In addition, since the area of the mounting electrode 122*a* is reduced, the degree of freedom in designing the substrate 12 is increased. In addition, in a case where there is an unnecessary small electrode in the small electrodes 1221 to 1227, the unnecessary small electrode may be removed. In this case, it is possible to dispose the electronic component near the region from which the unnecessary small electrode is removed. That is, the degree of freedom in arrangement of the electronic components is increased.

(Fourteenth Modification)

Figure 26:
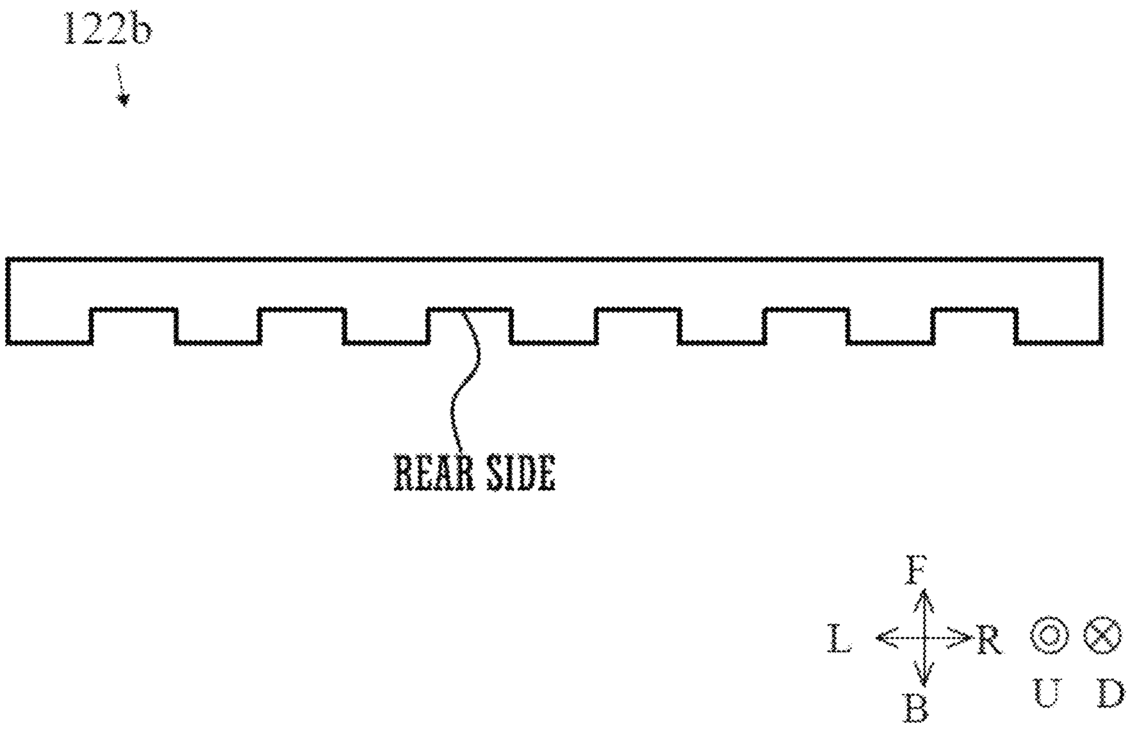
FIG. 26 is a top view of a mounting electrode 122*b*.

Hereinafter, a mounting electrode 122*b* according to a fourteenth modification will be described with reference to the drawings. FIG. 26 is a top view of a mounting electrode 122*b*.

The mounting electrode 122*b* is different from the mounting electrode 122 in the shape of the rear side. The mounting electrode 122 has a rectangular shape when viewed in the up-down direction. Therefore, the rear side of the mounting electrode 122 is a straight line. On the other hand, the rear side of the mounting electrode 122*b* has a zigzag shape. Thus, the mounting electrode 122*b* has the same shape as the metal member 14 when viewed in the up-down direction. Therefore, the lower end of the plate-shaped portion 140 of the metal member and the foot portions 146*a* to 146*g* are fixed to the mounting electrode 122*b* by the solders 200*a* to 200*g*. In addition, since the area of the mounting electrode 122*b* is large, the solders 200*a* to 200*g* on the mounting electrode 122*b* are located on the front, back, left, and right of the foot portions 146*a* to 146*g*. Thus, the solders 200*a* to 200*g* are easily wetted upward on the side surfaces of the foot portions 146*a* to 146*g*.

(Fifteenth Modification)

Figure 27:
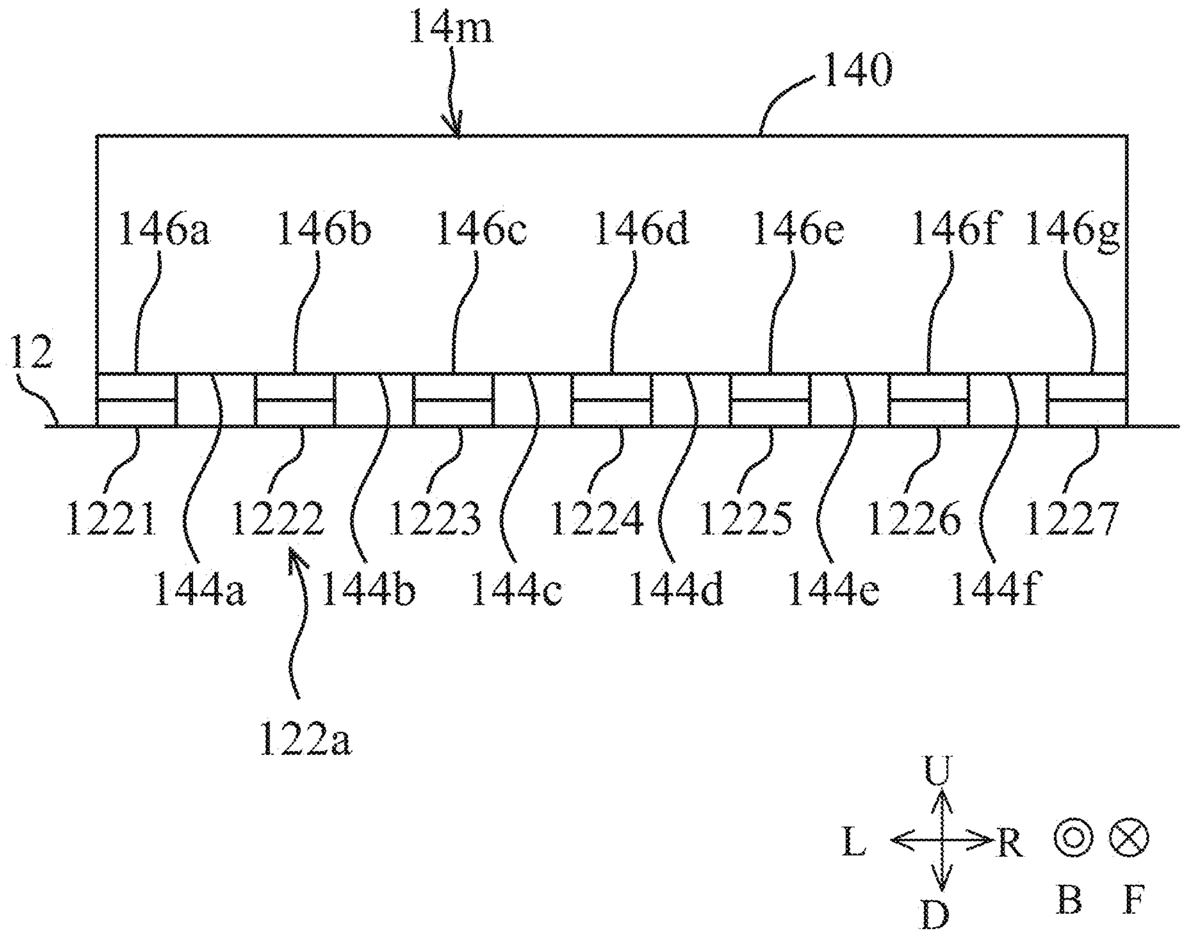
FIG. 27 is a rear view of a metal member 14*m* and the mounting electrode 122*a*.

Hereinafter, a metal member 14*m* according to a fifteenth modification will be described with reference to the drawings. FIG. 27 is a rear view of a metal member 14*m* and the mounting electrode 122*a*.

The metal member 14*m* is different from the metal member 14 in the length of the lower notches 144*a* to 144*f* in the up-down direction. More specifically, in the metal member 14*m*, the lengths of the lower notches 144*a* to 144*f* in the up-down direction are about the thicknesses of the foot portions 146*a* to 146*g*. In this manner, the lower notches 144*a* to 144*f* may be formed using the thicknesses of the foot portions 146*a* to 146*g*. In this case, each of the foot portions 146*a* to 146*g* is fixed to the small electrodes 1221 to 1227 of the mounting electrode 122*a* by the solders 200*a* to 200*g*. When the thickness of the small electrodes 1221 to 1227 of the mounting electrode 122*a* increases, it can be considered that the lengths of the lower notches 144*a* to 144*f* in the up-down direction are enlarged. As a result, the sealing resin layer 18 is easily formed.

(Modification of Module 10)

Figure 32:
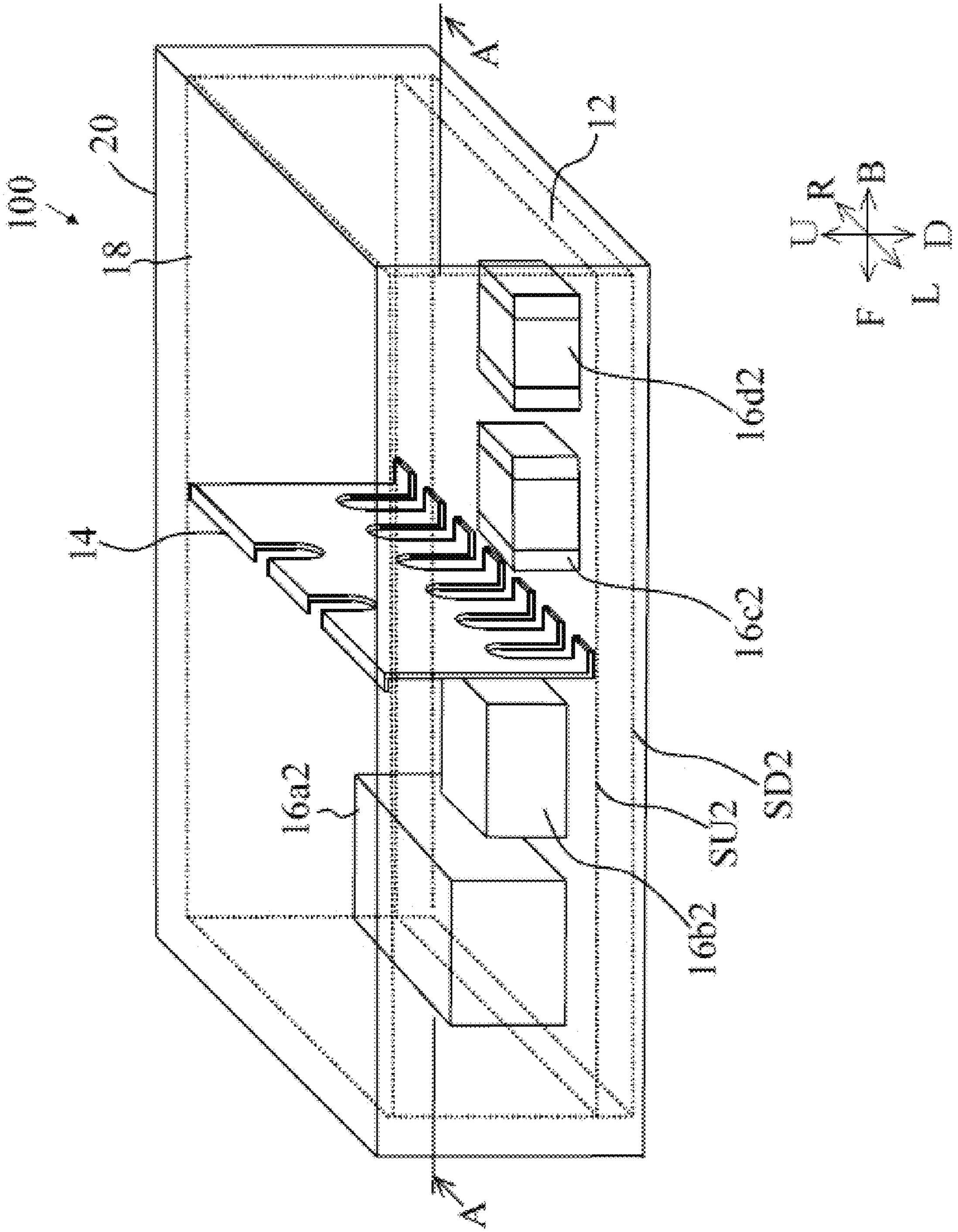
FIG. 32 is an external perspective view of the module 100.
Figure 33:
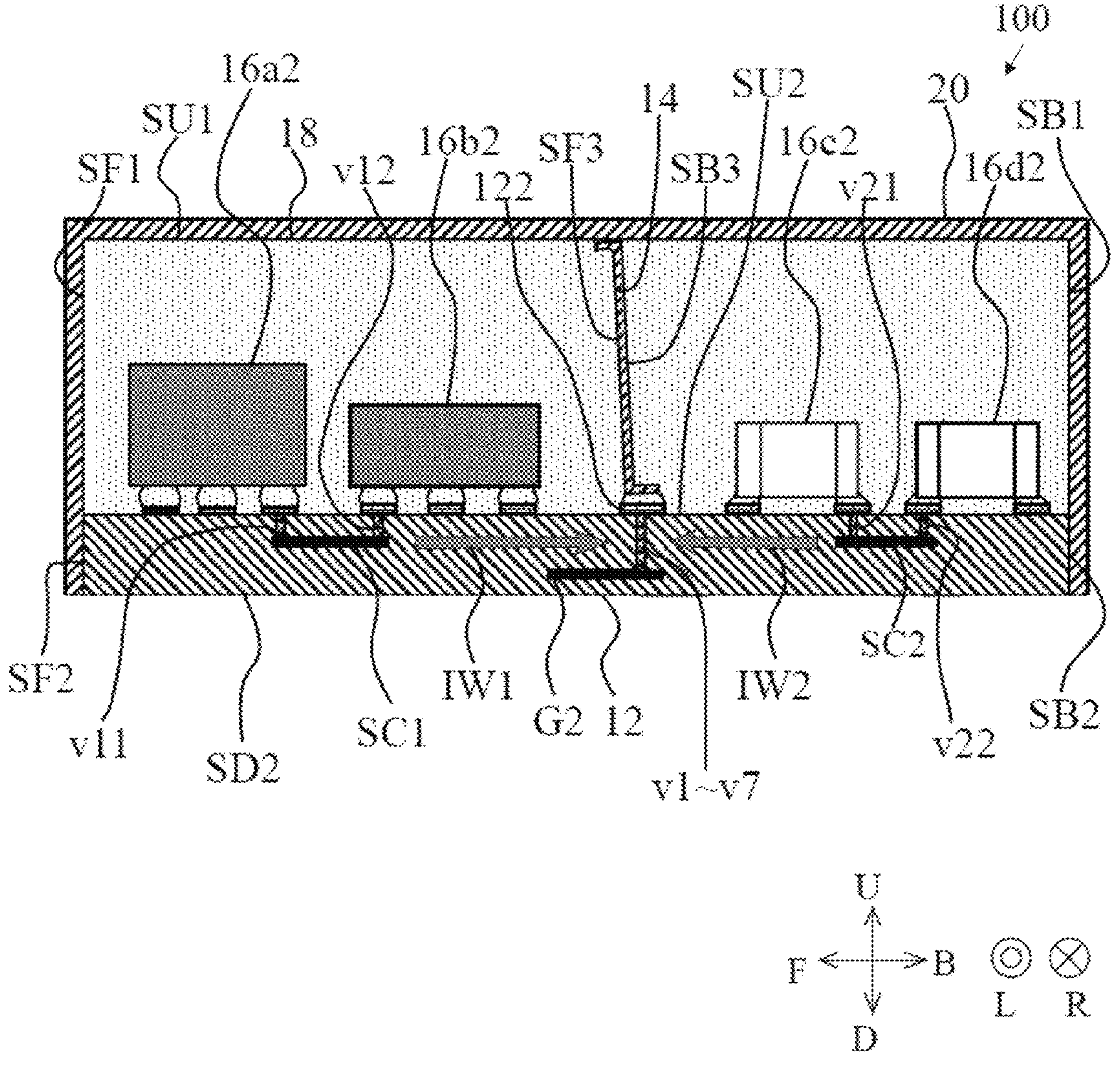
FIG. 33 is a cross-sectional view of a module 100 taken along line A-A.
Figure 34:
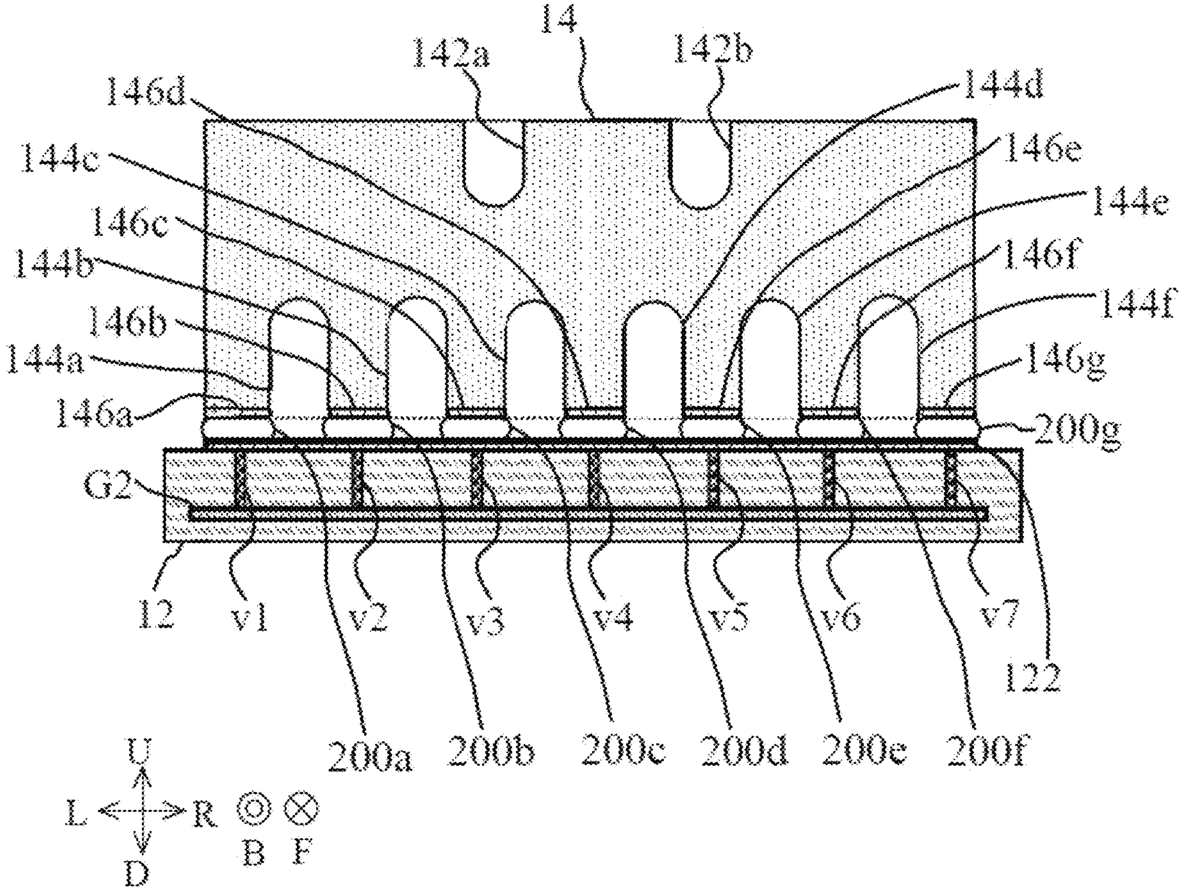
FIG. 34 is a view of the metal member 14 connected to a ground conductor layer G2 via a mounting electrode 122 in the module 100.

Hereinafter, a module 100 according to a modification of the module 10 will be described with reference to the drawings. FIG. 32 is an external perspective view of the module 100. FIG. 33 is a cross-sectional view of a module 100 taken along line A-A. FIG. 34 is a view of the metal member 14 connected to a ground conductor layer G2 via the mounting electrode 122. In the module 100, the same components as those of the module 10 illustrated in FIG. 1 are denoted by the same reference numerals, and description thereof is omitted.

The module 100 differs from module 10 in that the arrangement of electronic components is different. Specifically, as illustrated in FIG. 32, the module 100 includes four electronic components (electronic components 16*a*2 to 16*d*2). As illustrated in FIG. 33, the electronic components 16*a*2 to 16*d*2 are arranged in the front-back direction. As illustrated in FIGS. 32 and 33, the electronic components 16*a*2 and 16*b*2 are located in front of the metal member 14. The electronic component 16*a*2 and the electronic component 16*b*2 are electrically connected to each other. Specifically, as illustrated in FIG. 33, the electronic component 16*a*2 is connected to a signal conductor layer SC1 through a via v11. The electronic component 16*b*2 is connected to the signal conductor layer SC1 through a via v12. As described above, the electronic component 16*a*2 and the electronic component 16*b*2 are electrically connected via the signal conductor layer SC1.

As illustrated in FIGS. 32 and 33, electronic components 16*c*2 and 16*d*2 are located behind the metal member 14. The electronic component 16*c*2 and the electronic component 16*d*2 are electrically connected to each other. Specifically, as illustrated in FIG. 33, the electronic component 16*c*2 is connected to a signal conductor layer SC2 through a via v21. The electronic component 16*b*2 is connected to the signal conductor layer SC2 through a via v22. As described above, the electronic component 16*c*2 and the electronic component 16*d*2 are electrically connected via the signal conductor layer SC2.

In the module 100, the metal member 14 is connected to the ground conductor layer G2 via the mounting electrode 122 as illustrated in FIGS. 33 and 34. More specifically, as illustrated in FIG. 34, the respective foot portions 146*a* to 146*g* of the metal member 14 are fixed to the mounting electrode 122 by the solders 200*a* to 200*g*. The mounting electrode 122 is electrically connected to the ground conductor layer G2 by vias v1 to v7. The vias v1 to v7 are provided in the substrate 12. As described above, the metal member 14 is connected to the ground conductor layer G2 via the solders 200*a* to 200*g*, the mounting electrode 122, and the vias v1 to v7.

As illustrated in FIG. 34, the vias v1 to v7 are provided at equal intervals in the left-right direction. The interval between the adjacent vias v1 to v7 is, for example, ½ or ¼ of the wavelength of a signal transmitted through a signal conductor layer (not illustrated) of the substrate 12. Further, the vias v1 to v7 are connected to the ground conductor layer G2. In this case, the vias v1 to v7 can shield a signal propagating in the substrate 12. Specifically, in a case where the vias v1 to v7 are installed at an interval of ½ or ¼ of the wavelength of the signal, the vias v1 to v7 are located in a portion to be a node in a composite wave (that is, a stationary wave) of the incident wave of the signal and the reflected wave of the signal. Thus, a stationary wave with respect to the input signal is less likely to be generated in the substrate 12. As a result, signals propagating in the substrate 12 can be shielded by the vias v1 to v7.

Hereinafter, the shielding property of the metal member 14 provided with the vias v1 to v7 will be described in detail. In the module 100, for example, as illustrated in FIG. 33, there is a possibility that an interference wave IW1 is generated from the signal conductor layer SC1. At this time, as illustrated in FIG. 33, there is a possibility that the interference wave IW1 generated from the signal conductor layer SC1 travels backward.

When the vias v1 to v7 are not provided under the metal member 14, there is a possibility that the interference wave IW1 passes under the metal member 14.

On the other hand, when the vias v1 to v7 are provided under the metal member 14, the interference wave IW1 is shielded by the vias v1 to v7 as illustrated in FIG. 33. Therefore, there is a low possibility that the interference wave IW1 passes under the metal member 14.

Similarly, as illustrated in FIG. 33, there is a possibility that an interference wave IW2 is generated from the signal conductor layer SC2. At this time, as illustrated in FIG. 33, in a case where vias v1 to v7 are provided under the metal member 14, the interference wave IW2 is shielded by the vias v1 to v7. Therefore, there is a low possibility that the interference wave IW2 passes under the metal member 14.

The vias included in the module 100 are not limited to the vias v1 to v7, and can be changed within the scope of the gist. Specifically, the structure of the via may be changed according to the shape of the metal member 14 and the shape of the mounting electrode 122. For example, distances between ground contact surfaces (surfaces in contact with the solders 200*a* to 200*g*) of the foot portions 146*a* to 146*g* and the vias v1 to v7 may be reduced. Thus, the distance between the ground conductor layer G2 and the ground plane in the foot portions 146*a* to 146*g* is shortened. In this case, the characteristic impedance of the module 100 decreases. Therefore, the noise generated in the module 100 is easily guided to the ground conductor layer G2. The method of making the distances between the ground contact surfaces of the foot portions 146*a* to 146*g* and the vias v1 to v7 close to each other is, for example, a method of reducing the thicknesses of the solders 200*a* to 200*g*.

The number of vias included in the module 100 is not limited to 7.

The vias v1 to v7 are not necessarily arranged at equal intervals.

(Sixteenth Modification)

Figure 35:
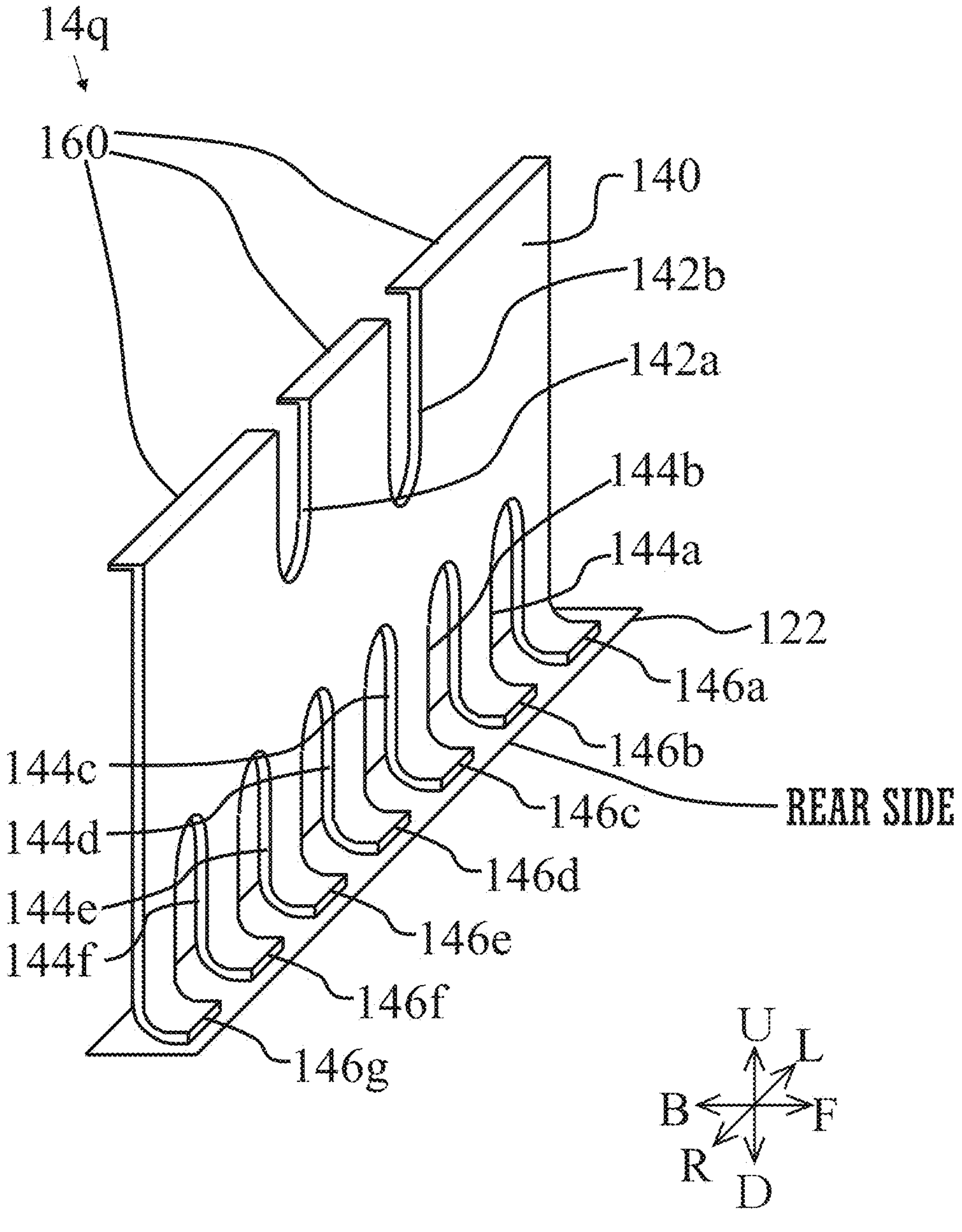
FIG. 35 is a perspective view of a metal member 14*q*.

Hereinafter, a metal member 14*q* according to a sixteenth modification will be described with reference to the drawings. FIG. 35 is a perspective view of a metal member 14*q*.

The metal member 14*q* is different from the metal member 14 in that the foot portions 146*a* to 146*g* extend forward from the lower side LD of the plate-shaped portion 140. The metal member 14*q* is different from the metal member 14 in that the upper protruding portion 160 extends backward. Since other structures of the metal member 14*n* are the same as those of the metal member 14, the description thereof will be omitted.

(Seventeenth Modification)

Figure 36:
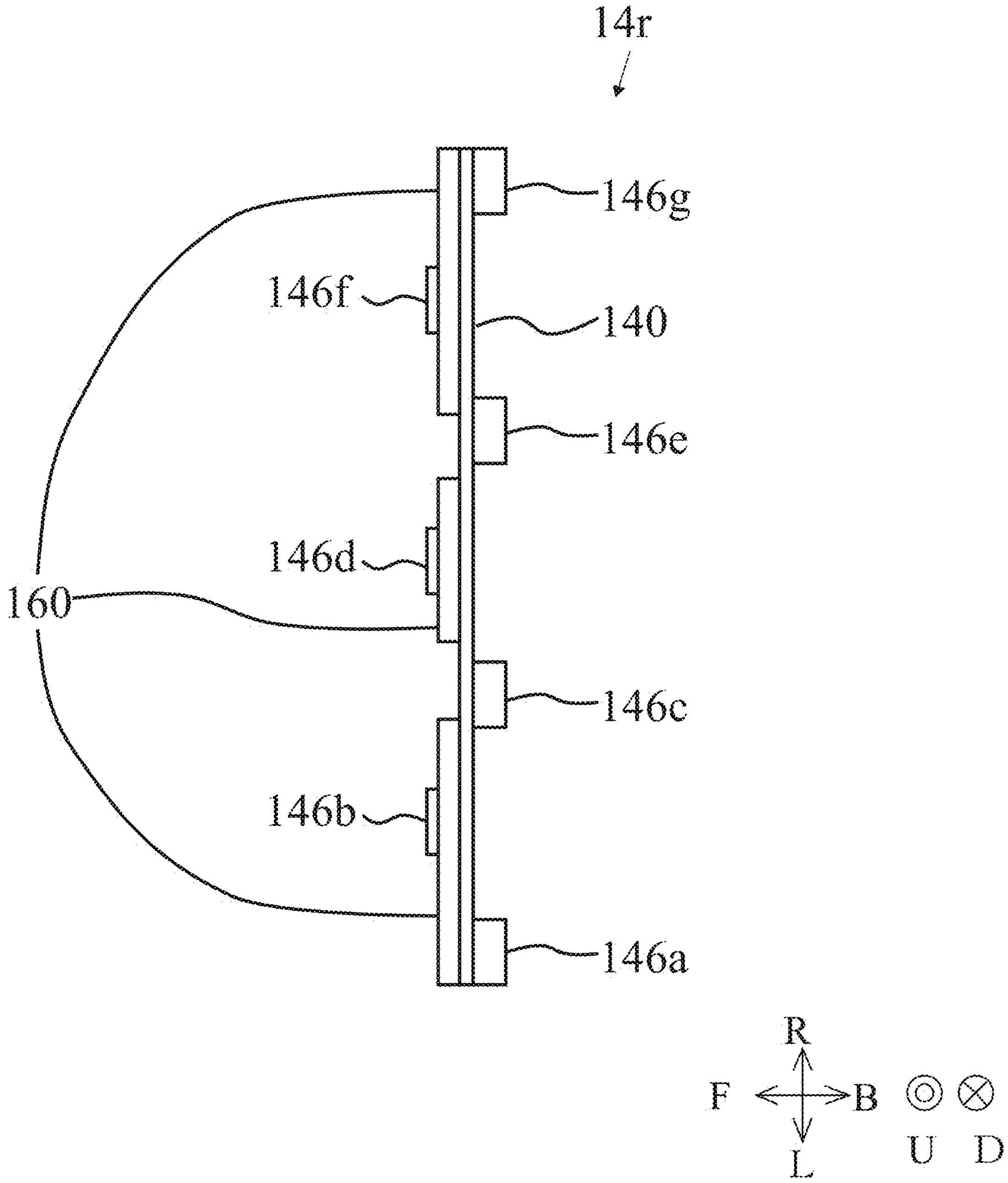
FIG. 36 is a top view of a metal member 14*r*.

Hereinafter, a metal member 14*r* according to a seventeenth modification will be described with reference to the drawings. FIG. 36 is a top view of a metal member 14*r*.

The metal member 14*r* is different from the metal member 14 in that the foot portions 146*a*, 146*c*, 146*e*, and 146*g* extend backward from the lower side LD of the plate-shaped portion 140, and the foot portions 146*b*, 146*d*, and 146*f* extend forward from the lower side LD of the plate-shaped portion 140. Since other structures of the metal member 14*n* are the same as those of the metal member 14, the description thereof will be omitted.

(Eighteenth Modification)

Figure 37:
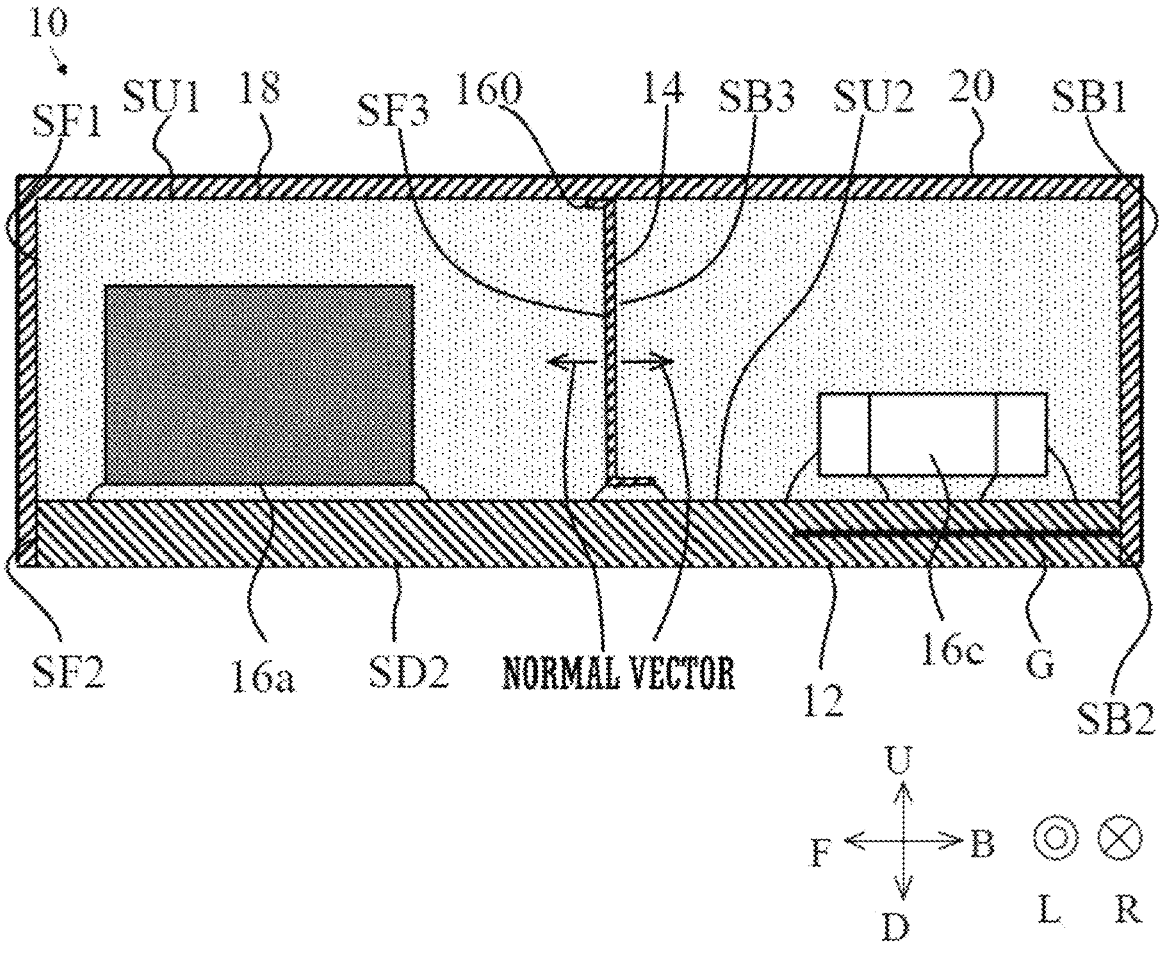
FIG. 37 is a cross-sectional view of a module 10 according to an eighteenth modification.

Hereinafter, a module 10 according to an eighteenth modification will be described with reference to the drawings. FIG. 37 is a cross-sectional view of a module 10 according to an eighteenth modification.

In the module 10 according to the eighteenth modification, the metal member 14 is not inclined in the front-back direction. That is, the normal vector of the front main surface SF3 of the plate-shaped portion 140 is parallel to the front-back direction. The normal vector of the back main surface SB3 of the plate-shaped portion 140 is parallel to the front-back direction.

Other Embodiments

The module according to the present disclosure is not limited to the module 10 according to the above embodiment, and can be changed within the scope of the gist of the present disclosure.

Figure 28:
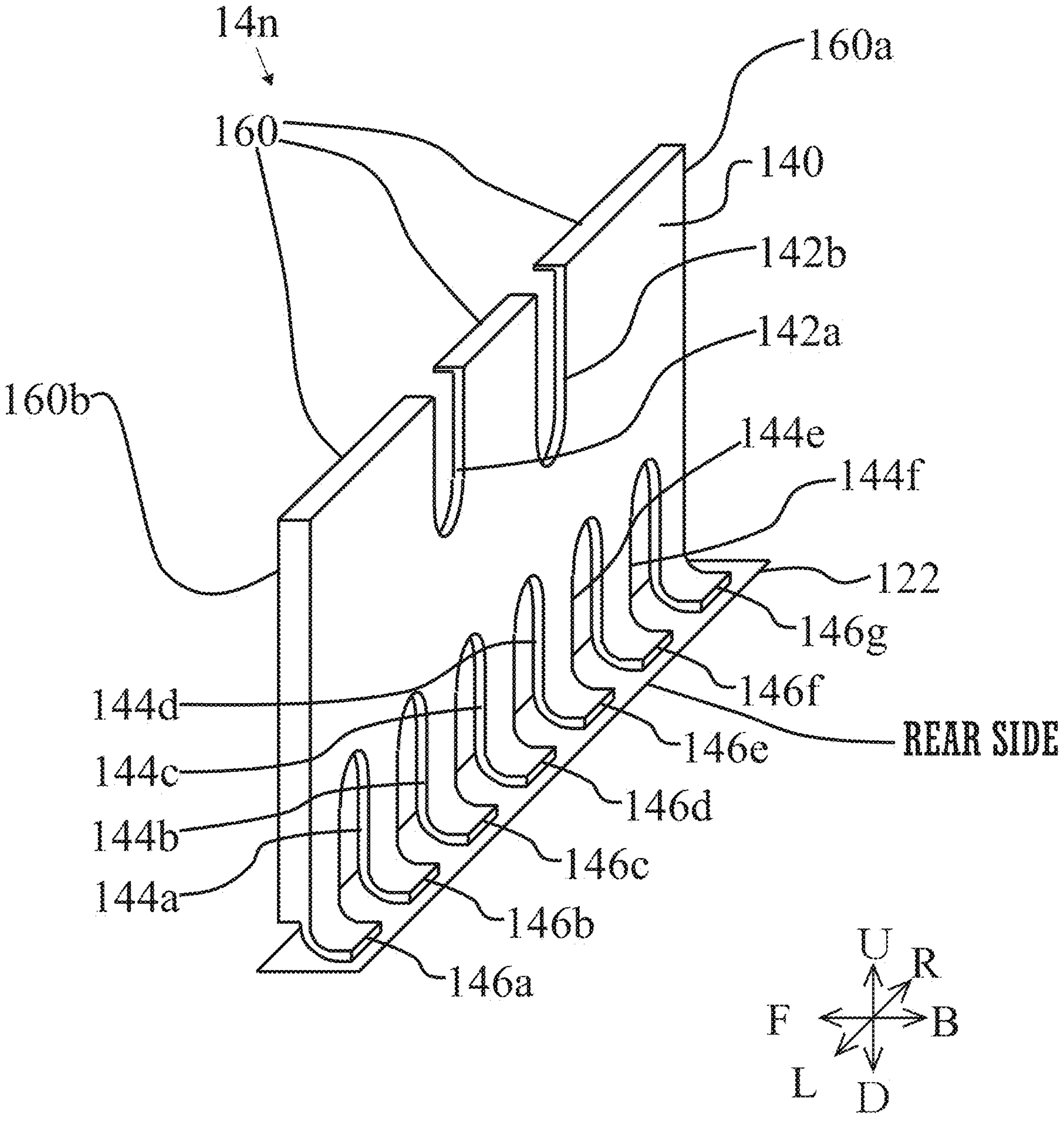
FIG. 28 is a perspective view of a metal member 14*n* including a right protruding portion 160*a* and a left protruding portion 160*b*.
Figure 29:
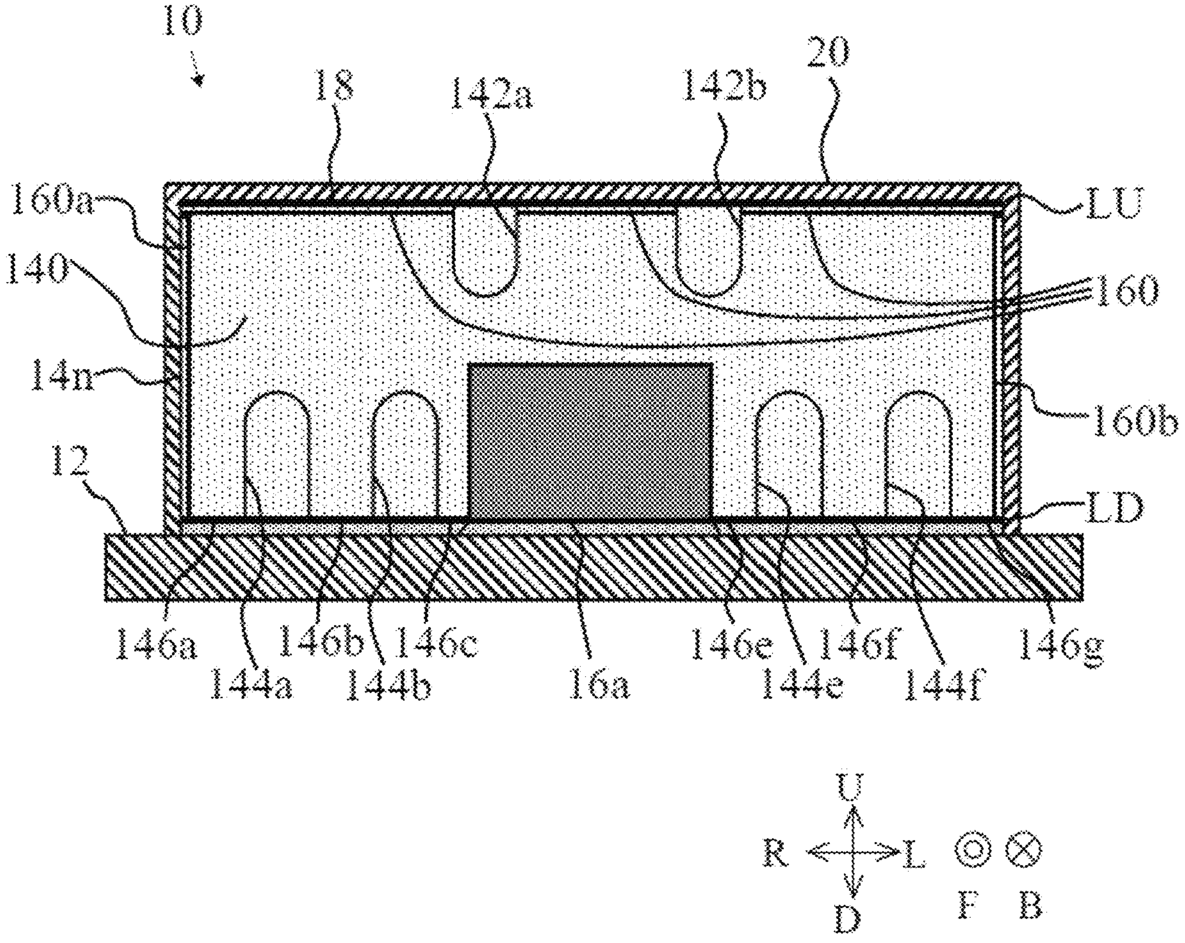
FIG. 29 is a cross-sectional view of the module 10 taken along line B-B including the metal member 14*n*.

The metal member 14 may further include at least one of a right protruding portion 160*a* extending in one direction from the right end of the plate-shaped portion 140 in the front-back direction and a left protruding portion 160*b* extending in one direction from the left end of the plate-shaped portion 140 in the front-back direction. As a result, the shielding property of the metal member 14 with respect to the electronic component mounted in the direction in which the right protruding portion 160*a* and the left protruding portion 160*b* extend is improved. Hereinafter, an example in which the right protruding portion 160*a* and the left protruding portion 160*b* extend forward will be described with reference to FIGS. 28 and 29. FIG. 28 is a perspective view of a metal member 14*n* including the right protruding portion 160*a* and the left protruding portion 160*b*. FIG. 29 is a cross-sectional view of the module 10 taken along line B-B including the metal member 14*n*. As illustrated in FIGS. 28 and 29, the left protruding portion 160*b* is located to the left of the electronic component 16*a*. As a result, the shielding property leftward with respect to the electronic component 16*a* is improved. The right protruding portion 160*a* is located to the right of the electronic component 16*a*. As a result, the shielding property rightward with respect to the electronic component 16*a* is improved. That is, the shielding property in the left-right direction with respect to the electronic component 16*a* is improved.

The upper protruding portion 160, the right protruding portion 160*a*, and the left protruding portion 160*b* may all extend in the same direction in the front-back direction. For example, as illustrated in FIGS. 28 and 29, all of the upper protruding portion 160, the right protruding portion 160*a*, and the left protruding portion 160*b* may extend forward. In this case, in addition to the improvement of the shielding property leftward with respect to the electronic component 16*a* and the shielding property rightward with respect to the electronic component 16*a*, the shielding property upward with respect to the electronic component 16*a* is further improved. That is, the shielding property in three directions with respect to the electronic component 16*a* is improved.

Figure 30:
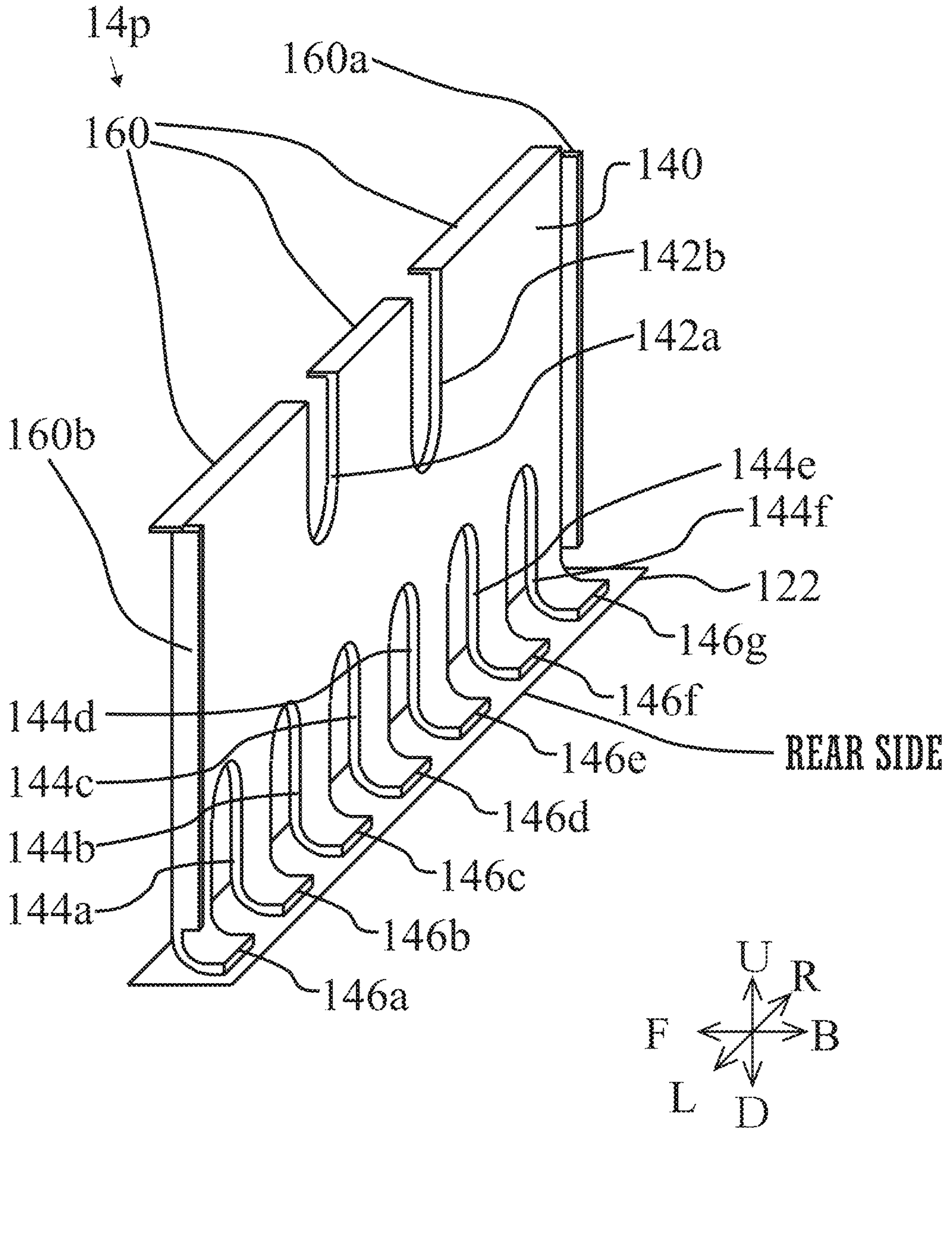
FIG. 30 is a perspective view of a metal member 14*p* including a right protruding portion 160*a* and a left protruding portion 160*b*.
Figure 31:
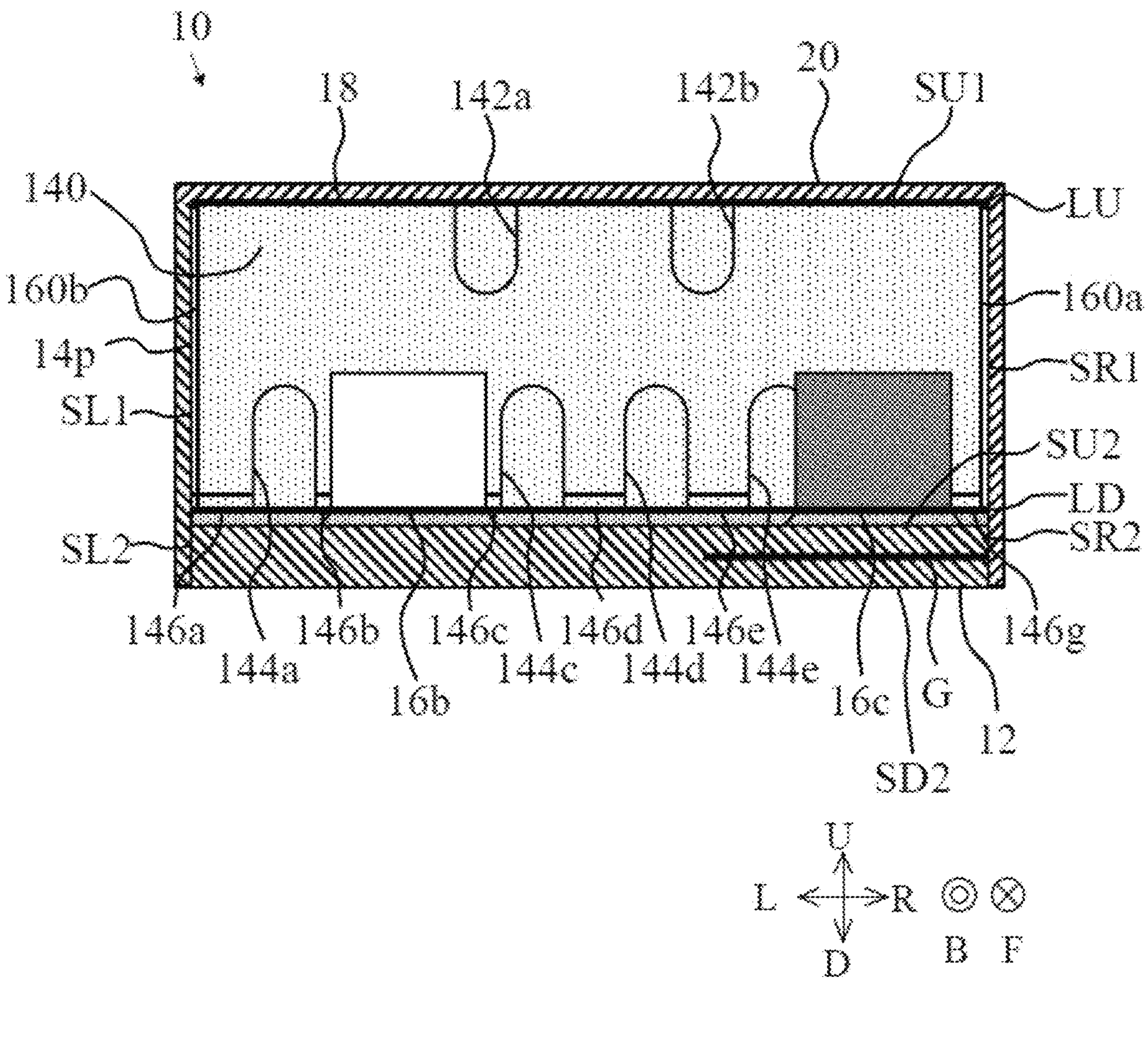
FIG. 31 is a cross-sectional view of the module 10 taken along line B-B including the metal member 14*p*.

As illustrated in FIGS. 30 and 31, the upper protruding portion 160 may extend forward, and the right protruding portion 160*a* and the left protruding portion 160*b* may extend backward. FIG. 30 is a perspective view of a metal member 14*p* including a right protruding portion 160*a* and a left protruding portion 160*b*. FIG. 31 is a cross-sectional view of the module 10 taken along line B-B including the metal member 14*p*. In this case, the upper protruding portion 160 is located above the electronic component 16*a*. As a result, the shielding property upward with respect to the electronic component 16*a* is improved. The left protruding portion 160*b* is located on the left of the electronic components 16*b* and 16*c*. As a result, the shielding property leftward with respect to the electronic components 16*b* and 16*c* is improved. The right protruding portion 160*a* is located to the right of the electronic components 16*b* and 16*c*. As a result, the shielding property rightward with respect to the electronic components 16*b* and 16*c* is improved. That is, the shielding property in the upward direction with respect to the electronic component 16*a* is improved, and the shielding property in the left-right direction with respect to the electronic components 16*b* and 16*c* is improved by a metal member 14*p*.

As illustrated in FIGS. 29 and 31, the right protruding portion 160*a* and the left protruding portion 160*b* may be in contact with the shield 20. More specifically, portions of the right protruding portion 160*a* and the left protruding portion 160*b* exposed from the sealing resin layer 18 are in contact with the shield 20. That is, the shield 20 is in contact with the plate-shaped portion 140, the upper protruding portion 160, the right protruding portion 160*a*, and the left protruding portion 160*b*. Therefore, as compared with a case where the upper end of the plate-shaped portion 140 and the upper protruding portion 160 are in contact with the shield 20, in a case where the shield 20, the plate-shaped portion 140, the upper protruding portion 160, the right protruding portion 160*a*, and the left protruding portion 160*b* are in contact with each other, an area where the metal member 14 and the shield 20 are in contact with each other becomes large. As a result, in a case where the right protruding portion 160*a* and the left protruding portion 160*b* are in contact with the shield 20, the connection to the GND is strengthened as compared with a case where the upper end of the plate-shaped portion 140 and the upper protruding portion 160 are in contact with the shield 20.

Each of the thicknesses of the right protruding portion 160*a* and the left protruding portion 160*b* in the left-right direction may be thinner than the thickness of the plate-shaped portion 140. As a result, similarly to the upper protruding portion 160, the possibility that the right protruding portion 160*a* protrudes rightward from the sealing resin layer 18 is reduced. Therefore, similarly to the upper protruding portion 160, the possibility that the left protruding portion 160*b* protrudes leftward from the sealing resin layer 18 is reduced. The shielding property of the shield 20 is less likely to decrease. As a result, the shielding property of the module 10 is less likely to decrease.

The length of the distance between the electronic component 16*a* and the metal member 14 may not be equal to the length of the distance between the electronic component 16*b* or 16*c* and the metal member 14.

In the module 10, the top surface portion 148 may be the upper protruding portion 160.

The structures of the metal members 14 and 14*a* to 14*q* and the structures of the mounting electrodes 122, 122*a*, and 122*b* may be arbitrarily combined with the module 10.

The substrate 12 may have a shape other than a rectangular shape when viewed in the up-down direction.

The number of electronic components 16*a* to 16*c* is not limited to 3.

The plate-shaped portion 140 may be provided with one or more upper notches and one or more lower notches.

The foot portion may not be adjacent to the lower notch in the left-right direction. Therefore, the foot portion and the lower notch may be separated in the left-right direction.

The plurality of foot portions extend backward from the lower side LD of the plate-shaped portion 140. However, the plurality of foot portions may extend forward from the lower side of the plate-shaped portion 140. A part of the plurality of foot portions may extend backward from the lower side of the plate-shaped portion 140, and the rest of the plurality of foot portions may extend forward from the lower side of the plate-shaped portion 140.

The shortest distance between the upper notch and the lower notch may be shorter than 1.5 times the plate thickness of the plate-shaped portion.

The left end of the plate-shaped portion 140 may not be located on the left surface SL1 of the sealing resin layer 18. The right end of the plate-shaped portion 140 may not be located on the right surface SR1 of the sealing resin layer 18. The upper end of the plate-shaped portion 140 may not be located on the upper surface SU1 of the sealing resin layer 18. In addition, since the upper end of the plate-shaped portion 140 is located on the upper surface SU1 of the sealing resin layer 18, the upper end of the plate-shaped portion 140 may be electrically connected to the shield 20, the left end of the plate-shaped portion 140 may not be located on the left surface SL1 of the sealing resin layer 18, and the right end of the plate-shaped portion 140 may not be located on the right surface SR1 of the sealing resin layer 18.

The module 10 may not include the shield 20.

The shield 20 may cover at least the upper surface SU1 of the sealing resin layer 18. Therefore, the shield 20 may not cover a part or all of the left surface SL1, the right surface SR1, the front surface SF1, and the back surface SB1 of the sealing resin layer 18, for example.

Incidentally, the outer edge of the substrate 12 may not overlap so as to coincide with the outer edge of the sealing resin layer 18 when viewed in the up-down direction. That is, the front surface SF1 of the sealing resin layer 18 may be located in front of the front surface SF2 of the substrate 12. The back surface SB1 of the sealing resin layer 18 may be located behind the back surface SB2 of the substrate 12. The left surface SL1 of the sealing resin layer 18 may be located to the left of the left surface SL2 of the substrate 12. The right surface SR1 of the sealing resin layer 18 may be located to the right of the right surface SR2 of the substrate 12.

The electronic components 16*a* to 16*c* do not protrude leftward or rightward from the metal member 14 when viewed in the front-back direction. However, a part of the electronic components 16*a* to 16*c* may protrude leftward or rightward from the metal member 14 when viewed in the front-back direction.

The area of the top surface portion 148 may be larger than the area of each of the foot portions 146*a* to 146*g*. Thus, the metal member 14 can be easily adsorbed by the mounting machine. In addition, the center of gravity of the metal member 14 is located above and in front of the metal member. Thus, the metal member 14 is slightly inclined forward. The foot portions 146*a* to 146*g* support the inclination of the metal member 14. Thus, the foot portions 146*a* to 146*g* slightly sink into the solders 200*a* to 200*g*. As a result, the solders 200*a* to 200*g* more reliably adhere to the foot portions 146*a* to 146*g*. Thus, the metal member 14 is more reliably fixed to the mounting electrode 122. Further, in the metal member 14 including the top surface portion 148, the distance in the up-down direction from the lower end of the metal member 14 to the center of gravity of the metal member 14 is, for example, ⅘ or less of the height in the up-down direction of the metal member 14. Thus, self-standing of the metal member 14 is improved.

Further, in the metal member 14 including the top surface portion 148, the position of the center of gravity of the metal member 14 in the front-back direction is behind the plate-shaped portion 140 and in front of the back ends of the foot portions 146*a* to 146*g*. Thus, even if the plate-shaped portion 140 is slightly inclined forward, the center of gravity of the metal member 14 is located near the center of the metal member 14 in the front-back direction. As a result, self-standing of the metal member 14 is improved.

For example, when viewed in the up-down direction, the top surface portion 148 does not overlap with the electronic component 16*c* having the highest height in the up-down direction among the electronic components 16*a* to 16*c*.

The top surface portion 148 is formed by bending a part of the metal member 14 backward. Therefore, the top surface portion 148 extends from the plate-shaped portion 140 in the same direction as the foot portions 146*a* to 146*g*. However, the top surface portion 148 may be formed by bending a part of the metal member 14 forward. That is, the top surface portion 148 may extend from the plate-shaped portion 140 in the direction opposite to the direction in which the foot portions 146*a* to 146*g* extend from the plate-shaped portion 140. However, from the viewpoint of increasing the area where the electronic components 16*a* to 16*c* can be mounted on the upper main surface SU2 of the substrate 12, the top surface portion 148 may extend from the plate-shaped portion 140 in the same direction as the direction in which the foot portions 146*a* to 146*g* extend from the plate-shaped portion. In addition, when the top surface portion 148 and the foot portions 146*a* to 146*g* extend from the plate-shaped portion 140 in the same direction, the foot portions 146*a* to 146*g* and the top surface portion 148 can be simultaneously formed. In this case, since the number of times of bending of the metal member 14 is 1, the foot portions 146*a* to 146*g* and the top surface portion 148 can be accurately formed. In addition, since the number of times of bending of the metal member 14 is 1, the manufacturing cost of the metal member 14 is reduced.

In the module 10, as illustrated in FIG. 7, the solders 200*a* to 200*g* wet upward on the outer surface SO, and the solders 200*a* to 200*g* are not wetted upward on the back end portions of the foot portions 146*a* to 146*g*. However, the solders 200*a* to 200*g* may not be wetted upward on the outer surface SO.

The upper protruding portion 160 may extend backward from the upper end of the plate-shaped portion 140.

The metal members 14 and 14*a* to 14*q* may include one or more foot portions. The metal member 14*r* may include two or more foot portions.

Solder is used to fix the foot portions 146*a* to 146*g* to the mounting electrodes 122, 122*a*, and 122*b*. However, instead of the solder, for example, a resin adhesive containing a metal filler such as Cu or Ag may be used. That is, a conductive member such as solder or a resin adhesive may be used to fix the foot portions 146*a* to 146*g* to the mounting electrodes 122, 122*a*, and 122*b*.

10 module
12 substrate
14, 14*a* to 14*r* metal member
16*a* to 16*c* electronic component
18 sealing resin layer
20 shield
122, 122*a*, 122*b* mounting electrode
140 plate-shaped portion
142*a* to 142*d* upper notch
144*a* to 144*f*, 144*x* to 144*z* lower notch
146*a* to 146*g* foot portion
148 top surface portion
150*a* to 150*g* protrusion
152*a* to 152*g* recess
160 upper protruding portion
160*a* right protruding portion
160*b* left protruding portion
200*a* to 200*g* solder
1221 to 1227 small electrode
C boundary
G ground conductor layer
LD lower side
LU upper side
SI inner surface
SO outer surface
Sa virtual plane

The invention claimed is:

1. A module comprising:

a substrate having an upper main surface and a lower main surface arranged in an up-down direction;

a metal member provided on the upper main surface of the substrate, the metal member having a plate-shaped portion including a front main surface and a back main surface arranged in a front-back direction;

a first electronic component mounted on the upper main surface of the substrate and disposed in front of the metal member;

a second electronic component mounted on the upper main surface of the substrate and disposed behind the metal member; and a sealing resin layer provided on the upper main surface of the substrate and covering the first electronic component, the second electronic component, and the metal member, wherein the metal member includes an upper protruding portion extending on one side of the front-back direction from an upper end of the plate-shaped portion, and a thickness of the upper protruding portion in the up-down direction is thinner than a thickness of the plate-shaped portion, wherein the plate-shaped portion is inclined with respect to the up-down direction such that the upper end of the plate-shaped portion is located in front of a lower end of the plate-shaped portion, or the plate-shaped portion is inclined with respect to the up-down direction such that the upper end of the plate-shaped portion is located behind the lower end of the plate-shaped portion.

2. The module according to claim 1, further comprising:

a shield, wherein the shield is connected to a ground potential and covers an upper surface of the sealing resin layer, and the upper protruding portion and the shield are electrically connected.

3. The module according to claim 2, wherein the metal member further includes at least one of a right protruding portion extending on one side of the front-back direction from a right end of the plate-shaped portion and a left protruding portion extending on one side of the front-back direction from a left end of the plate-shaped portion, and each of thicknesses of the right protruding portion and the left protruding portion in a left-right direction is thinner than a thickness of the plate-shaped portion.

4. A method for manufacturing the module according to claim 2, the method comprising:

preparing the substrate in which the first electronic component and the second electronic component are mounted on the upper main surface of the substrate and the metal member is provided on the upper main surface of the substrate;

forming the sealing resin layer provided on the upper main surface of the substrate and covering the first electronic component, the second electronic component, and the metal member;

grinding the upper end of the plate-shaped portion to form the upper protruding portion extending on the one side of the front-back direction from the upper end of the plate-shaped portion, the upper protruding portion having a thickness in the up-down direction thinner than a thickness of the plate-shaped portion; and providing a shield connected to a ground potential and covering an upper surface of the sealing resin layer, wherein the upper protruding portion and the shield are electrically connected.

5. The module according to claim 1, wherein the metal member further includes at least one of a right protruding portion extending on one side of the front-back direction from a right end of the plate-shaped portion and a left protruding portion extending on one side of the front-back direction from a left end of the plate-shaped portion, and each of thicknesses of the right protruding portion and the left protruding portion in a left-right direction is thinner than a thickness of the plate-shaped portion.

6. A method for manufacturing the module according to claim 1, the method comprising:

preparing the substrate in which the first electronic component and the second electronic component are mounted on the upper main surface of the substrate and the metal member is provided on the upper main surface of the substrate;

forming the sealing resin layer provided on the upper main surface of the substrate and covering the first electronic component, the second electronic component, and the metal member; and grinding the upper end of the plate-shaped portion to form the upper protruding portion extending on the one side of the front-back direction from the upper end of the plate-shaped portion, the upper protruding portion having a thickness in the up-down direction thinner than a thickness of the plate-shaped portion.

7. The module according to claim 1, wherein the plate-shaped portion is inclined with respect to the up-down direction such that the upper end of the plate-shaped portion is located in front of a lower end of the plate-shaped portion, and the upper protruding portion is formed by grinding an upper surface of the sealing resin layer to expose the upper end of the plate-shaped portion.

8. A module comprising:

a substrate having an upper main surface and a lower main surface arranged in an up-down direction;

a metal member provided on the upper main surface of the substrate, the metal member having a plate-shaped portion including a front main surface and a back main surface arranged in a front-back direction;

a first electronic component mounted on the upper main surface of the substrate and disposed in front of the metal member;

a second electronic component mounted on the upper main surface of the substrate and disposed behind the metal member; and a sealing resin layer provided on the upper main surface of the substrate and covering the first electronic component, the second electronic component, and the metal member, wherein the metal member includes an upper protruding portion extending on one side of the front-back direction from an upper end of the plate-shaped portion, and a thickness of the upper protruding portion in the up-down direction is thinner than a thickness of the plate-shaped portion, wherein the metal member further includes at least one of a right protruding portion extending on one side of the front-back direction from a right end of the plate-shaped portion and a left protruding portion extending on one side of the front-back direction from a left end of the plate-shaped portion, and each of thicknesses of the right protruding portion and the left protruding portion in a left-right direction is thinner than a thickness of the plate-shaped portion.

9. The module according to claim 8, wherein the upper protruding portion, the right protruding portion, and the left protruding portion all extend in a same direction in the front-back direction.

10. The module according to claim 9, further comprising:

a shield, wherein the shield is connected to a ground potential and covers an upper surface, a right surface, and a left surface of the sealing resin layer, and the right protruding portion or the left protruding portion is electrically connected to the shield.

11. A method for manufacturing the module according to claim 9, the method comprising:

preparing the substrate in which the first electronic component and the second electronic component are mounted on the upper main surface of the substrate and the metal member is provided on the upper main surface of the substrate;

forming the sealing resin layer provided on the upper main surface of the substrate and covering the first electronic component, the second electronic component, and the metal member; and grinding the upper end of the plate-shaped portion to form the upper protruding portion extending on the one side of the front-back direction from the upper end of the plate-shaped portion, the upper protruding portion having a thickness in the up-down direction thinner than a thickness of the plate-shaped portion.

12. The module according to claim 8, further comprising:

a shield, wherein the shield is connected to a ground potential and covers an upper surface, a right surface, and a left surface of the sealing resin layer, and the right protruding portion or the left protruding portion is electrically connected to the shield.

13. A method for manufacturing the module according to claim 12, the method comprising:

preparing the substrate in which the first electronic component and the second electronic component are mounted on the upper main surface of the substrate and the metal member is provided on the upper main surface of the substrate;

forming the sealing resin layer provided on the upper main surface of the substrate and covering the first electronic component, the second electronic component, and the metal member;

grinding the upper end of the plate-shaped portion to form the upper protruding portion extending on the one side of the front-back direction from the upper end of the plate-shaped portion, the upper protruding portion having a thickness in the up-down direction thinner than a thickness of the plate-shaped portion; and providing a shield connected to a ground potential and covering an upper surface, a right surface, and a left surface of the sealing resin layer, wherein the right protruding portion or the left protruding portion is electrically connected to the shield.

14. A method for manufacturing the module according to claim 8, the method comprising:

preparing the substrate in which the first electronic component and the second electronic component are mounted on the upper main surface of the substrate and the metal member is provided on the upper main surface of the substrate;

forming the sealing resin layer provided on the upper main surface of the substrate and covering the first electronic component, the second electronic component, and the metal member; and grinding the upper end of the plate-shaped portion to form the upper protruding portion extending on the one side of the front-back direction from the upper end of the plate-shaped portion, the upper protruding portion having a thickness in the up-down direction thinner than a thickness of the plate-shaped portion.

15. A method for manufacturing a module comprising:

a substrate having an upper main surface and a lower main surface arranged in an up-down direction;

a metal member provided on the upper main surface of the substrate, the metal member having a plate-shaped portion including a front main surface and a back main surface arranged in a front-back direction;

a first electronic component mounted on the upper main surface of the substrate and disposed in front of the metal member;

a second electronic component mounted on the upper main surface of the substrate and disposed behind the metal member; and a sealing resin layer provided on the upper main surface of the substrate and covering the first electronic component, the second electronic component, and the metal member, wherein the metal member includes an upper protruding portion extending on one side of the front-back direction from an upper end of the plate-shaped portion, and a thickness of the upper protruding portion in the up-down direction is thinner than a thickness of the plate-shaped portion, the method comprising:

preparing the substrate in which the first electronic component and the second electronic component are mounted on the upper main surface of the substrate and the metal member is provided on the upper main surface of the substrate;

forming the sealing resin layer provided on the upper main surface of the substrate and covering the first electronic component, the second electronic component, and the metal member; and grinding the upper end of the plate-shaped portion to form the upper protruding portion extending on the one side of the front-back direction from the upper end of the plate-shaped portion, the upper protruding portion having a thickness in the up-down direction thinner than a thickness of the plate-shaped portion.

* * * * *